US012376373B2

(12) United States Patent
Yamazaki et al.

(10) Patent No.: US 12,376,373 B2
(45) Date of Patent: Jul. 29, 2025

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Shuhei Nagatsuka, Atsugi (JP); Takuya Kawata, Atsugi (JP); Ryota Hodo, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 397 days.

(21) Appl. No.: 17/771,565

(22) PCT Filed: Oct. 19, 2020

(86) PCT No.: PCT/IB2020/059796
§ 371 (c)(1),
(2) Date: Apr. 25, 2022

(87) PCT Pub. No.: WO2021/084369
PCT Pub. Date: May 6, 2021

(65) Prior Publication Data
US 2022/0367450 A1    Nov. 17, 2022

(30) Foreign Application Priority Data

Nov. 1, 2019 (JP) .................. 2019-200259
Apr. 6, 2020 (JP) .................. 2020-068169

(51) Int. Cl.
*H10B 12/00* (2023.01)
*H10B 41/70* (2023.01)
(Continued)

(52) U.S. Cl.
CPC ............. *H10D 84/83* (2025.01); *H10B 12/00* (2023.02); *H10B 41/70* (2023.02);
(Continued)

(58) Field of Classification Search
CPC ................ H01L 21/8234; H01L 27/06; H01L 29/78603; H01L 29/792; H10D 84/83;
(Continued)

(56) References Cited

U.S. PATENT DOCUMENTS

| 7,566,633 B2 | 7/2009 | Koyama et al. |
| 7,906,784 B2 | 3/2011 | Koyama et al. |

(Continued)

FOREIGN PATENT DOCUMENTS

| CN | 001832179 A | 9/2006 |
| JP | 2006-270077 A | 10/2006 |

(Continued)

OTHER PUBLICATIONS

International Search Report (Application No. PCT/IB2020/059796) Dated Feb. 9, 2021.
(Continued)

*Primary Examiner* — Eugene Lee
(74) *Attorney, Agent, or Firm* — Eric J. Robinson; Robinson Intellectual Property Law Office, P.C.

(57) ABSTRACT

A semiconductor device with a small variation in characteristics is provided. The semiconductor device includes a first insulator, a transistor over the first insulator, a second insulator over the transistor, a third insulator over the second insulator, a fourth insulator over the third insulator, and an opening region. The opening region includes the second insulator, the third insulator over the second insulator, and the fourth insulator over the third insulator. The third insulator includes an opening reaching the second insulator. The fourth insulator is in contact with a top surface of the second insulator inside the opening.

12 Claims, 48 Drawing Sheets

(51) Int. Cl.
  *H10D 30/67* (2025.01)
  *H10D 30/69* (2025.01)
  *H10D 84/00* (2025.01)
  *H10D 84/01* (2025.01)
  *H10D 84/03* (2025.01)
  *H10D 84/83* (2025.01)

(52) U.S. Cl.
  CPC ......... *H10D 30/6758* (2025.01); *H10D 30/69* (2025.01); *H10D 84/00* (2025.01); *H10D 84/0126* (2025.01); *H10D 84/038* (2025.01)

(58) Field of Classification Search
  CPC .... H10D 30/6758; H10D 30/69; H10D 84/00; H10D 84/0126; H10D 84/038; H10B 12/00; H10B 41/70
  See application file for complete search history.

(56) References Cited

U.S. PATENT DOCUMENTS

| | | | |
|---|---|---|---|
| 8,455,868 B2 | 6/2013 | Yamazaki et al. | |
| 8,547,771 B2 | 10/2013 | Koyama | |
| 8,779,432 B2 | 7/2014 | Yamazaki et al. | |
| 8,809,870 B2 | 8/2014 | Yamazaki et al. | |
| 8,995,174 B2 | 3/2015 | Koyama | |
| 9,006,051 B2 | 4/2015 | Oikawa et al. | |
| 9,209,092 B2 | 12/2015 | Yamazaki et al. | |
| 9,246,009 B2 | 1/2016 | Oikawa et al. | |
| 9,298,057 B2 | 3/2016 | Hosaka et al. | |
| 9,312,278 B2 | 4/2016 | Koezuka et al. | |
| 9,349,735 B2 | 5/2016 | Yamazaki et al. | |
| 9,397,153 B2 | 7/2016 | Tanaka et al. | |
| 9,698,276 B2 * | 7/2017 | Yamazaki | H01L 29/78606 |
| 9,954,003 B2 | 4/2018 | Matsuda et al. | |
| 9,991,265 B2 | 6/2018 | Yamazaki et al. | |
| 10,553,589 B2 | 2/2020 | Yamazaki et al. | |
| 10,600,918 B2 | 3/2020 | Tanaka et al. | |
| 11,152,513 B2 * | 10/2021 | Yamazaki | H01L 29/78696 |
| 11,177,792 B2 | 11/2021 | Koyama | |
| 11,211,500 B2 | 12/2021 | Yamazaki et al. | |
| 2009/0194771 A1 | 8/2009 | Koyama et al. | |
| 2009/0261414 A1 | 10/2009 | Oikawa et al. | |
| 2015/0084044 A1 | 3/2015 | Tanaka et al. | |
| 2015/0221777 A1 * | 8/2015 | Oikawa | H01L 21/568 257/66 |
| 2015/0280691 A1 | 10/2015 | Koyama | |
| 2017/0236842 A1 | 8/2017 | Matsuda et al. | |
| 2018/0114838 A1 * | 4/2018 | Endo | H01L 27/1225 |
| 2020/0176450 A1 | 6/2020 | Yamazaki et al. | |
| 2021/0328580 A1 | 10/2021 | Koyama | |

FOREIGN PATENT DOCUMENTS

| | | |
|---|---|---|
| JP | 2009-278072 A | 11/2009 |
| JP | 2011-151383 A | 8/2011 |
| JP | 2012-257187 A | 12/2012 |
| JP | 2015-084414 A | 4/2015 |
| JP | 2017-147445 A | 8/2017 |
| JP | 2019-096856 A | 6/2019 |
| KR | 2015-0033543 A | 4/2015 |
| KR | 2017-0096956 A | 8/2017 |
| TW | 201521204 | 6/2015 |
| TW | 201926475 | 7/2019 |
| WO | WO-2019/111096 | 6/2019 |

OTHER PUBLICATIONS

Written Opinion (Application No. PCT/IB2020/059796) Dated Feb. 9, 2021.

* cited by examiner

FIG. 5A
| Amorphous | Intermediate state<br>New crystalline phase<br>Crystalline | Crystal |
|---|---|---|
| • completely<br>amorphous | • CAAC<br>• nc<br>• CAC<br>excluding<br>single crystal<br>and poly crystal | • single crystal<br>• poly crystal |
FIG. 5B
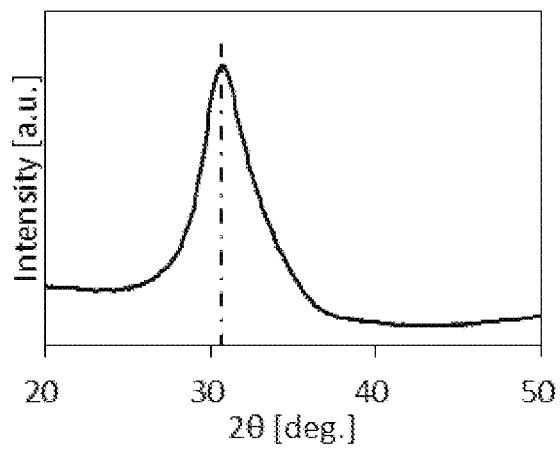
FIG. 5C
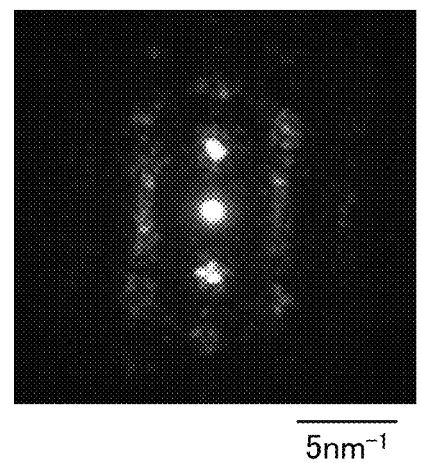

FIG. 7A
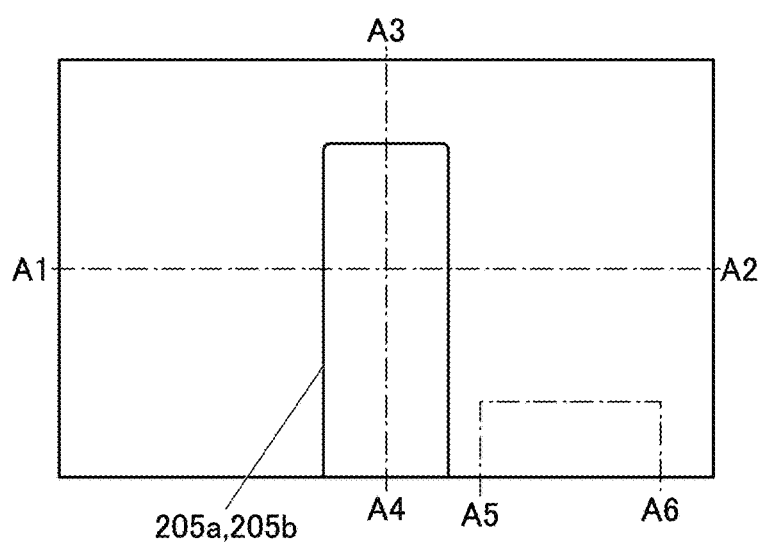
FIG. 7C
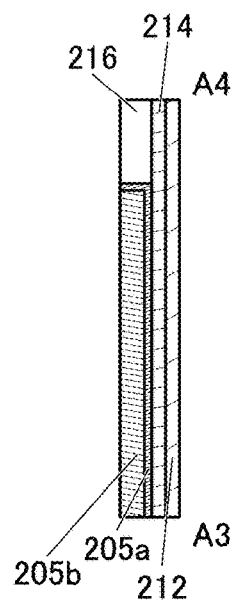
FIG. 7B
FIG. 7D
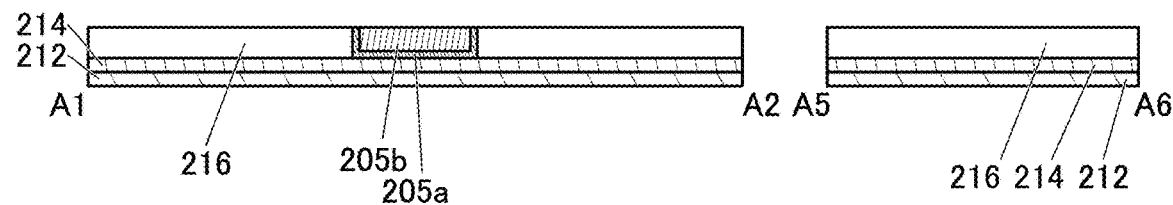

FIG. 8A
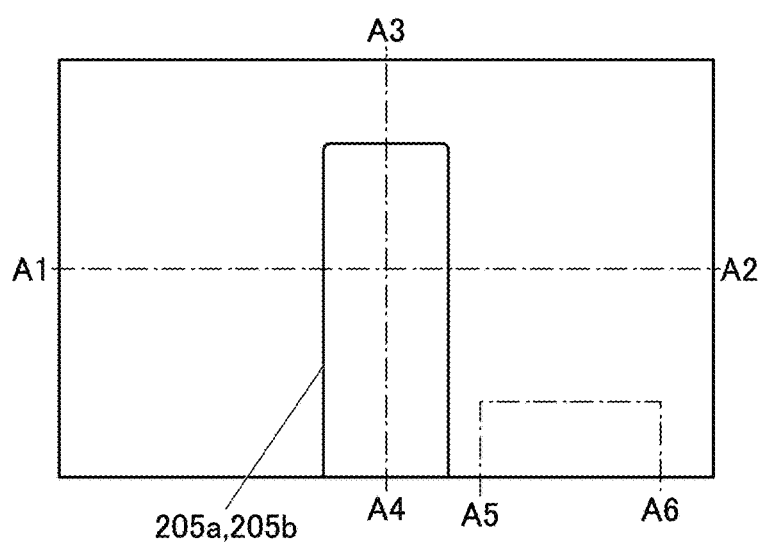
FIG. 8C
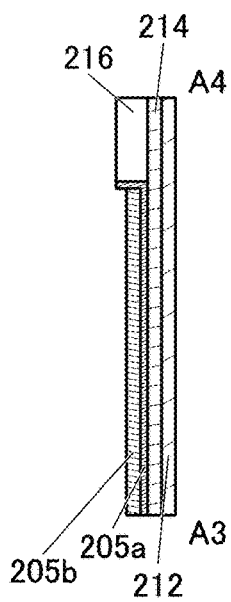
FIG. 8B
FIG. 8D
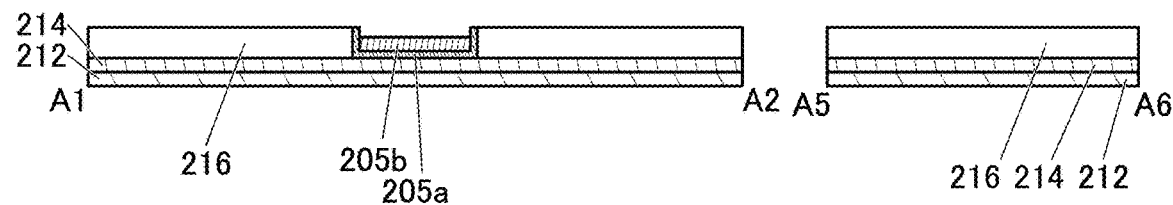

FIG. 9A
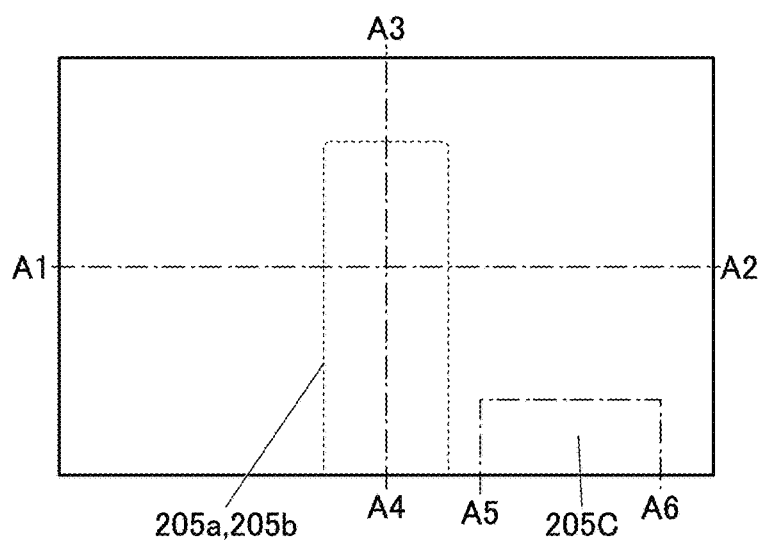
FIG. 9C
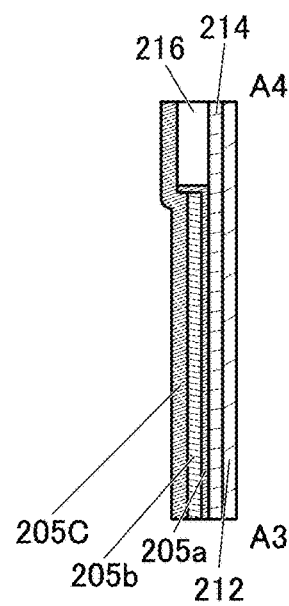
FIG. 9B
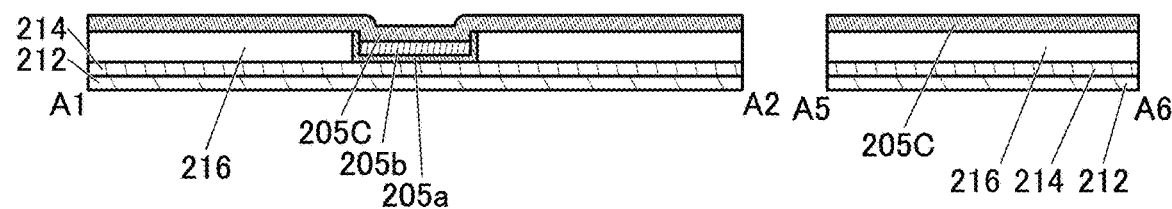
FIG. 9D

FIG. 10A
FIG. 10C
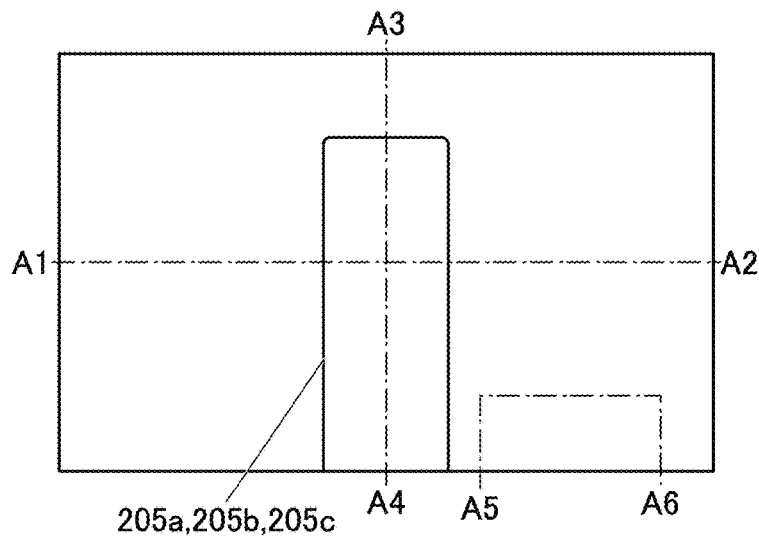
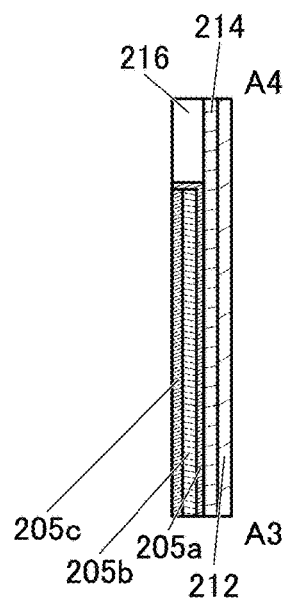
FIG. 10B
FIG. 10D
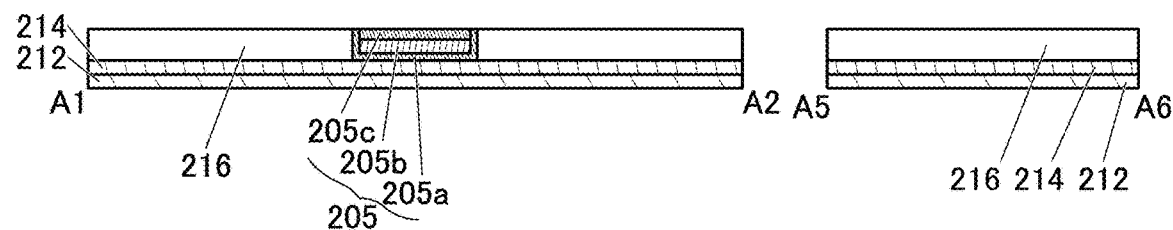

FIG. 11A
FIG. 11C
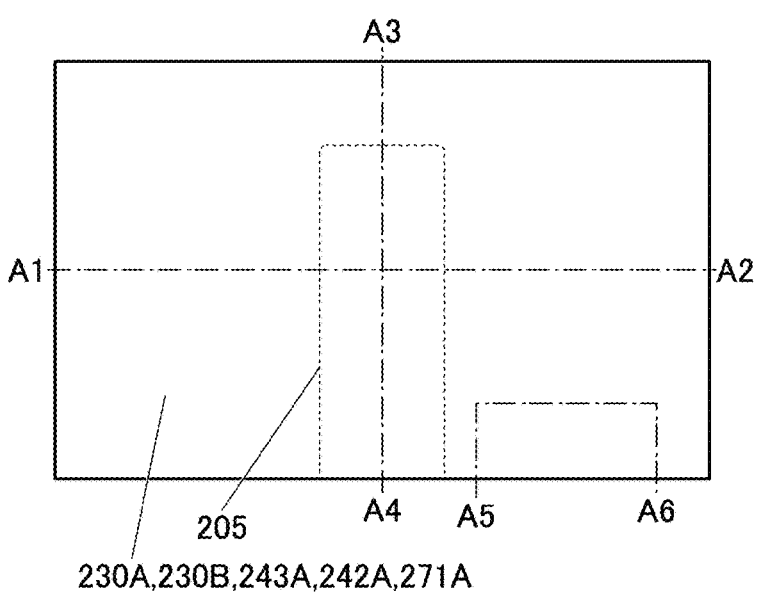
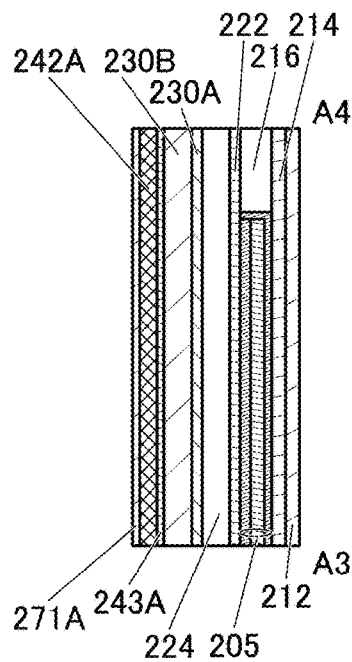
FIG. 11B
FIG. 11D
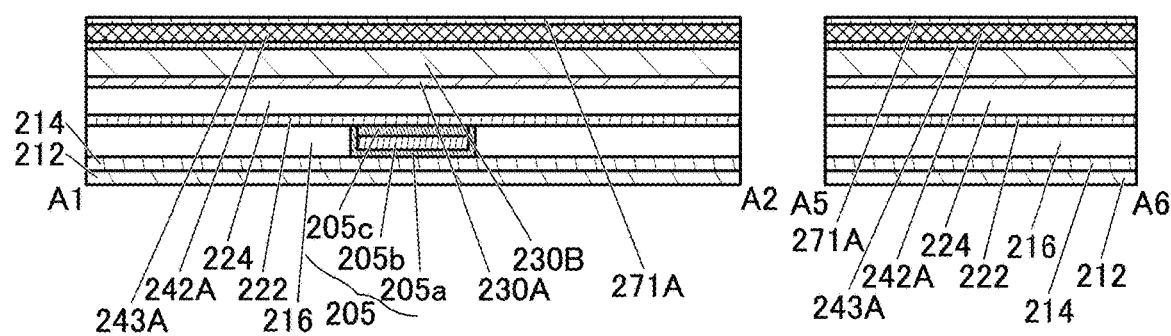

FIG. 12A
FIG. 12C
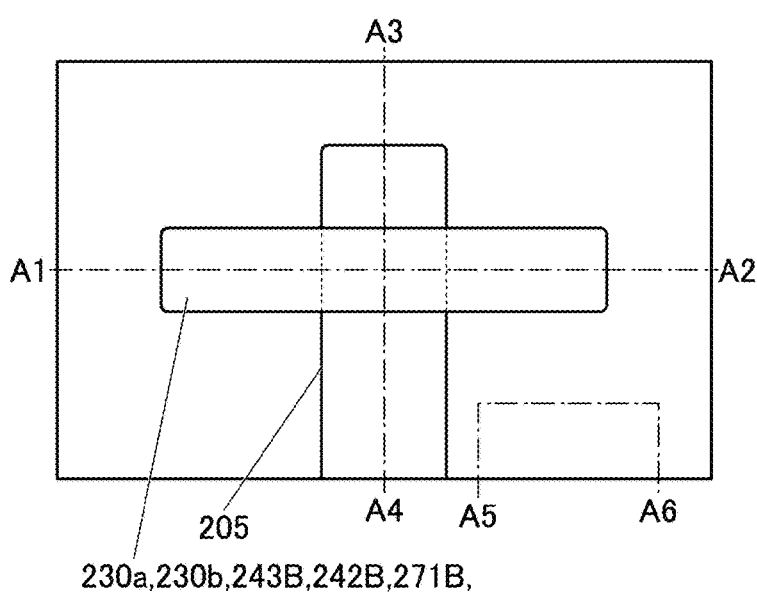
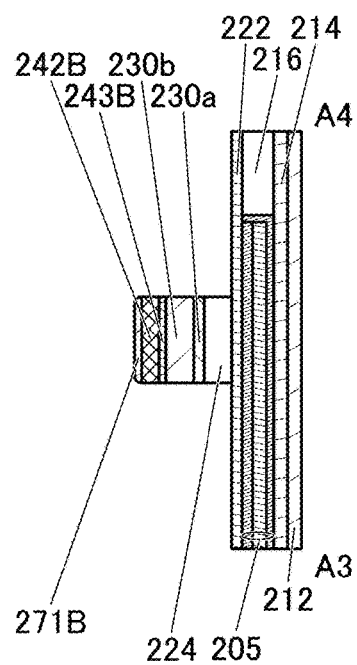
FIG. 12B
FIG. 12D
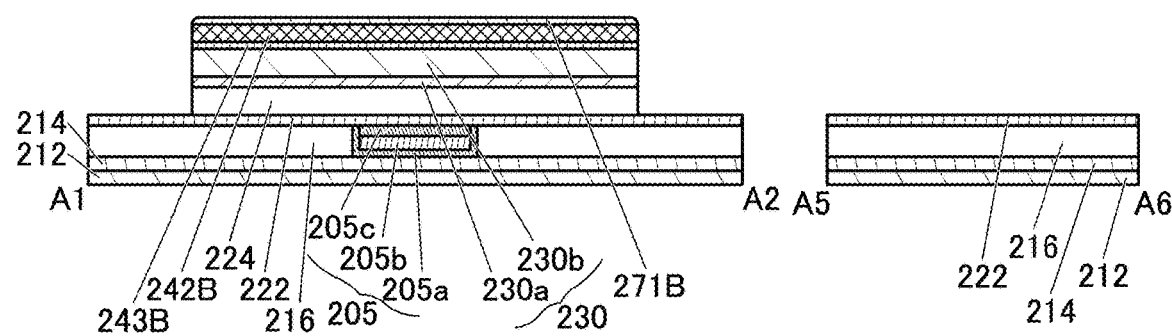

FIG. 13A
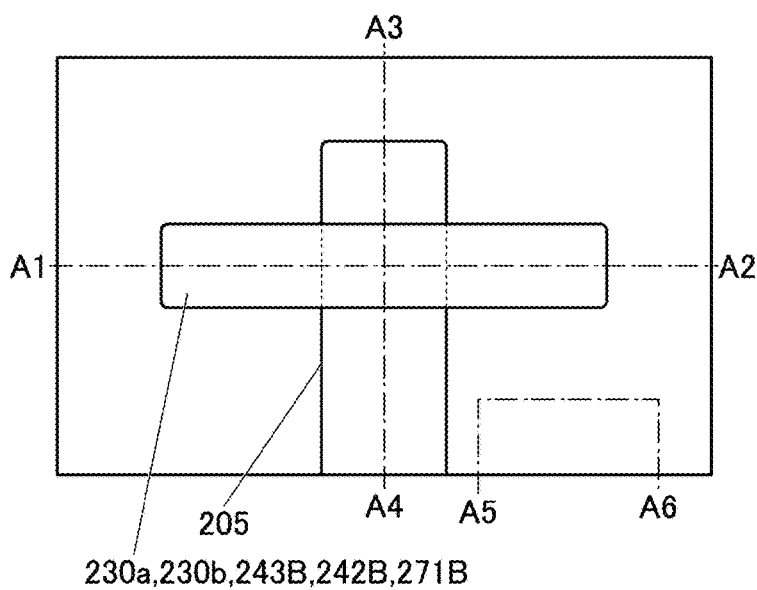
FIG. 13C
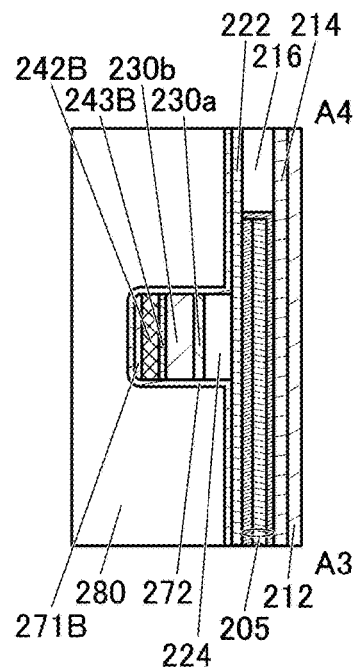
FIG. 13B
FIG. 13D
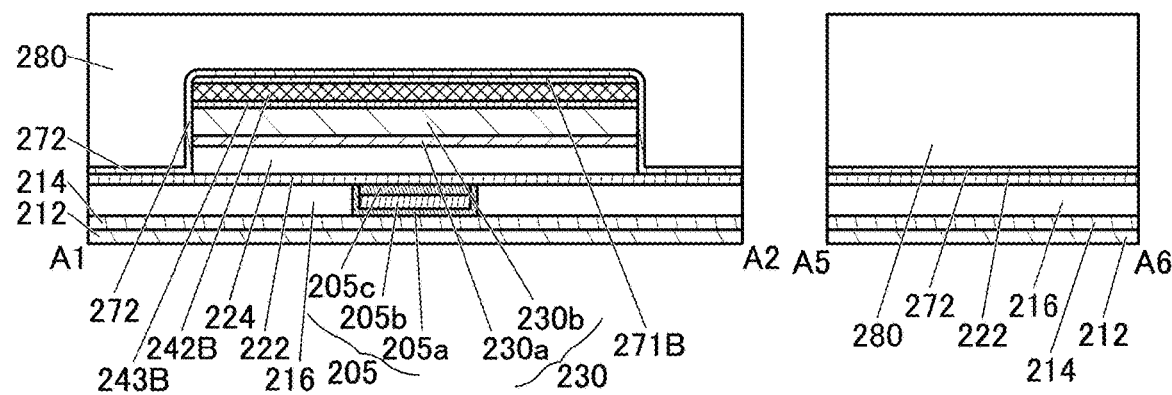

FIG. 14A
FIG. 14C
FIG. 14B
FIG. 14D
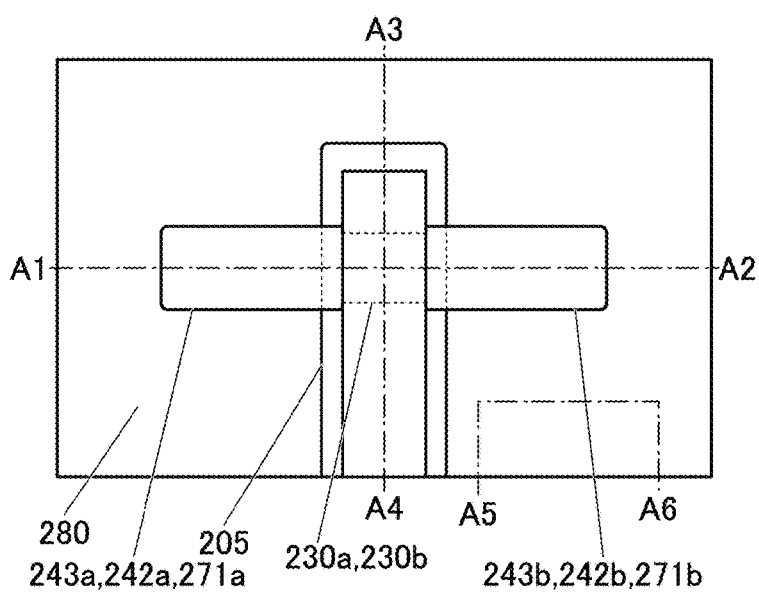
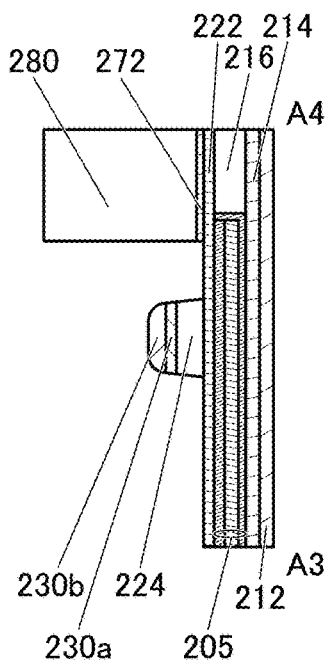
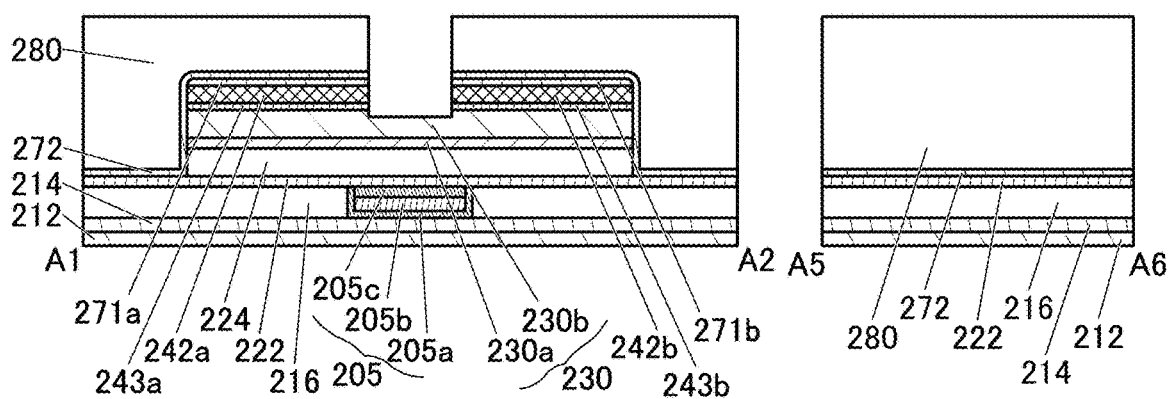

FIG. 17A
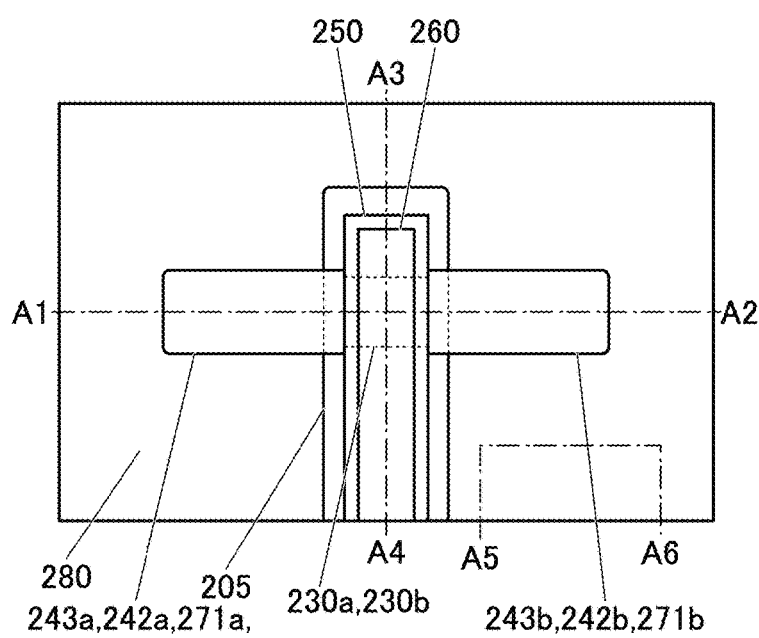
FIG. 17C
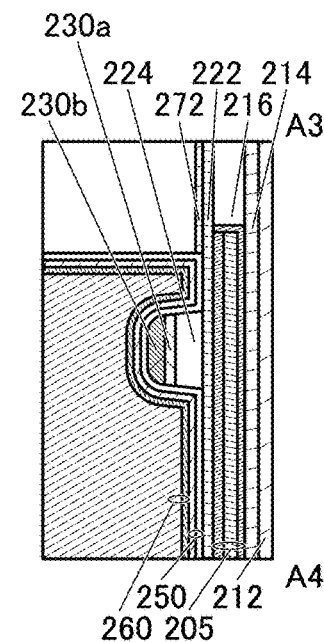
FIG. 17B
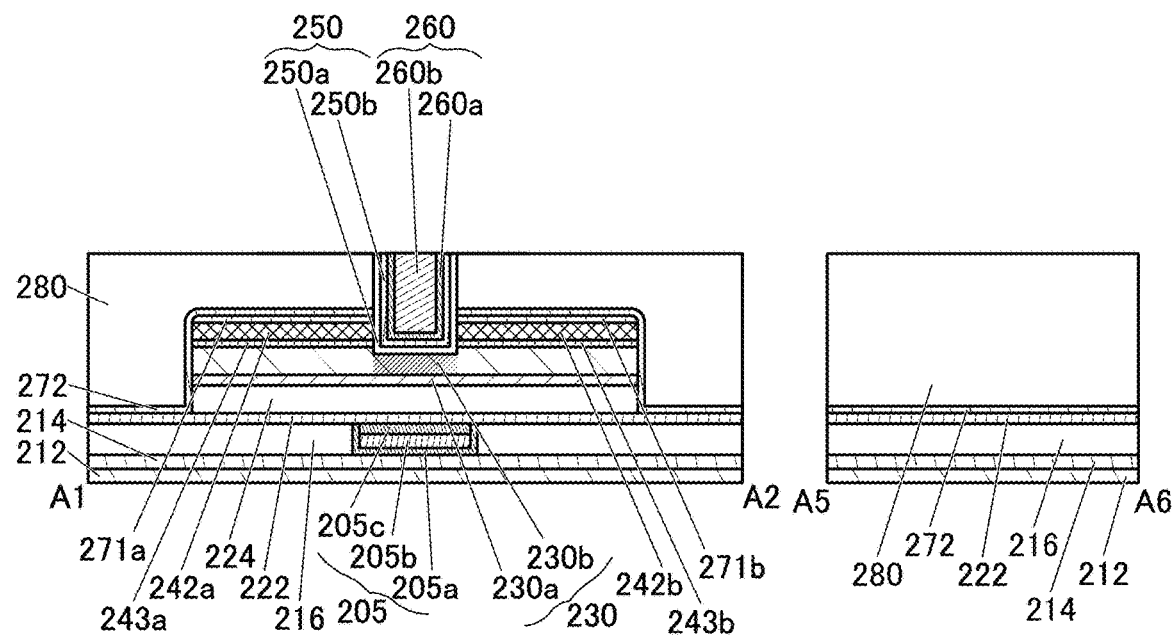
FIG. 17D

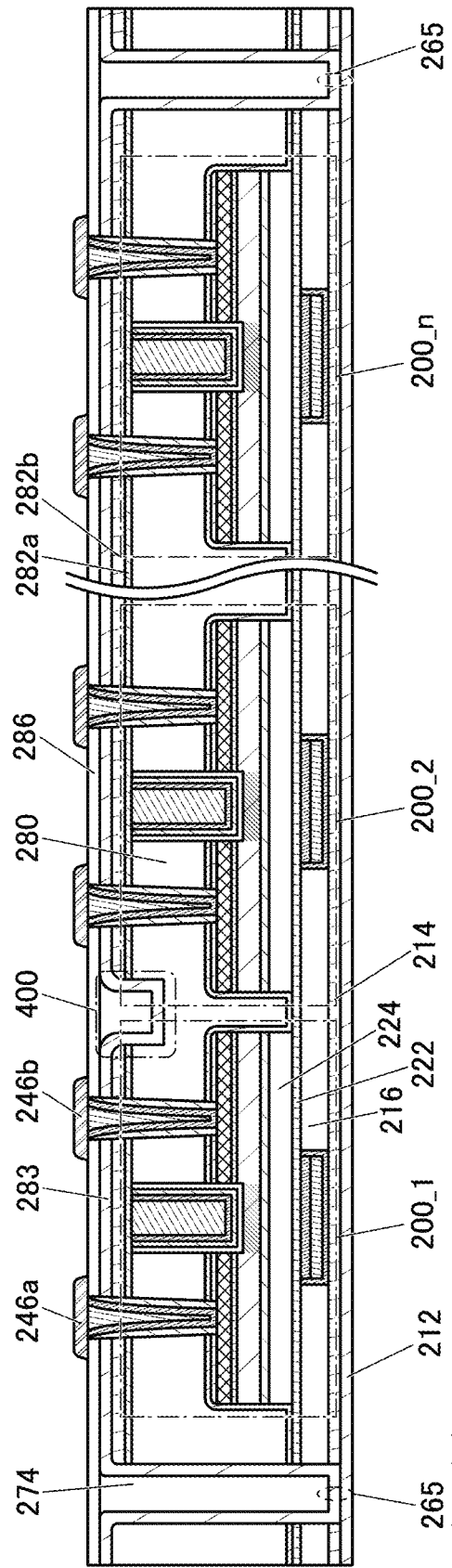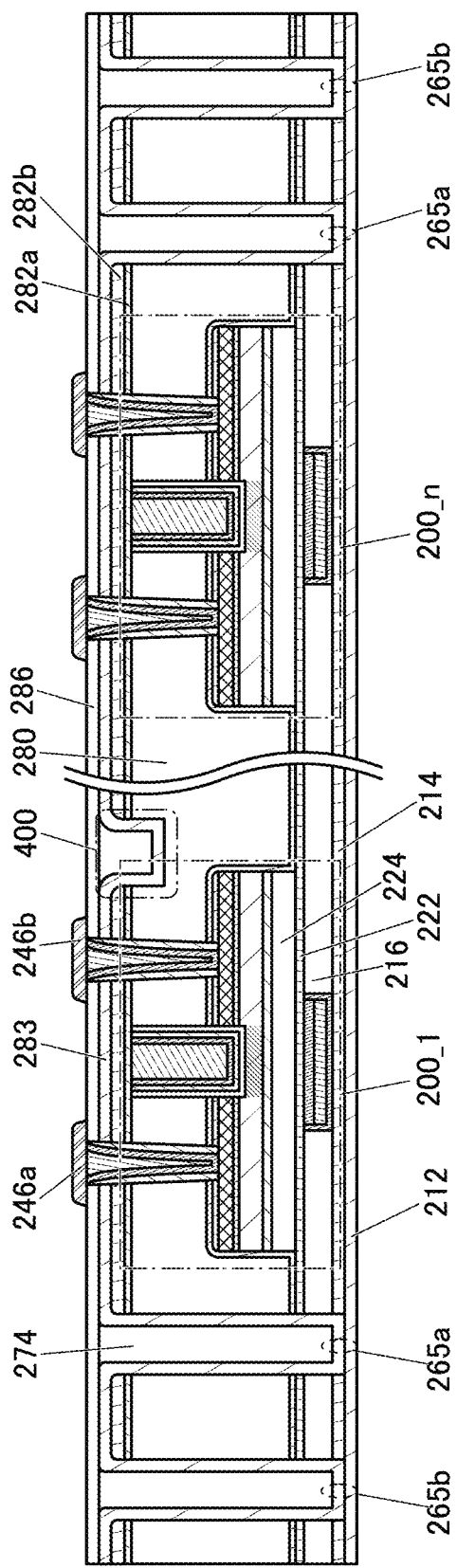

1471

1472

1473

1474

1475

1476

1477

1478

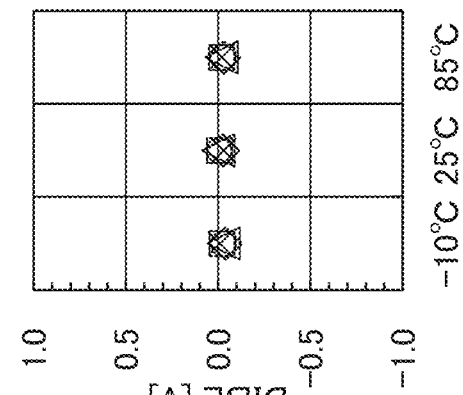
FIG. 45A
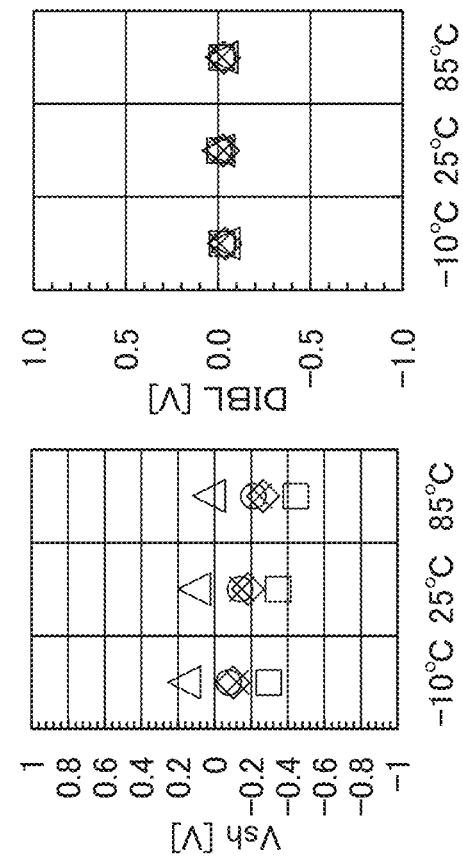
FIG. 45B
FIG. 45C
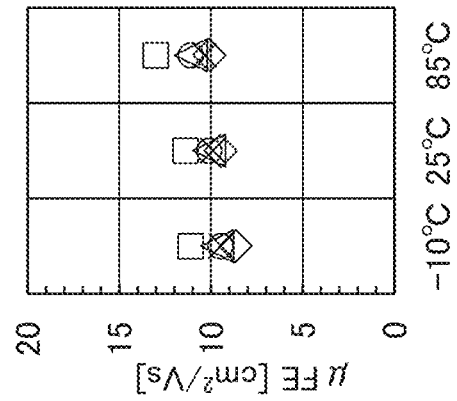
FIG. 45D
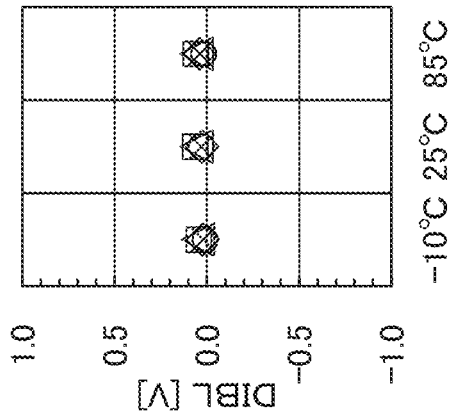
FIG. 45E
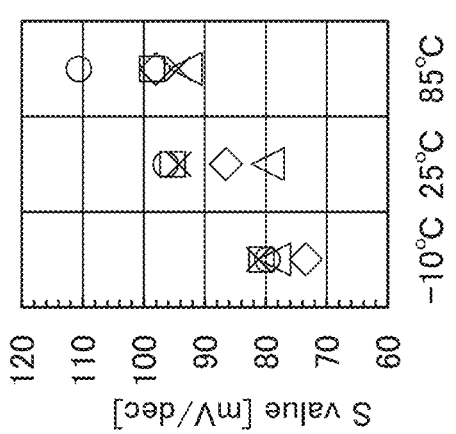
FIG. 45F, FIG. 45G
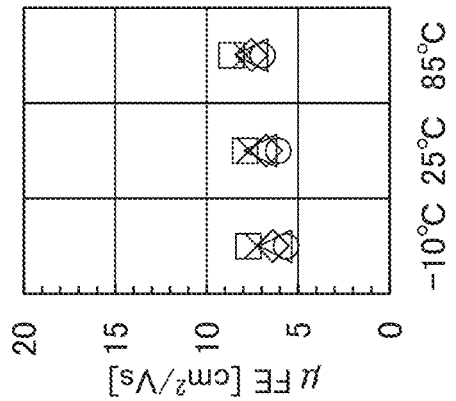
FIG. 45H

SEMICONDUCTOR DEVICE

TECHNICAL FIELD

One embodiment of the present invention relates to a transistor, a semiconductor device, and an electronic device. Another embodiment of the present invention relates to a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed to be mainly used for an LSI, a CPU, a memory, or the like. A CPU is an aggregation of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a semiconductor thin film applicable to the transistor; in addition, an oxide semiconductor has attracted attention as another material.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1). Furthermore, a storage device that can retain stored contents for a long time by utilizing a characteristic of a low leakage current of the transistor using an oxide semiconductor is disclosed, for example (see Patent Document 2).

In recent years, demand for an integrated circuit with higher density has risen with reductions in size and weight of electronic devices. Furthermore, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device in which variation of transistor characteristics is small. Another object of one embodiment of the present invention is to provide a semiconductor device having favorable reliability. Another object of one embodiment of the present invention is to provide a semiconductor device having favorable electrical characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a first insulator, a transistor over the first insulator, a second insulator over the transistor, a third insulator over the second insulator, a fourth insulator over the third insulator, and an opening region. The opening region includes the second insulator, the third insulator over the second insulator, the fourth insulator over the third insulator, and an opening reaching the second insulator in the third insulator. The fourth insulator is in contact with a top surface of the second insulator inside the opening.

Another embodiment of the present invention is a semiconductor device including a first insulator, a transistor over the first insulator, a second insulator over the transistor, a third insulator over the second insulator, a fourth insulator over the third insulator, and an opening region. The opening region includes the second insulator, the third insulator over the second insulator, the fourth insulator over the third insulator, and an opening reaching the second insulator in the third insulator. The fourth insulator is in contact with a top surface of the second insulator inside the opening. The transistor includes the first insulator, a fifth insulator over the first insulator, an oxide over the fifth insulator, a first conductor and a second conductor over the oxide, a sixth insulator over the first conductor and the second conductor, a seventh insulator that is over the oxide and placed between the first conductor and the second conductor, and a third conductor over the seventh insulator. The sixth insulator is in contact with the second insulator.

In the above, it is preferable that the fourth insulator be further in contact with the first insulator.

In the above, it is preferable that the seventh insulator include an eighth insulator and a ninth insulator over the eighth insulator. The eighth insulator is preferably in contact with the second insulator, and the ninth insulator is preferably in contact with the third conductor.

In the above, it is preferable that the first insulator and the third insulator each contain silicon and nitride.

In the above, it is preferable that the second insulator and the sixth insulator be each $AlO_x$ (x is a given number greater than 0).

In the above, it is preferable that the fifth insulator and the ninth insulator each contain hafnium.

In the above, it is preferable that the oxide be an oxide semiconductor containing any one or more selected from In, Ga, and Zn.

One embodiment of the present invention is a method for manufacturing a semiconductor device, including the steps of depositing a first insulator; depositing an oxide film over the first insulator; performing first heat treatment; depositing a first conductive film and a first insulating film in this order over the oxide film; processing the first insulator, the oxide film, the first conductive film, and the first insulating film into an island shape to form an oxide, a conductive layer, and an insulating layer over the first insulator; depositing a second insulator over the first insulator, the oxide, the conductive layer, and the insulating layer; depositing a third insulator over the second insulator; forming a first opening reaching the oxide in the conductive layer, the insulating layer, the second insulator, and the third insulator, in the formation of the first opening, a first conductor and a second conductor are formed from the conductive layer, and a fourth insulator and a fifth insulator are formed from the insulating layer; performing second heat treatment; depositing a second insulating film over the third insulator and the first opening; performing first microwave treatment; depositing a third insulating film over the second insulating film; performing second microwave treatment; depositing a second conductive film over the third insulating film, performing CMP treatment on the second insulating film, the third insulating film, and the second conductive film until a top surface of the third insulator is exposed, to form a sixth insulator, a seventh insulator, and a third conductor; depositing an eighth insulator over the third insulator, the sixth insulator, the seventh insulator, and the third conductor; forming a second opening reaching the third insulator in the eighth insulator; and performing third heat treatment. The temperature of the first heat treatment is higher than the temperature of the third heat treatment.

In the above, the first insulating film, the second insulator, and the eighth insulator are preferably deposited using aluminum oxide.

In the above, it is preferable that the first microwave treatment and the second microwave treatment be each performed at least in an oxygen atmosphere and within a temperature range of higher than or equal to 100° C. and lower than or equal to 750° C.

In the above, it is preferable that the first microwave treatment and the second microwave treatment be each performed within a temperature range of higher than or equal to 300° C. and lower than or equal to 500° C.

In the above, it is preferable that the first microwave treatment and the second microwave treatment be each performed within a pressure range of higher than or equal to 300 Pa and lower than or equal to 700 Pa.

In the above, it is preferable that the first heat treatment be performed within a range of higher than or equal to 250° C. and lower than or equal to 650° C. in a nitrogen atmosphere, and successively performed within a range of higher than or equal to 250° C. and lower than or equal to 650° C. in an oxygen atmosphere.

In the above, it is preferable that the second heat treatment be performed within a range of higher than or equal to 350° C. and lower than or equal to 400° C. in an oxygen atmosphere, and successively performed within a range of higher than or equal to 350° C. and lower than or equal to 400° C. in a nitrogen atmosphere.

In the above, it is preferable that the third heat treatment be performed within a range of higher than or equal to 350° C. and lower than or equal to 400° C. in a nitrogen atmosphere.

Effect of the Invention

According to one embodiment of the present invention, a semiconductor device in which variation of transistor characteristics is small can be provided. Alternatively, according to one embodiment of the present invention, a semiconductor device having favorable reliability can be provided. Alternatively, according to one embodiment of the present invention, a semiconductor device having favorable electrical characteristics can be provided. Alternatively, according to one embodiment of the present invention, a semiconductor device with a high on-state current can be provided. Alternatively, according to one embodiment of the present invention, a semiconductor device that can be miniaturized or highly integrated can be provided. Alternatively, according to one embodiment of the present invention, a semiconductor device with low power consumption can be provided.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 5A is a diagram showing a classification of crystal structures of IGZO. FIG. 5B is a diagram showing an XRD spectrum of a CAAC-IGZO film. FIG. 5C is a diagram showing nanobeam electron diffraction patterns of the CAAC-IGZO film.

FIG. 7A is a top view illustrating the method for manufacturing the semiconductor device of one embodiment of the present invention. FIG. 7B to FIG. 7D are cross-sectional views illustrating the method for manufacturing the semiconductor device of one embodiment of the present invention.

FIG. 8A is a top view illustrating the method for manufacturing the semiconductor device of one embodiment of the present invention. FIG. 8B to FIG. 8D are cross-sectional views illustrating the method for manufacturing the semiconductor device of one embodiment of the present invention.

FIG. 9A is a top view illustrating the method for manufacturing the semiconductor device of one embodiment of the present invention. FIG. 9B to FIG. 9D are cross-sectional views illustrating the method for manufacturing the semiconductor device of one embodiment of the present invention.

FIG. 10A is a top view illustrating the method for manufacturing the semiconductor device of one embodiment of the present invention. FIG. 10B to FIG. 10D are cross-sectional views illustrating the method for manufacturing the semiconductor device of one embodiment of the present invention.

FIG. 11A is a top view illustrating the method for manufacturing the semiconductor device of one embodiment of the present invention. FIG. 11B to FIG. 11D are cross-sectional views illustrating the method for manufacturing the semiconductor device of one embodiment of the present invention.

FIG. 12A is a top view illustrating the method for manufacturing the semiconductor device of one embodiment of the present invention. FIG. 12B to FIG. 12D are cross-sectional views illustrating the method for manufacturing the semiconductor device of one embodiment of the present invention.

FIG. 13A is a top view illustrating the method for manufacturing the semiconductor device of one embodiment of the present invention. FIG. 13B to FIG. 13D are cross-sectional views illustrating the method for manufacturing the semiconductor device of one embodiment of the present invention.

FIG. 14A is a top view illustrating the method for manufacturing the semiconductor device of one embodiment of the present invention. FIG. 14B to FIG. 14D are cross-sectional views illustrating the method for manufacturing the semiconductor device of one embodiment of the present invention.

FIG. 17A is a top view illustrating the method for manufacturing the semiconductor device of one embodiment of the present invention. FIG. 17B to FIG. 17D are cross-sectional views illustrating the method for manufacturing the semiconductor device of one embodiment of the present invention.

FIG. 29A and FIG. 29B are cross-sectional views of semiconductor devices of one embodiment of the present invention.

FIG. 45A to FIG. 45H are graphs showing temperature dependence of electrical characteristics in Example of one embodiment of the present invention.

MODE FOR CARRYING OUT THE INVENTION

Figure 1:
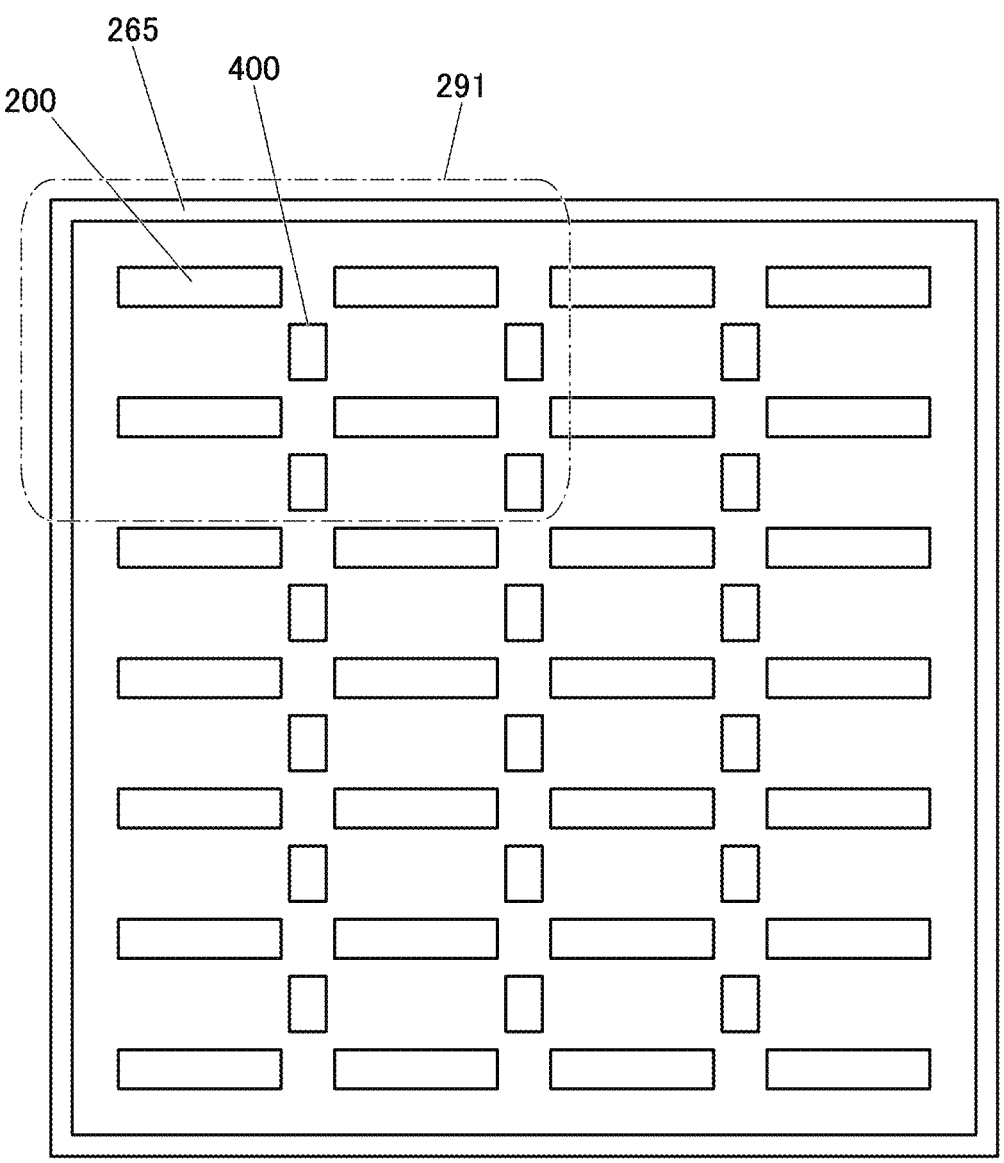
FIG. 1 is a top view of a semiconductor device of one embodiment of the present invention.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be illustrated.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "under", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain are sometimes interchanged with each other when transistors having different polarities are used or when the direction of current is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

The channel width refers to, for example, the length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, silicon oxynitride is a material that contains more oxygen than nitrogen in its composition. Moreover, silicon nitride oxide is a material that contains more nitrogen than oxygen in its composition. Similarly, aluminum oxynitride refers to a material that contains more oxygen than nitrogen in its composition. Moreover, aluminum nitride oxide refers to a material that contains more nitrogen than oxygen in its composition. Similarly, hafnium oxynitride refers to a material that contains more oxygen than nitrogen in its composition. Moreover, a hafnium nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to $-10°$ and less than or equal to $10°$. Accordingly, the case where the angle is greater than or equal to $-5°$ and less than or equal to $5°$ is also included. Furthermore, "substantially parallel" indicates a state where two straight lines are placed at an angle greater than or equal to $-30°$ and less than or equal to $30°$. Moreover, "perpendicular" indicates a state where two straight lines are placed at an angle greater than or equal to $80°$ and less than or equal to $100°$. Accordingly, the case where the angle is greater than or equal to $85°$ and less than or equal to $95°$ is also included. Furthermore, "substantially perpendicular" indicates a state where two straight lines are placed at an angle greater than or equal to $60°$ and less than or equal to $120°$.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

In this embodiment, examples of a semiconductor device 500 of one embodiment of the present invention and a manufacturing method thereof are described with reference to FIG. 1 to FIG. 24.

FIG. 1 is a top view of the semiconductor device 500. The semiconductor device 500 includes a plurality of transistors 200, a plurality of opening regions 400, and a sealing portion 265. As illustrated in FIG. 1, the sealing portion 265 is positioned to surround the plurality of transistors 200 and the plurality of opening regions 400. Note that the number of transistors 200 included in the semiconductor device 500 is not limited to the number illustrated in FIG. 1. In other words, the number of transistors 200 per unit area of the semiconductor device 500, that is, the arrangement density of the transistors 200 may be either higher or lower than the arrangement density of the transistors 200 illustrated in FIG. 1. The number of opening regions 400 can be adjusted as appropriate depending on the arrangement density of the transistors 200 in the semiconductor device 500. Preferably, as the arrangement density of the transistors 200 placed in the semiconductor device 500 increases, the number of opening regions 400 decreases. For example, the opening regions 400 may be placed in the number that is inversely proportional to the arrangement density of the transistors 200. Alternatively, it is preferable that the total area of the opening regions 400 (an integrated value of the area shown in a top view of one of the opening regions 400 and the number of opening regions 400) be larger as the arrangement density of the transistors 200 is lower, and the total area of the opening regions 400 be smaller as the arrangement density of the transistors 200 is higher.

Figure 2A:
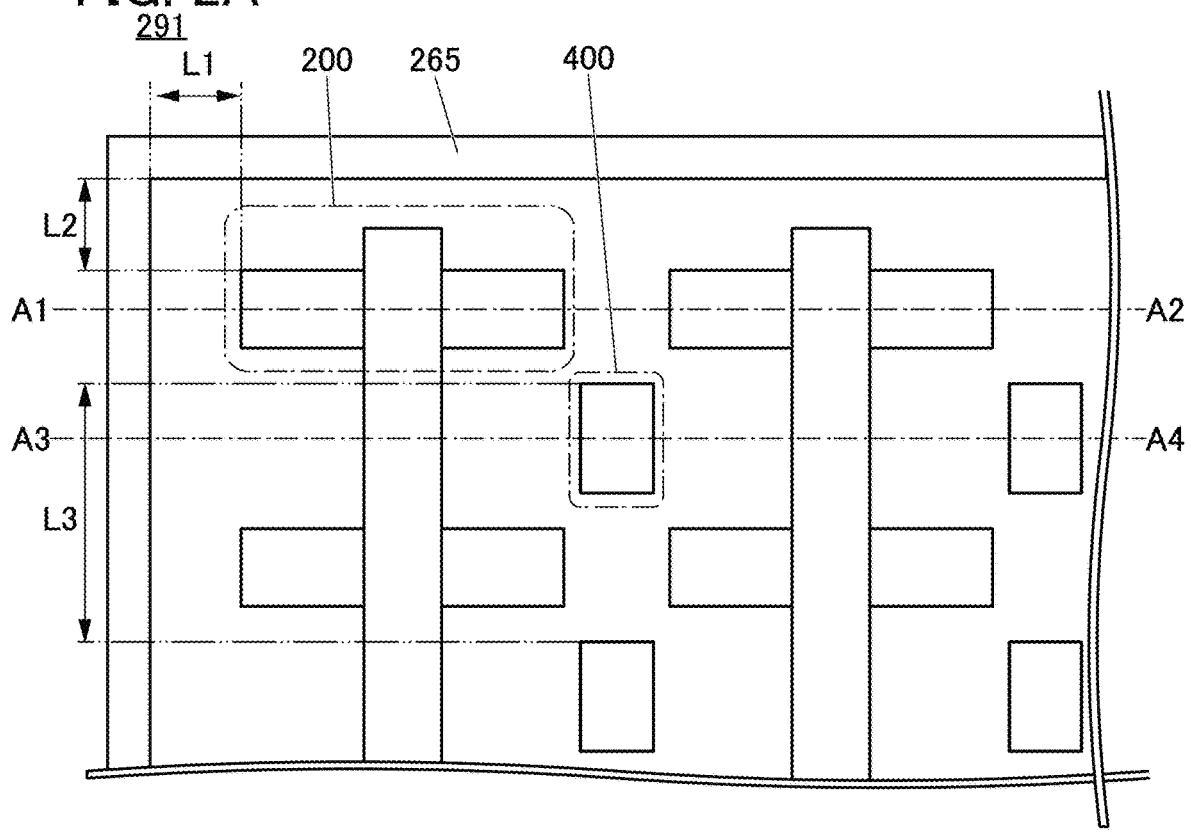
FIG. 2A is a top view of the semiconductor device of one embodiment of the present invention.
Figure 2B:
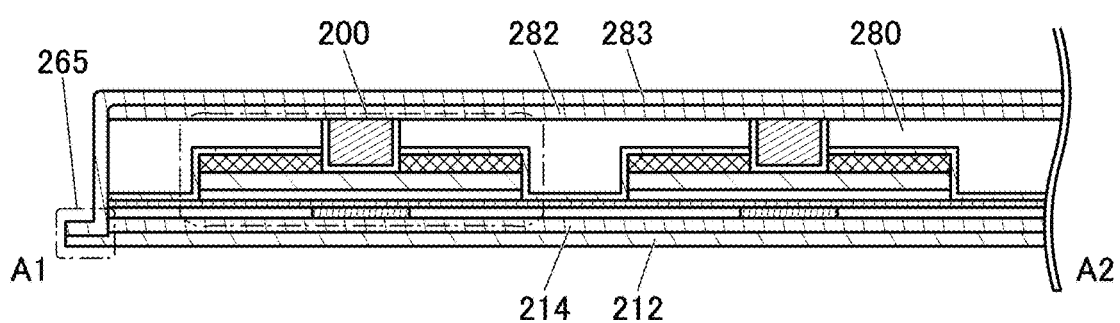
FIG. 2B and FIG. 2C are cross-sectional views of the semiconductor device of one embodiment of the present invention.
Figure 2C:
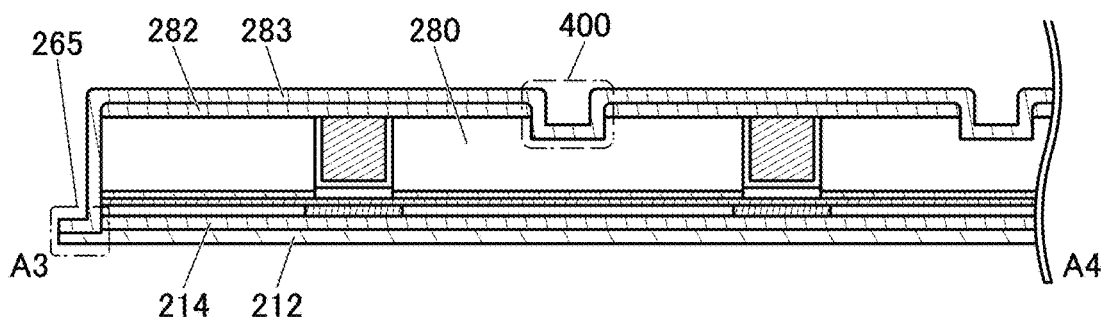

FIG. 2A is an enlarged view of a region 291 surrounded by a dashed-dotted line in FIG. 1. FIG. 2B is a cross-sectional view of a portion indicated by dashed-dotted line A1-A2 in FIG. 2A, and is also a cross-sectional view in the channel length direction of the transistor 200 and a cross-sectional view of the sealing portion 265. FIG. 2C is a cross-sectional view of a portion indicated by dashed-dotted line A3-A4 in FIG. 2A, and is also a cross-sectional view of the opening region 400 and a cross-sectional view of the sealing portion 265.

As illustrated in FIG. 2A, the transistor 200 is positioned such that the length from an end portion of the transistor 200 to an end portion of the sealing portion 265 in the A1-A2 direction is the length L1, and positioned such that the length from an end portion of the transistor 200 to an end portion of the sealing portion 265 in the direction perpendicular to the A1-A2 is the length L2. In addition, the opening regions 400 are positioned at intervals of the length L3 in the direction perpendicular to the A1-A2. Here, the length L3 is a distance between the upper portions of the adjacent opening regions 400 in the direction perpendicular to the A1-A2. The shape of the opening region 400 in the top view is not limited to a rectangular illustrated in FIG. 2A. For example, the shape of the opening region 400 in the top view includes a square, an elliptical shape, a circular shape, a rhombus shape, or a shape obtained by combining these. The length L1 and the length L2 are greater than or equal to 0.10 µm and less than or equal to 2.0 µm, preferably greater than or equal to 0.15 µm and less than or equal to 1.5 µm. The length L3 is greater than or equal to 1.5 µm and less than or equal to 6.0 m. Typically, the length L3 is 1.5 µm.

As illustrated in FIG. 2B and FIG. 2C, the semiconductor device 500 includes an insulator 212 over a substrate (not illustrated), an insulator 214 over the insulator 212, the plurality of transistors 200 over the insulator 214, an insulator 280 over the transistors 200, an insulator 282 over the insulator 280, an insulator 283 over the insulator 282, the sealing portion 265 in which part of a top surface of the insulator 212 is in contact with the insulator 283, and the opening region 400 in which part of the insulator 282 is opened. In the opening region 400, the insulator 280 may include a recess portion, and the depth of the recess portion of the insulator 280 is greater than or equal to ¼ and less than or equal to ½ of the maximum thickness of the insulator 280 in the semiconductor device 500.

When heat treatment is performed after the formation of the opening region 400 in the manufacturing process of the semiconductor device 500, oxygen contained in the insulator 280 and hydrogen bonded to the oxygen can be released to the outside through the opening region 400. Note that the hydrogen bonded to oxygen is released as water. Thus, unnecessary oxygen and hydrogen contained in the insulator 280 can be reduced.

<Structure Example of Semiconductor Device>

Figure 3A:
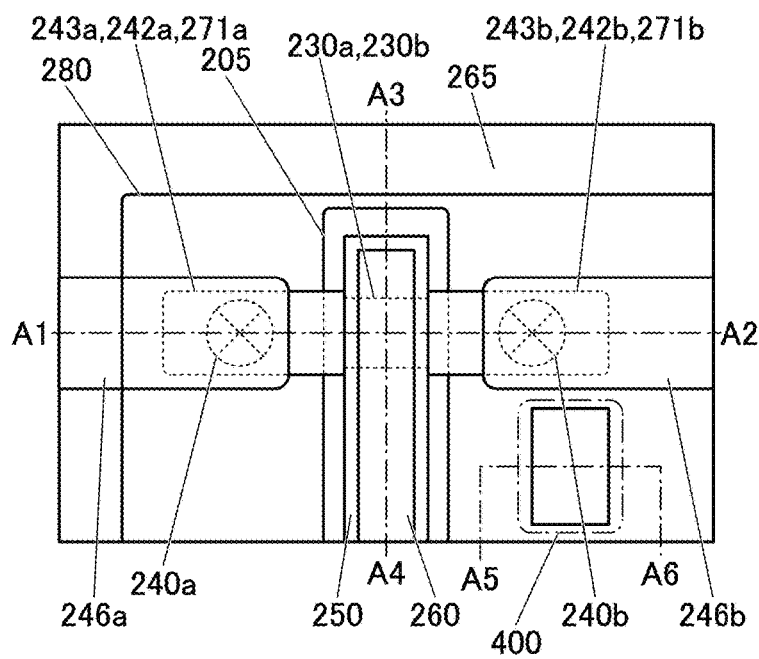
FIG. 3A is a top view of a semiconductor device of one embodiment of the present invention.
Figure 3C:
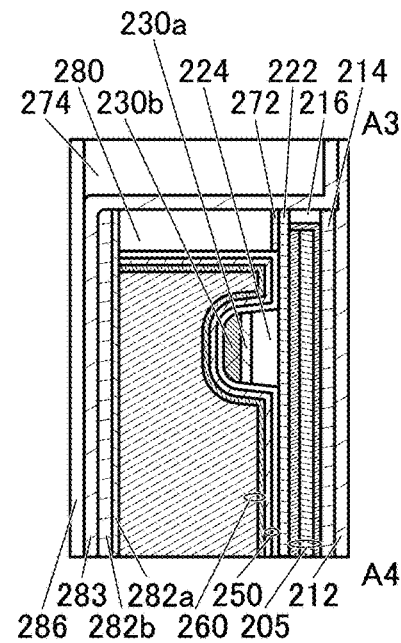
FIG. 3B to FIG. 3D are cross-sectional views of the semiconductor device of one embodiment of the present invention.
Figure 3B:
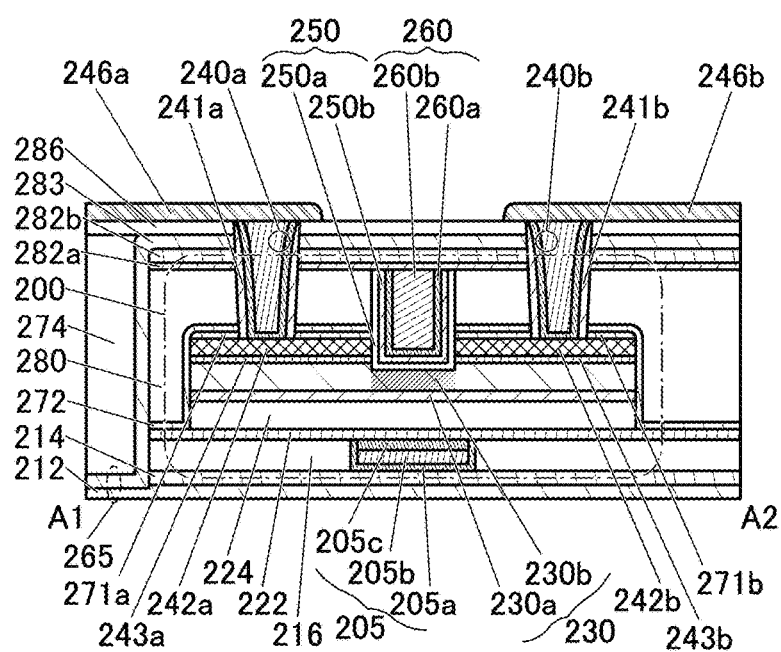
Figure 3D:
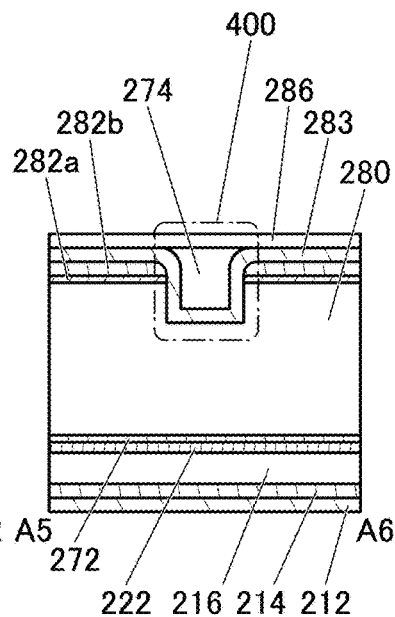

A structure example of a semiconductor device including the transistor 200 and the opening region 400 is described with reference to FIG. 3A to FIG. 3D. FIG. 3A to FIG. 3D are a top view and cross-sectional views of the semiconductor device including the transistor 200 and the opening region 400. FIG. 3A is a top view of the semiconductor device. FIG. 3B to FIG. 3D are cross-sectional views of the semiconductor device. Here, FIG. 3B is a cross-sectional view of a portion indicated by dashed-dotted line A1-A2 in FIG. 3A and is also a cross-sectional view in the channel length direction of the transistor 200. FIG. 3C is a cross-sectional view of a portion indicated by dashed-dotted line A3-A4 in FIG. 3A and is also a cross-sectional view in the channel width direction of the transistor 200. FIG. 3D is a cross-sectional view of a portion indicated by dashed-dotted line A5-A6 in FIG. 3A, and is also a cross-sectional view of the opening region 400. Note that for clarity of the drawing, some components are not illustrated in the top view of FIG. 3A.

The semiconductor device of one embodiment of the present invention includes the insulator 212 over a substrate (not illustrated), the insulator 214 over the insulator 212, the transistor 200 over the insulator 214, the insulator 280 over the transistor 200, the insulator 282 over the insulator 280 (an insulator 282a and an insulator 282b), the insulator 283 over the insulator 282, an insulator 286 over the insulator 283, and an insulator 274 over the sealing portion 265. The insulator 283 is contact with a side surface of the insulator 282, a side surface of the insulator 280, a side surface of the transistor 200, a side surface of the insulator 214, and part of the top surface of the insulator 212. The insulator 212, the insulator 214, the insulator 280, the insulator 282, the insulator 283, the insulator 286, and the insulator 274 function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with side surfaces of the conductor 240 functioning as a plug. A conductor 246 (a conductor 246a and a conductor 246b) that is electrically connected to the conductor 240 and functions as a wiring is provided over the insulator 286 and the conductor 240.

The insulator 241a is provided in contact with the inner wall of an opening in the insulator 280, the insulator 282, the insulator 283, and the insulator 286; a first conductor of the conductor 240a is provided in contact with a side surface of the insulator 241a; and a second conductor of the conductor 240a is provided on the inner side thereof. The insulator 241b is provided in contact with the inner wall of an opening in the insulator 280, the insulator 282, the insulator 283, and the insulator 286; a first conductor of the conductor 240b is provided in contact with a side surface of the insulator 241b; and a second conductor of the conductor 240b is provided on the inner side thereof. The level of a top surface of the conductor 240 and the level of a top surface of the insulator 286 in a region overlapping with the conductor 246 can be substantially the same. Note that although the transistor 200 has a structure in which the first conductor of the conductor 240 and the second conductor of the conductor 240 are stacked, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

[Transistor 200]

As illustrated in FIG. 3A to FIG. 3C, the transistor 200 includes an insulator 216 over the insulator 214; a conductor 205 (a conductor 205a, a conductor 205b, and a conductor 205c) positioned to be embedded in the insulator 214 or the insulator 216; an insulator 222 over the insulator 216 and the conductor 205; an insulator 224 over the insulator 222; an oxide 230a over the insulator 224; an oxide 230b over the oxide 230a; an oxide 243 (an oxide 243a and an oxide 243b)

over the oxide 230b; a conductor 242a over the oxide 243a; an insulator 271a over the conductor 242a; a conductor 242b over the oxide 243b; an insulator 271b over the conductor 242b; an insulator 250a over the oxide 230b; an insulator 250b over the insulator 250a; a conductor 260 (a conductor 260a and a conductor 260b) that is positioned over the insulator 250b and overlaps with part of the oxide 230b; and an insulator 272 positioned to cover the insulator 224, the oxide 230 (the oxide 230a and the oxide 230b), the oxide 243, the conductor 242 (the conductor 242a and the conductor 242b), and the insulator 271 (the insulator 271a and the insulator 271b). Here, as illustrated in FIG. 3B to FIG. 3D, the insulator 272 includes a region in contact with part of a top surface of the insulator 222. A top surface of the conductor 260 is positioned to be substantially level with a top surface of the insulator 250 and a top surface of the insulator 280. The insulator 282 is in contact with each of the top surfaces of the conductor 260, the insulator 250, and the insulator 280.

Hereinafter, the oxide 230a and the oxide 230b are collectively referred to as the oxide 230 in some cases. The insulator 250a and the insulator 250b are collectively referred to as the insulator 250 in some cases. The insulator 271a and the insulator 271b are collectively referred to as the insulator 271 in some cases.

An opening reaching the oxide 230b is provided in the insulator 280 and the insulator 272. The insulator 250 and the conductor 260 are positioned in the opening. In addition, in the channel length direction of the transistor 200, the conductor 260 and the insulator 250 are provided between the insulator 271a, the conductor 242a, and the oxide 243a and the insulator 271b, the conductor 242b, and the oxide 243b. The insulator 250 includes a region in contact with a side surface of the conductor 260 and a region in contact with a bottom surface of the conductor 260.

The oxide 230 preferably includes the oxide 230a positioned over the insulator 224 and the oxide 230b positioned over the oxide 230a. Including the oxide 230a under the oxide 230b makes it possible to inhibit diffusion of impurities into the oxide 230b from components formed below the oxide 230a.

Although the oxide 230 in the transistor 200 has a structure in which two layers of the oxide 230a and the oxide 230b are stacked, the present invention is not limited thereto. For example, the oxide 230 may have a single-layer structure of the oxide 230b or a stacked-layer structure of three or more layers, or the oxide 230a and the oxide 230b may each have a stacked-layer structure.

Here, the conductor 260 functions as a first gate (also referred to as a top gate) electrode, and the conductor 205 functions as a second gate (also referred to as a back gate) electrode. The insulator 250 functions as a first gate insulator, and the insulator 222 and the insulator 224 function as a second gate insulator. The conductor 242a functions as one of a source and a drain, and the conductor 242b functions as the other of the source and the drain. A region of the oxide 230 that overlaps with the conductor 260 at least partly functions as a channel formation region.

Figure 4:
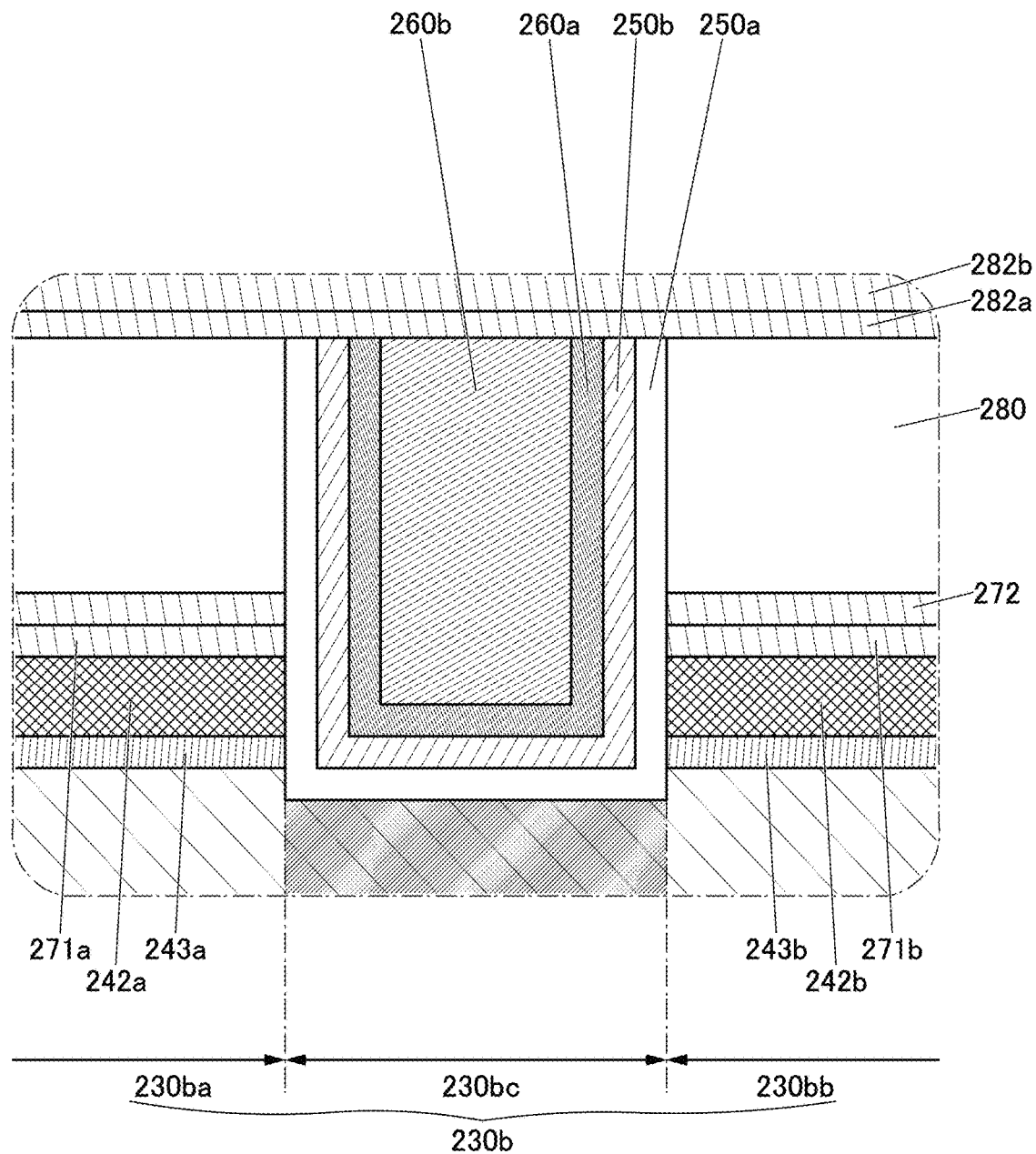
FIG. 4 is a cross-sectional view of the semiconductor device of one embodiment of the present invention.
Figure 6A:
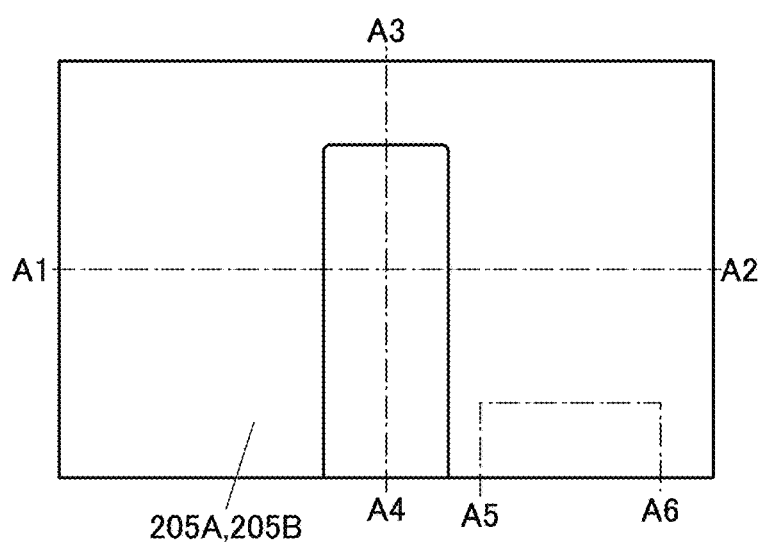
FIG. 6A is a top view illustrating a method for manufacturing a semiconductor device of one embodiment of the present invention.
Figure 6C:
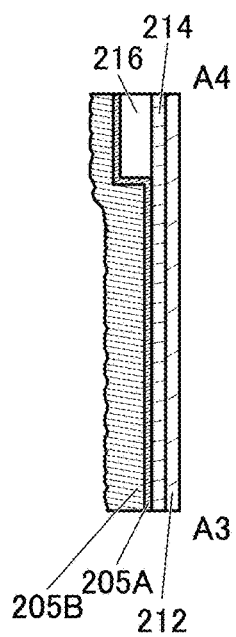
FIG. 6B to FIG. 6D are cross-sectional views illustrating the method for manufacturing the semiconductor device of one embodiment of the present invention.
Figure 6B:
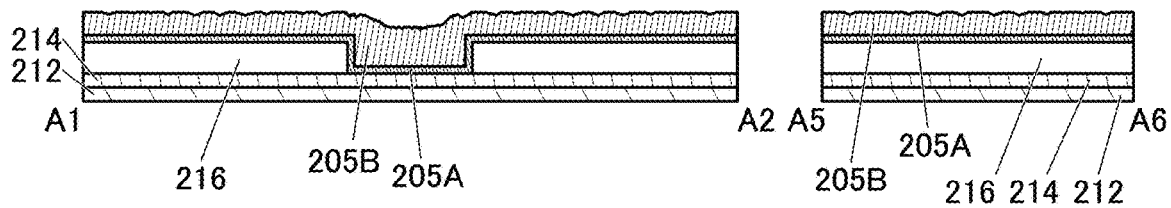
Figure 6D:
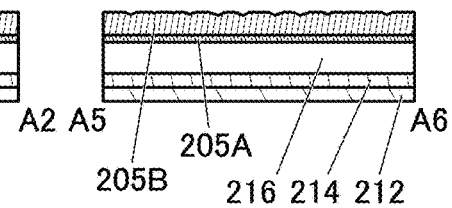

Here, FIG. 4 is an enlarged view of the vicinity of the channel formation region in FIG. 3B. As illustrated in FIG. 4, the oxide 230b includes a region 230bc functioning as the channel formation region of the transistor 200 and a region 230ba and a region 230bb that are provided to sandwich the region 230bc and function as a source region and a drain region. At least part of the region 230bc overlaps with the conductor 260. In other words, the region 230bc is provided between the conductor 242a and the conductor 242b. The region 230ba is provided to overlap with the conductor 242a, and the region 230bb is provided to overlap with the conductor 242b.

The region 230bc functioning as the channel formation region is a high-resistance region with a low carrier concentration because it includes a smaller amount of oxygen vacancies or has a lower impurity concentration than the region 230ba and the region 230bb. The region 230ba and the region 230bb functioning as the source region and the drain region are each a low-resistance region with an increased carrier concentration because it includes a large amount of oxygen vacancies or has a high concentration of an impurity such as hydrogen, nitrogen, or a metal element. In other words, the region 230ba and the region 230bb are each a region having a higher carrier concentration and a lower resistance than the region 230bc.

The carrier concentration in the region 230bc functioning as the channel formation region is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet further preferably lower than $1\times10^{13}$ $cm^{-3}$, yet still further preferably lower than $1\times10^{12}$ $cm^{3}$. Note that the lower limit of the carrier concentration in the region 230bc functioning as the channel formation region is not particularly limited and can be, for example, $1\times10^{-9}$ $cm^{-3}$.

Between the region 230bc and the region 230ba or the region 230bb may be formed a region having a carrier concentration that is lower than or substantially equal to the carrier concentrations in the region 230ba and the region 230bb and higher than or substantially equal to the carrier concentration in the region 230bc. That is, the region functions as a junction region between the region 230bc and the region 230ba or the region 230bb. The hydrogen concentration in the junction region is sometimes lower than or substantially equal to the hydrogen concentrations in the region 230ba and the region 230bb and higher than or substantially equal to the hydrogen concentration in the region 230bc. The amount of oxygen vacancies in the junction region is sometimes smaller than or substantially equal to the amounts of oxygen vacancies in the region 230ba and the region 230bb and larger than or substantially equal to the amount of oxygen vacancies in the region 230bc.

Note that FIG. 4 illustrates an example in which the region 230ba, the region 230bb, and the region 230bc are formed in the oxide 230b; however, the present invention is not limited to this. For example, the above regions may be formed not only in the oxide 230b but also in the oxide 230a.

In the oxide 230, the boundaries between the regions are difficult to detect clearly in some cases. The concentrations of a metal element and impurity elements such as hydrogen and nitrogen, which are detected in each region, may be not only gradually changed between the regions, but also continuously changed in each region. That is, the region closer to the channel formation region preferably has lower concentrations of a metal element and impurity elements such as hydrogen and nitrogen.

In the transistor 200, a metal oxide functioning as a semiconductor (such a metal oxide is hereinafter also referred to as an oxide semiconductor) is preferably used for the oxide 230 (the oxide 230a and the oxide 230b) including the channel formation region.

The metal oxide functioning as a semiconductor has a band gap of preferably 2 eV or higher, further preferably 2.5 eV or higher. With the use of a metal oxide having such a wide band gap, the off-state current of the transistor can be reduced.

For the oxide 230, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. Alternatively, an In—Ga oxide, an In—Zn oxide, or an indium oxide may be used as the oxide 230.

The atomic ratio of In to the element M in the metal oxide used for the oxide 230b is preferably greater than the atomic ratio of In to the element M in the metal oxide used for the oxide 230a.

The oxide 230a is positioned under the oxide 230b, whereby impurities and oxygen can be inhibited from being diffused into the oxide 230b from components formed below the oxide 230a.

When the oxide 230a and the oxide 230b contain a common element (as the main component) besides oxygen, the density of defect states at an interface between the oxide 230a and the oxide 230b can be low. Since the density of defect states at the interface between the oxide 230a and the oxide 230b can be decreased, the influence of interface scattering on carrier conduction is small, and a high on-state current can be obtained.

The oxide 230b preferably has crystallinity. It is particularly preferable to use a CAAC-OS (c-axis aligned crystalline oxide semiconductor) for the oxide 230b.

The CAAC-OS is a metal oxide having a dense structure with high crystallinity and a small amount of impurities or defects (e.g., oxygen vacancies). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is unlikely to occur. Thus, a metal oxide including a CAAC-OS is physically stable. Therefore, the metal oxide including a CAAC-OS is resistant to heat and has high reliability.

When impurities and oxygen vacancies are in a channel formation region of the oxide semiconductor included in a transistor, electrical characteristics of the transistor may vary and the reliability thereof may worsen. In some cases, hydrogen in the vicinity of an oxygen vacancy forms a defect into which hydrogen enters (hereinafter sometimes referred to as $V_O H$), which generates an electron serving as a carrier. Therefore, when the channel formation region in the oxide semiconductor includes oxygen vacancies, the transistor tends to have normally-on characteristics (a channel is generated even when no voltage is applied to the gate electrode and current flows through the transistor). Therefore, the impurities, oxygen vacancies, and $V_O H$ are preferably reduced as much as possible in the channel formation region of the oxide semiconductor. In other words, in the channel formation region in the oxide semiconductor, the carrier concentration is preferably reduced and the channel formation region is preferably i-type (intrinsic) or substantially i-type.

In contrast, when an insulator containing oxygen that is released by heating (hereinafter referred to as excess oxygen in some cases) is provided in the vicinity of the oxide semiconductor and heat treatment is performed, oxygen can be supplied from the insulator to the oxide semiconductor so as to reduce oxygen vacancies and $V_O H$. However, when an excess amount of oxygen is supplied to the source region or the drain region, the on-state current or field-effect mobility of the transistor 200 might be decreased. Furthermore, variation in the amount of oxygen supplied to the source region or the drain region on the substrate plane leads to variable characteristics of the semiconductor device including the transistor.

Therefore, the region 230bc functioning as the channel formation region in the oxide semiconductor is preferably an i-type or substantially i-type region with reduced carrier concentration. In contrast, the region 230ba and the region 230bb functioning as the source region and the drain region are preferably n-type regions with high carrier concentrations. That is, it is preferable that oxygen vacancies and $V_O H$ in the region 230bc in the oxide semiconductor be reduced and the region 230ba and the region 230bb not be supplied with an excess amount of oxygen.

Thus, in this embodiment, microwave treatment is performed in an atmosphere containing oxygen in a state where the conductor 242a and the conductor 242b are provided over the oxide 230b so that oxygen vacancies and $V_O H$ in the region 230bc are reduced. Here, the microwave treatment refers to, for example, treatment using an apparatus including a power source that generates high-density plasma with the use of a microwave.

The microwave treatment in an atmosphere containing oxygen converts an oxygen gas into plasma using a high-frequency wave such as a microwave or RF and activates the oxygen plasma. At this time, the region 230bc can be irradiated with the high-frequency wave such as the microwave or RF. By the effect of the plasma, the microwave, or the like, $V_O H$ in the region 230bc can be cut; thus, hydrogen H can be removed from the region 230bc and an oxygen vacancy $V_O$ can be filled with oxygen. That is, the reaction "$V_O H \rightarrow H + V_O$" occurs in the region 230bc, so that the hydrogen concentration in the region 230bc can be reduced. As a result, oxygen vacancies and $V_O H$ in the region 230bc can be reduced to lower the carrier concentration.

In the microwave treatment in an atmosphere containing oxygen, the microwave, the high-frequency wave such as RF, the oxygen plasma, or the like is blocked by the conductor 242a and the conductor 242b and does not affect the region 230ba and the region 230bb. In addition, the effect of the oxygen plasma can be reduced by the insulator 271a, the insulator 271b, and the insulator 280 that are provided to cover the oxide 230b and the conductor 242. Hence, a reduction in $V_O H$ and supply of an excess amount of oxygen do not occur in the region 230ba and the region 230bb in the microwave treatment, preventing a decrease in carrier concentration.

In particular, the above effect is large when the microwave treatment is performed in an oxygen-containing atmosphere after deposition of an insulating film to be the insulator 250b. It is also preferable that microwave treatment be performed in an oxygen-containing atmosphere after deposition of an insulating film to be the insulator 250a and another microwave treatment be further performed in an oxygen-containing atmosphere after the deposition of the insulating film to be the insulator 250b. By performing the microwave treatment in an oxygen-containing atmosphere through the insulator 250a or the insulator 250b in such a manner, oxygen can be efficiently implanted into the region 230bc. The oxygen implanted into the region 230bc has any of a variety of forms such as an oxygen atom, an oxygen molecule, an oxygen radical (an atom, a molecule, or an ion having an unpaired electron). Note that the oxygen implanted into the region 230*bc* has any one or more of the above forms, particularly preferably an oxygen radical. The film quality of the insulator 250*a* and the insulator 250*b* can be improved, leading to higher reliability of the transistor 200.

In the above manner, oxygen vacancies and $V_OH$ can be selectively removed from the region 230*bc* in the oxide semiconductor, whereby the region 230*bc* can be an i-type or substantially i-type region. Furthermore, supply of an excess amount of oxygen to the region 230*ba* and the region 230*bb* functioning as the source region and the drain region can be inhibited and the n-type regions can be maintained. As a result, change in the electrical characteristics of the transistor 200 can be inhibited, and thus, variation in the electrical characteristics of the transistors 200 in the substrate plane can be inhibited.

With the above structure, a semiconductor device with little variation in transistor characteristics can be provided. A semiconductor device having favorable reliability can be provided. A semiconductor device having favorable electrical characteristics can be provided.

FIG. 3 and the like illustrate the structure in which a side surface of the opening in which the conductor 260 and the like are embedded is substantially perpendicular to the formation surface of the oxide 230*b* including a groove portion of the oxide 230*b*; however, this embodiment is not limited thereto. For example, the opening may have a U-shape with a bottom portion having a moderate curve. For example, the side surface of the opening may be tilted with respect to the formation surface of the oxide 230*b*.

As illustrated in FIG. 3C, a curved surface may be provided between a side surface of the oxide 230*b* and a top surface of the oxide 230*b* in a cross-sectional view in the channel width direction of the transistor 200. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230*b* in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230*b* with the insulator 250 and the conductor 260.

The oxide 230 preferably has a stacked-layer structure of a plurality of oxide layers with different chemical compositions. Specifically, the atomic ratio of the element M to the metal element of the main component in the metal oxide used for the oxide 230*a* is preferably greater than the atomic ratio of the element M to the metal element of the main component in the metal oxide used for the oxide 230*b*. Moreover, the atomic ratio of the element M to In in the metal oxide used for the oxide 230*a* is preferably greater than the atomic ratio of the element M to In in the metal oxide used for the oxide 230*b*. Furthermore, the atomic ratio of In to the element M in the metal oxide used for the oxide 230*b* is preferably greater than the atomic ratio of In to the element M in the metal oxide used for the oxide 230*a*.

The oxide 230*b* is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230*b* by the source electrode or the drain electrode. This can reduce oxygen extraction from the oxide 230*b* even when heat treatment is performed; thus, the transistor 200 is stable with respect to high temperatures in a manufacturing process (what is called thermal budget).

Here, the conduction band minimum gradually changes at a junction portion of the oxide 230*a* and the oxide 230*b*. In other words, the conduction band minimum at the junction portion of the oxide 230*a* and the oxide 230*b* continuously changes or is continuously connected. To obtain this, the density of defect states in a mixed layer formed at the interface between the oxide 230*a* and the oxide 230*b* is preferably decreased.

Specifically, when the oxide 230*a* and the oxide 230*b* contain the same element as a main component in addition to oxygen, a mixed layer with a low density of defect states can be formed. For example, in the case where the oxide 230*b* is an In-M-Zn oxide, an In-M-Zn oxide, an M-Zn oxide, an oxide of the element M, an In—Zn oxide, indium oxide, or the like may be used for the oxide 230*a*.

Specifically, for the oxide 230*a*, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 230*b*, a metal oxide with a composition of In:M:Zn=1:1:1 [atomic ratio] or in the neighborhood thereof, a composition of In:M:Zn=4:2:3 [atomic ratio] or in the neighborhood thereof, or a composition of In:M:Zn=5:1:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

When the oxide 230*a* and the oxide 230*b* have the above structure, the density of defect states at the interface between the oxide 230*a* and the oxide 230*b* can be made low. Thus, the influence of interface scattering on carrier conduction is small, and the transistor 200 can have a high on-state current and excellent frequency characteristics.

At least one of the insulator 212, the insulator 214, the insulator 271, the insulator 272, the insulator 282, and the insulator 283 preferably functions as a barrier insulating film, which inhibits diffusion of impurities such as water and hydrogen from the substrate side or above the transistor 200 into the transistor 200. Thus, for at least one of the insulator 212, the insulator 214, the insulator 271, the insulator 272, the insulator 282, and the insulator 283, an insulating material which has a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material which has a function of inhibiting diffusion of oxygen (e.g., at least one of an oxygen atom, an oxygen molecule, and the like) (through which the above oxygen is less likely to pass).

Note that in this specification, a barrier insulating film refers to an insulating film having a barrier property. A barrier property in this specification means a function of inhibiting diffusion of a targeted substance (also referred to as having low permeability). Alternatively, a barrier property in this specification means a function of capturing and fixing (also referred to as gettering) a targeted substance.

An insulator having a function of inhibiting diffusion of impurities, such as water and hydrogen, and oxygen is preferably used for the insulator 212, the insulator 214, the insulator 271, the insulator 272, the insulator 282, and the insulator 283; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212 and the insulator 283. For example, aluminum oxide or magnesium oxide, which has a function of capturing or fixing hydrogen, is preferably used for the insulator 214, the insulator 271, the insulator 272, and the insulator 282. In this case, impurities such as water and hydrogen can be inhibited from diffusing into the transistor 200 side from the substrate side through the insulator 212 and the insulator 214. Impurities such as water and hydrogen can be inhibited from diffusing into the transistor 200 side from an interlayer insulating film and the like which are provided outside the insulator 283. Alternatively, oxygen contained in the insulator 224 or the like can be inhibited from diffusing into the substrate side through the insulator 212 and the insulator 214. Alternatively, oxygen contained in the insulator 280 and the like can be inhibited from diffusing to above the transistor 200 through the insulator 282 and the like. In this manner, it is preferable that the transistor 200 be surrounded by the insulator 212, the insulator 214, the insulator 271, the insulator 272, the insulator 282, and the insulator 283, which have a function of inhibiting diffusion of oxygen and impurities such as water and hydrogen.

Here, an oxide having an amorphous structure is preferably used for the insulator 212, the insulator 214, the insulator 271, the insulator 272, the insulator 282, and the insulator 283. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided in the vicinity of the transistor 200, hydrogen contained in the transistor 200 or hydrogen in the vicinity of the transistor 200 can be captured or fixed. In particular, hydrogen contained in the channel formation region of the transistor 200 is preferably captured or fixed. The metal oxide having an amorphous structure is used as the component of the transistor 200 or provided in the vicinity of the transistor 200, whereby the transistor 200 and a semiconductor device which have favorable characteristics and high reliability can be manufactured.

Although the insulator 212, the insulator 214, the insulator 271, the insulator 272, the insulator 282, and the insulator 283 preferably have an amorphous structure, they may partly include a region having a polycrystalline structure. Alternatively, the insulator 212, the insulator 214, the insulator 271, the insulator 272, the insulator 282, and the insulator 283 may have a multilayer structure in which a layer having an amorphous structure and a layer having a polycrystalline structure are stacked. For example, a stacked-layer structure in which a layer with a polycrystalline structure is formed over a layer with an amorphous structure may be employed.

The insulator 272 may have a stacked-layer structure. For example, the insulator 272 may have a stacked-layer structure of aluminum oxide and silicon nitride to be deposited over the aluminum oxide. Such a stacked-layer structure is preferable because the insulator 272 can have higher barrier property than that of a single layer of aluminum oxide or a single layer of silicon nitride.

The insulator 212, the insulator 214, the insulator 216, the insulator 271, the insulator 272, the insulator 280, the insulator 282, the insulator 283, and the insulator 286 can be deposited by a sputtering method, for example. Since a sputtering method does not need to use hydrogen as a deposition gas, the hydrogen concentrations in the insulator 212, the insulator 214, the insulator 216, the insulator 271, the insulator 272, the insulator 280, the insulator 282, the insulator 283, and the insulator 286 can be reduced. The deposition method is not limited to a sputtering method; a chemical vapor deposition (CVD) method, a molecular beam epitaxy (MBE) method, a pulsed laser deposition (PLD) method, an atomic layer deposition (ALD) method, or the like can be used as appropriate.

The resistivities of the insulator 212 and the insulator 283 are preferably low in some cases. For example, by setting the resistivities of the insulator 212 and the insulator 283 to approximately $1 \times 10^{13}$ Ωcm, the insulator 212 and the insulator 283 can sometimes reduce charge up of the conductor 205, the conductor 242, the conductor 260, or the conductor 246 in treatment using plasma or the like in the manufacturing process of a semiconductor device. The resistivities of the insulator 212 and the insulator 283 are preferably higher than or equal to $1 \times 10^{10}$ Ωcm and lower than or equal to $1 \times 10^{15}$ Ωcm.

The insulator 216, the insulator 274, the insulator 280, and the insulator 286 preferably have a lower permittivity than the insulator 214. When a material with a low permittivity is used for an interlayer film, parasitic capacitance generated between wirings can be reduced. For the insulator 216, the insulator 274, the insulator 280, and the insulator 286, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216.

The conductor 205 includes the conductor 205a, the conductor 205b, and the conductor 205c. The conductor 205a is provided in contact with a bottom surface and a side wall of the opening. The conductor 205b is provided to be embedded in a recessed portion formed in the conductor 205a. Here, the level of a top surface of the conductor 205b is lower than the levels of a top surface of the conductor 205a and a top surface of the insulator 216. The conductor 205c is provided in contact with the top surface of the conductor 205b and a side surface of the conductor 205a. Here, a top surface of the conductor 205c is substantially level with the top surface of the conductor 205a and the top surface of the insulator 216. That is, the conductor 205b is surrounded by the conductor 205a and the conductor 205c.

Here, for the conductor 205a and the conductor 205c, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a and the conductor 205c are formed using a conductive material having a function of inhibiting diffusion of hydrogen, impurities such as hydrogen contained in the conductor 205b can be prevented from diffusing into the oxide 230 through the insulator 224 and the like. When the conductor 205a and the conductor 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 205a. For example, titanium nitride is used for the conductor 205a.

Moreover, the conductor 205b is preferably formed using a conductive material containing tungsten, copper, or aluminum as its main component. For example, tungsten is used for the conductor 205b.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurity such as hydrogen contained in the insulator 216 can be reduced, inhibiting the diffusion of the impurity into the oxide 230.

As illustrated in FIG. 3A, the conductor 205 is preferably provided to be larger than a region of the oxide 230 that does not overlap with the conductor 242a or the conductor 242b. As illustrated in FIG. 3C, it is particularly preferable that the conductor 205 extend to a region outside end portions of the oxide 230a and the oxide 230b in the channel width direction. That is, the conductor 205 and the conductor 260 preferably overlap with each other with the insulators therebetween on the outer side of a side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, the S-channel structure refers to a transistor structure in which a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

Furthermore, as illustrated in FIG. 3C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the conductor 205 is a stack of the conductor 205a, the conductor 205b, and the conductor 205c is illustrated, the present invention is not limited thereto. For example, the conductor 205 may have a single-layer structure or a stacked-layer structure of two layers or four or more layers.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

For the insulator 222, an insulator containing an oxide of one or both of aluminum and hafnium, which is an insulating material, is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 222.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current might arise because of a thinner gate insulator. When a high-k material is used for the insulator functioning as a gate insulator, a gate potential during operation of the transistor can be reduced while the physical thickness of the gate insulator is maintained.

Silicon oxide or silicon oxynitride, for example, can be used as appropriate for the insulator 224 that is in contact with the oxide 230.

In a manufacturing process of the transistor 200, heat treatment is preferably performed with a surface of the oxide 230 exposed. The heat treatment is performed at higher than or equal to 100° C. and lower than or equal to 600° C., preferably higher than or equal to 350° C. and lower than or equal to 550° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies $V_O$. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 230 can promote a reaction in which oxygen vacancies in the oxide 230 are repaired with supplied oxygen, i.e., a reaction of "$V_O$+O→null". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of $V_O H$.

Note that the insulator 222 and the insulator 224 may have a stacked-layer structure of two or more layers. In such cases, without limitation to a stacked-layer structure formed of the same material, a stacked-layer structure formed of different materials may be employed. The insulator 224 may be formed into an island shape overlapping with the oxide 230a. In that case, the insulator 272 is in contact with a side surface of the insulator 224 and the top surface of the insulator 222.

The oxide 243a and the oxide 243b are provided over the oxide 230b. The oxide 243a and the oxide 243b are provided to be apart from each other with the conductor 260 therebetween.

The oxide 243 (the oxide 243a and the oxide 243b) preferably has a function of inhibiting passage of oxygen. The oxide 243 having a function of inhibiting passage of oxygen is preferably placed between the oxide 230b and the conductor 242 functioning as the source electrode and the drain electrode, in which case the electric resistance between the oxide 230b and the conductor 242 can be reduced. Such a structure improves the electrical characteristics of the transistor 200 and the reliability of the transistor 200. In the case where the electric resistance between the oxide 230b and the conductor 242 can be sufficiently reduced, the oxide 243 is not necessarily provided.

A metal oxide containing the element M may be used for the oxide 243. In particular, aluminum, gallium, yttrium, or tin is preferably used as the element M. The concentration of the element M in the oxide 243 is preferably higher than that in the oxide 230b. Furthermore, gallium oxide may be used for the oxide 243. A metal oxide such as an In-M-Zn oxide may be used for the oxide 243. Specifically, the atomic ratio of the element M to In in the metal oxide used for the oxide 243 is preferably greater than the atomic ratio of the element M to In in the metal oxide used for the oxide 230b. The thickness of the oxide 243 is preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

It is preferable that the conductor 242a be provided in contact with a top surface of the oxide 243a and the conductor 242b be provided in contact with a top surface of the oxide 243b. Each of the conductor 242a and the conductor 242b functions as a source electrode or a drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

Note that hydrogen contained in the oxide 230b or the like is diffused into the conductor 242a or the conductor 242b in some cases. In particular, when a nitride containing tantalum is used for the conductor 242a and the conductor 242b, hydrogen contained in the oxide 230b or the like is likely to be diffused into the conductor 242a or the conductor 242b, and the diffused hydrogen is bonded to nitrogen contained in the conductor 242a or the conductor 242b in some cases. That is, hydrogen contained in the oxide 230b or the like is sometimes absorbed by the conductor 242a or the conductor 242b in some cases.

No curved surface is preferably formed between a side surface of the conductor 242 and a top surface of the conductor 242. When no curved surface is formed in the conductor 242, the conductor 242 can have a large cross-sectional area in the channel width direction. Accordingly, the resistance of the conductor 242 is reduced, so that the on-state current of the transistor 200 can be increased.

The insulator 271a is provided in contact with the top surface of the conductor 242a, and the insulator 271b is provided in contact with the top surface of the conductor 242b. A top surface of the insulator 271a is preferably in contact with the insulator 272, and a side surface of the insulator 271a is preferably in contact with the insulator 250. A top surface of the insulator 271b is preferably in contact with the insulator 272, and a side surface of the insulator 271b is preferably in contact with the insulator 250. The insulator 271 preferably functions as at least a barrier insulating film against oxygen. Thus, the insulator 271 preferably has a function of inhibiting oxygen diffusion. For example, the insulator 271 preferably has a function of further inhibiting diffusion of oxygen as compared to the insulator 280. For example, a nitride containing silicon such as silicon nitride may be used for the insulator 271. The insulator 271 preferably has a function of capturing impurities such as hydrogen. In that case, for the insulator 271, a metal oxide including an amorphous structure, for example, an insulator such as aluminum oxide or magnesium oxide may be used. It is particularly preferable to use aluminum oxide including an amorphous structure or amorphous aluminum oxide for the insulator 271 because hydrogen can be captured or fixed more effectively in some cases. Accordingly, the transistor 200 and a semiconductor device which have favorable characteristics and high reliability can be fabricated.

The insulator 272 is provided to cover the insulator 224, the oxide 230a, the oxide 230b, the oxide 243, the conductor 242, and the insulator 271. The insulator 272 preferably has a function of capturing and fixing hydrogen. In that case, the insulator 272 preferably includes a metal oxide having an amorphous structure, for example, an insulator such as aluminum oxide or magnesium oxide.

When the above insulator 271 and the insulator 272 are provided, the conductor 242 can be surrounded by the insulators having a barrier property against oxygen. That is, oxygen contained in the insulator 224 and the insulator 280 can be prevented from diffusing into the conductor 242. As a result, the conductor 242 can be inhibited from being directly oxidized by oxygen contained in the insulator 224 and the insulator 280, so that an increase in resistivity and a reduction in on-state current can be inhibited.

The insulator 250 functions as a gate insulator. The insulator 250 is preferably placed in contact with the top surface of the oxide 230b. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable.

As in the insulator 224, the concentration of impurities such as water and hydrogen in the insulator 250 is preferably lowered. The thickness of the insulator 250 is preferably greater than or equal to 1 nm and less than or equal to 20 nm.

In the case where the insulator 250 has a stacked-layer structure of two layers as illustrated in FIG. 3B and FIG. 3C, it is preferable that the insulator 250a that is a lower layer be formed using an insulator that is likely to pass oxygen and the insulator 250b that is an upper layer be formed using an insulator having a function of inhibiting oxygen diffusion. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, it is preferable that the insulator 250a be provided using any of the above-described materials that can be used for the insulator 250 and the insulator 250b be provided using an insulator containing an oxide of one or both of aluminum and hafnium. As the insulator, aluminum oxide, hafnium oxide, an oxide containing aluminum and hafnium (hafnium aluminate), or the like is preferably used. The thickness of the insulator 250b is greater than or equal to 0.5 nm and less than or equal to 3.0 nm, preferably greater than or equal to 1.0 nm and less than or equal to 1.5 nm.

In the case where silicon oxide, silicon oxynitride, or the like is used for the lower layer of the insulator 250, the upper layer of the insulator 250 may be formed using an insulating material that is a high-k material having a high relative permittivity. The gate insulator having a stacked-layer structure of the insulator 250a and the insulator 250b can be thermally stable and can have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

Note that the metal oxide may have a function of part of the first gate electrode. For example, a metal oxide that can be used for the oxide 230 can be used as the metal oxide. In that case, when the conductor 260a is deposited by a sputtering method, the metal oxide can have a reduced electric resistance value to be a conductor. Such a conductor can be referred to as an OC (Oxide Conductor) electrode.

With the metal oxide, the on-state current of the transistor 200 can be increased without a reduction in the influence of the electric field from the conductor 260. Since a distance between the conductor 260 and the oxide 230 is kept by the physical thicknesses of the insulator 250 and the metal oxide, leakage current between the conductor 260 and the oxide 230 can be inhibited. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 functions as the first gate electrode of the transistor 200. The conductor 260 preferably includes the conductor 260a and the conductor 260b placed over the conductor 260a. For example, the conductor 260a is preferably placed to cover the bottom surface and the side surface of the conductor 260b. Moreover, as illustrated in FIG. 3B and FIG. 3C, the top surface of the conductor 260 is substantially level with the top surface of the insulator 250. Although the conductor 260 has a two-layer structure of the conductor 260a and the conductor 260b in FIG. 3B and FIG. 3C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be placed certainly in a region between the conductor 242a and the conductor 242b without alignment.

As illustrated in FIG. 3C, in the channel width direction of the transistor 200, when a bottom surface of the insulator 222 is regarded as a basis, the level of the bottom surface of the conductor 260 in a region where the conductor 260 and the oxide 230b do not overlap with each other is preferably lower than the level of a bottom surface of the oxide 230b. When the conductor 260 functioning as the gate electrode covers the side surface and the top surface of the channel formation region of the oxide 230b with the insulator 250 and the like therebetween, the electric field of the conductor 260 is likely to act on the entire channel formation region of the oxide 230b. Thus, the on-state current of the transistor 200 can be increased and the frequency characteristics of the transistor 200 can be improved. When the bottom surface of the insulator 222 is regarded as a basis, the difference between the level of the bottom surface of the conductor 260 in a region where the oxide 230a and the oxide 230b and the conductor 260 do not overlap with each other and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

[Opening Region 400]

The opening region 400 is formed in such a manner that the insulator 282 is opened in the manufacturing process of a semiconductor device. At this time, a recess portion is formed in the insulator 280 in some cases. When heat treatment is performed after the formation of the opening region 400, oxygen contained in the insulator 280 and hydrogen bonded to the oxygen can be released to the outside through the opening region 400. Note that the hydrogen bonded to oxygen is released as water. Thus, unnecessary oxygen and hydrogen contained in the insulator 280 can be reduced. The insulator 283 over the insulator 282 is provided in contact with the insulator 280 in the opening region 400, and the insulator 274 is embedded on the insulator 283 in the opening region 400. The depth of the recess portion of the insulator 280 is greater than or equal to ¼ and less than or equal to ½ of the maximum thickness of the insulator 280 in the semiconductor device.

The insulator 280 is provided over the insulator 272, and the opening is formed in a region where the insulator 250 and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

As for the insulator 280, the concentration of impurities such as water and hydrogen in the insulator 280 is preferably reduced. Oxide containing silicon such as silicon oxide, silicon oxynitride, or the like is used as appropriate for the insulator 280, for example.

The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. For the insulator 282, a metal oxide including an amorphous structure, for example, an insulator such as aluminum oxide can be used. The insulator 282, which has a function of capturing impurities such as hydrogen, is provided in contact with the insulator 280 in a region sandwiched between the insulator 212 and the insulator 283, whereby impurities such as hydrogen contained in the insulator 280 and the like can be captured and the amount of hydrogen in the region can be kept constant. It is particularly preferable to use aluminum oxide including an amorphous structure or amorphous aluminum oxide as the insulator 282 because hydrogen can be captured or fixed more effectively in some cases. Accordingly, the transistor 200 and a semiconductor device which have favorable characteristics and high reliability can be fabricated.

The insulator 283 functions as a barrier insulating film that inhibits impurities such as water and hydrogen from diffusing into the insulator 280 from above. The insulator 283 is positioned over the insulator 282. The insulator 283 is preferably formed using a nitride containing silicon such as silicon nitride or silicon nitride oxide. For example, silicon nitride deposited using a sputtering method is used for the insulator 283. When the insulator 283 is deposited by a sputtering method, a high-density silicon nitride film where a void or the like is unlikely to be formed can be obtained. To obtain the insulator 283, silicon nitride deposited by an ALD method may be stacked over silicon nitride deposited by a sputtering method. Such a structure is preferable because even when a defect such as a void is generated in silicon nitride deposited by a sputtering method, the void can be filled with silicon nitride deposited by an ALD method achieving good coverage, so that sealing capability can be increased.

The insulator 286 is provided over the insulator 283 and the insulator 274.

For the conductor 240a and the conductor 240b, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting passage of impurities such as water and hydrogen is preferably used for a conductor in contact with the insulator 286, the insulator 283, the insulator 282, the insulator 280, the insulator 272, and the insulator 271. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240a and the conductor 240b.

For the insulator 241a and the insulator 241b, for example, an insulator such as silicon nitride, aluminum oxide, or silicon nitride oxide may be used. Since the insulator 241a and the insulator 241b are provided in contact with the insulator 286, the insulator 283, the insulator 282, the insulator 280, the insulator 272, and the insulator 271, impurities such as water and hydrogen contained in the insulator 280 or the like can be inhibited from entering the oxide 230 through the conductor 240a and the conductor 240b. In particular, silicon nitride is suitable because of its high blocking property against hydrogen. Furthermore, oxygen contained in the insulator 280 can be prevented from being absorbed by the conductor 240a and the conductor 240b.

The conductor 246 (the conductor 246a and the conductor 246b) functioning as a wiring may be placed in contact with a top surface of the conductor 240a and a top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and the conductive material, for example. Note that the conductor may be formed to be embedded in an opening provided in an insulator.

<Constituent Materials of Semiconductor Device>

Constituent materials that can be used for the semiconductor device will be described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a nitride of a metal and a substrate including an oxide of a metal. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. For the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used for the oxide 230 of the present invention will be described below.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

<Classification of Crystal Structures>

First, the classification of crystal structures of an oxide semiconductor will be described with reference to FIG. 5A. FIG. 5A is a diagram showing the classification of crystal structures of an oxide semiconductor, typically IGZO (a metal oxide containing In, Ga, and Zn).

As shown in FIG. 5A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (cloud-aligned composite) (excluding single crystal and poly crystal). Note that "Crystalline" excludes single crystal, poly crystal, and completely amorphous. "Crystal" includes single crystal and poly crystal.

Note that the structures in the thick frame in FIG. 5A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 5B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 5B and obtained by GIXD measurement is hereinafter simply referred to as an XRD spectrum. The CAAC-IGZO film in FIG. 5B has a composition in the vicinity of In:Ga:Zn=4:2:3 [atomic ratio]. The CAAC-IGZO film in FIG. 5B has a thickness of 500 nm.

As shown in FIG. 5B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 5B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 5C shows a diffraction pattern of the CAAC-IGZO film. FIG. 5C shows a diffraction pattern obtained by the NBED method in which an electron beam is incident in the direction parallel to the substrate. The CAAC-IGZO film in FIG. 5C has a composition in the vicinity of In:Ga:Zn=4:2:3 [atomic ratio]. In the nanobeam electron diffraction method, electron diffraction is performed with a probe diameter of 1 nm.

As shown in FIG. 5C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 5A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2 may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration in an oxide semiconductor in the channel formation region is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region in the oxide semiconductor and the concentration of silicon or carbon at an interface, for example, between an insulator and the channel formation region in the oxide semiconductor and in the vicinity of the interface (the concentrations obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor in the channel formation region, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Thus, the concentration of nitrogen in the oxide semiconductor in the channel formation region, which is obtained by SIMS, is set lower than or equal to $5\times10^{19}$ atoms/cm$^3$, preferably lower than $5\times10^{19}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor in the channel formation region is preferably reduced as much as possible. Specifically, the hydrogen concentration in the oxide semiconductor in the channel formation region, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) can be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Manufacturing Method of Semiconductor Device>

Next, a method for manufacturing the semiconductor device that is one embodiment of the present invention and is illustrated in FIG. 3A to FIG. 3D is described with reference to FIG. 6A to FIG. 21D.

In FIG. 6A to FIG. 21D, A of each drawing is a top view. Moreover, B of each drawing is a cross-sectional view corresponding to a portion indicated by dashed-dotted line A1-A2 in A of each drawing, and is also a cross-sectional view in the channel length direction of the transistor 200. Furthermore, C of each drawing is a cross-sectional view corresponding to a portion indicated by dashed-dotted line A3-A4 in A of each drawing, and is also a cross-sectional view in the channel width direction of the transistor 200. Furthermore, D of each drawing is a cross-sectional view of a portion indicated by dashed-dotted line A5-A6 in A of each drawing, and is also a cross-sectional view of the opening region 400. Note that for clarity of the drawing, some components are not illustrated in the top view of A of each drawing.

Hereinafter, an insulating material for forming an insulator, a conductive material for forming a conductor, and an oxide material for forming an oxide can be deposited by a sputtering method, a CVD method, an MBE method, a PLD method, an ALD method, or the like as appropriate.

Examples of the sputtering method include an RF sputtering method in which a high-frequency power source is used as a sputtering power source, a DC sputtering method in which a DC power source is used, and a pulsed DC sputtering method in which a voltage is applied while being changed in a pulsed manner. An RF sputtering method is mainly used in the case where an insulating film is deposited, and a DC sputtering method is mainly used in the case where a metal conductive film is deposited. The pulsed DC sputtering method is mainly used in the case where a compound such as an oxide, a nitride, or a carbide is deposited by a reactive sputtering method.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma enhanced CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD (Plasma Enhanced ALD) method, in which a reactant excited by plasma is used, and the like can be used.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. The use of plasma in a PEALD method is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method and an ALD method, a film with a certain composition can be deposited depending on the flow rate ratio of the source gases. Moreover, for example, by a CVD method and an ALD method, a film whose composition is continuously changed can be deposited by changing the flow rate ratio of the source gases during the deposition. In the case where the film is deposited while the flow rate ratio of the source gases is changed, as compared to the case where the film is deposited using a plurality of deposition chambers, the time taken for the deposition can be shortened because the time taken for transfer and pressure adjustment is omitted. Thus, the productivity of the semiconductor device can be increased in some cases.

First, a substrate (not illustrated) is prepared, and the insulator 212 is deposited over the substrate (see FIG. 6A to FIG. 6D). The insulator 212 is preferably deposited by a sputtering method. Since hydrogen is not used as a deposition gas in the sputtering method, the hydrogen concentration in the insulator 212 can be reduced. Without limitation to a sputtering method, the insulator 212 may be deposited by a CVD method, an MBE method, a PLD method, an ALD method, or the like as appropriate.

In this embodiment, for the insulator 212, silicon nitride is deposited by a pulsed DC sputtering method using a silicon target in an atmosphere containing a nitrogen gas. The use of the pulsed DC sputtering method can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water and hydrogen are less likely to pass, such as silicon nitride, can inhibit diffusion of impurities such as water and hydrogen contained in a layer below the insulator 212. When an insulator through which copper is less likely to pass, such as silicon nitride, is used for the insulator 212, even in the case where a metal that is likely to diffuse, such as copper, is used for a conductor in a layer (not illustrated) below the insulator 212, diffusion of the metal into a layer above the insulator 212 through the insulator 212 can be inhibited.

Next, the insulator 214 is deposited over the insulator 212 (see FIG. 6A to FIG. 6D). The insulator 214 is preferably deposited by a sputtering method. Since hydrogen is not used as a deposition gas in the sputtering method, the hydrogen concentration in the insulator 214 can be reduced. Without limitation to a sputtering method, the insulator 214 may be deposited by a CVD method, an MBE method, a PLD method, an ALD method, or the like as appropriate.

In this embodiment, for the insulator 214, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality. Here, RF (Radio Frequency) power may be applied to the substrate. The amount of oxygen implanted to a layer below the insulator 214 can be controlled depending on the amount of the RF power applied to the substrate. The RF power is higher than 0 W/cm$^2$ and lower than or equal to 1.86 W/cm$^2$. In other words, the implantation amount of oxygen can be changed to be appropriate for the characteristics of the transistor, with the RF power used at the time of forming the insulator 214. Accordingly, an appropriate amount of oxygen for improving the reliability of the transistor can be implanted. The RF frequency is preferably 10 MHz or higher. The typical frequency is 13.56 MHz. The higher the RF frequency is, the less damage the substrate gets.

A metal oxide including an amorphous structure and an excellent function of capturing or fixing hydrogen, such as aluminum oxide, is preferably used for the insulator 214. Thus, the insulator 214 captures or fixes hydrogen contained in the insulator 216 and the like and prevents the hydrogen from diffusing into the oxide 230. It is particularly preferable to use aluminum oxide including an amorphous structure or amorphous aluminum oxide for the insulator 214 because hydrogen can be captured or fixed more effectively in some cases. Accordingly, the transistor 200 and a semiconductor device which have favorable characteristics and high reliability can be manufactured.

Next, the insulator 216 is deposited over the insulator 214 (see FIG. 6A to FIG. 6D). The insulator 216 is preferably deposited by a sputtering method. Since hydrogen is not used as a deposition gas in the sputtering method, the hydrogen concentration in the insulator 216 can be reduced. Without limitation to a sputtering method, the insulator 216 may be deposited by a CVD method, an MBE method, a PLD method, an ALD method, or the like as appropriate.

In this embodiment, for the insulator 216, silicon oxide is deposited by a pulsed DC sputtering method using a silicon target in an atmosphere containing an oxygen gas. The use of the pulsed DC sputtering method can achieve more uniform film thickness and improve the sputtering rate and film quality.

The insulator 212, the insulator 214, and the insulator 216 are preferably successively deposited without exposure to the air. For example, a multi-chamber deposition apparatus is used. As a result, the amounts of hydrogen in the deposited insulator 212, insulator 214, and insulator 216 can be reduced, and furthermore, entry of hydrogen in the films in intervals between deposition steps can be inhibited.

Then, an opening reaching the insulator 214 is formed in the insulator 216 (see FIG. 6A to FIG. 6D). Examples of the opening include a groove and a slit. A region where an opening is formed is referred to as an opening portion in some cases. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film 205A is deposited (see FIG. 6A to FIG. 6D). The conductive film 205A desirably includes a conductor having a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film 205A can be deposited by a sputtering method, a CVD method, an MBE method, a PLD method, an ALD method, or the like.

In this embodiment, titanium nitride is deposited for the conductor film 205A. When such a metal nitride is used for a layer under the conductor 205b, oxidation of the conductor 205b by the insulator 216 or the like can be inhibited. Furthermore, even when a metal that is likely to diffuse, such as copper, is used for the conductor 205b, the metal can be prevented from diffusing from the conductor 205a to the outside.

Next, a conductive film 205B is deposited (see FIG. 6A to FIG. 6D). Tantalum, tungsten, titanium, molybdenum, aluminum, copper, a molybdenum-tungsten alloy, or the like can be used for the conductive film 205B. The conductive film can be deposited by a plating method, a sputtering method, a CVD method, an MBE method, a PLD method, an ALD method, or the like. In this embodiment, tungsten is deposited for the conductive film 205B.

Next, by performing CMP treatment, the conductive film 205A and the conductive film 205B are partly removed and the insulator 216 is exposed (see FIG. 7A to FIG. 7D). As a result, the conductor 205a and the conductor 205b remain only in the opening portion. Note that the insulator 216 is partly removed by the CMP treatment in some cases.

Next, an upper portion of the conductor 205b is removed by etching (see FIG. 8A to FIG. 8D). This makes the level of the top surface of the conductor 205b lower than the levels of the top surface of the conductor 205a and the top surface of the insulator 216. Dry etching or wet etching can be used for the etching of the conductor 205b, and dry etching is preferably used for microfabrication.

Next, a conductive film 205C is deposited over the insulator 216, the conductor 205a, and the conductor 205b (see FIG. 9A to FIG. 9D). Like the conductive film 205A, the conductive film 205C desirably includes a conductor having a function of inhibiting passage of oxygen.

In this embodiment, titanium nitride is deposited for the conductive film 205C. When such a metal nitride is used for a layer over the conductor 205b, oxidation of the conductor 205b by the insulator 222 or the like can be inhibited. Furthermore, even when a metal that is likely to diffuse, such as copper, is used for the conductor 205b, the metal can be prevented from diffusing from the conductor 205c to the outside.

Next, by performing CMP treatment, the conductive film 205C is partly removed and the insulator 216 is exposed (see FIG. 10A to FIG. 10D). As a result, the conductor 205a, the conductor 205b, and the conductor 205c remain only in the opening portion. In this way, the conductor 205 with a flat top surface can be formed. Furthermore, the conductor 205b is surrounded by the conductor 205a and the conductor 205c. Thus, impurities such as hydrogen can be prevented from diffusing from the conductor 205b to the outside of the conductor 205a and the conductor 205c, and the conductor 205b can be prevented from being oxidized by entry of oxygen from the outside of the conductor 205a and the conductor 205c. Note that the insulator 216 is partly removed by the CMP treatment in some cases.

Next, the insulator 222 is deposited over the insulator 216 and the conductor 205 (see FIG. 11A to FIG. 11D). An insulator containing an oxide of one or both of aluminum and hafnium is preferably deposited for the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like. In this embodiment, for the insulator 222, hafnium oxide is deposited by an ALD method.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the insulator 222 and the like as much as possible.

In this embodiment, as the heat treatment, treatment at 400° C. for one hour is performed with a flow rate ratio of a nitrogen gas and an oxygen gas of 4:1 after the deposition of the insulator 222. By the heat treatment, impurities such as water and hydrogen contained in the insulator 222 can be removed, for example. In the case where an oxide containing hafnium is used for the insulator 222, the insulator 222 is partly crystallized by the heat treatment in some cases. The heat treatment can also be performed after the deposition of the insulator 224, for example.

Next, the insulator 224 is deposited over the insulator 222 (see FIG. 11A to FIG. 11D). The insulator 224 can be deposited by a sputtering method, a CVD method, an MBE method, a PLD method, an ALD method, or the like. In this embodiment, for the insulator 224, silicon oxide is deposited by a sputtering method. Since hydrogen is not used as a deposition gas in the sputtering method, the hydrogen concentration in the insulator 224 can be reduced. The hydrogen concentration in the insulator 224 is preferably reduced because the insulator 224 is in contact with the oxide 230a in a later step.

Next, an oxide film 230A and an oxide film 230B are deposited in this order over the insulator 224 (see FIG. 11A to FIG. 11D). Note that it is preferable to deposit the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is being heated, the crystallinity of the oxide film can be improved.

In this embodiment, the oxide film 230A is deposited by a sputtering method using an oxide target with In:Ga:Zn=1:3:4 [atomic ratio]. In addition, the oxide film 230B is deposited by a sputtering method using an oxide target with In:Ga:Zn=4:2:4.1 [atomic ratio]. Note that each of the oxide films is preferably formed to have characteristics required for the oxide 230a and the oxide 230b by selecting the deposition conditions and the atomic ratios as appropriate.

Next, an oxide film 243A is deposited over the oxide film 230B (see FIG. 11A to FIG. 11D). The oxide film 243A can be deposited by a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is deposited by a sputtering method using an oxide target with In:Ga:Zn=1:3:4 [atomic ratio].

Note that the insulator 222, the insulator 224, the oxide film 230A, the oxide film 230B, and the oxide film 243A are preferably deposited by a sputtering method without exposure to the air. For example, a multi-chamber deposition apparatus is used. As a result, the amounts of hydrogen in the deposited insulator 222, insulator 224, oxide film 230A, oxide film 230B, and oxide film 243A can be reduced, and furthermore, entry of hydrogen in the films in intervals between deposition steps can be inhibited.

Next, heat treatment is preferably performed. The heat treatment is performed in a temperature range where the oxide film 230A, the oxide film 230B, and the oxide film 243A do not become polycrystals, i.e., at a temperature higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent entry of moisture or the like into the oxide film 230A, the oxide film 230B, the oxide film 243A, and the like as much as possible.

In this embodiment, the heat treatment is performed in such a manner that treatment is performed at 400° C. in a nitrogen atmosphere for one hour and then another treatment is successively performed at 400° C. in an oxygen atmosphere for one hour. By the heat treatment, impurities such as water and hydrogen in the oxide film 230A, the oxide film 230B, and the oxide film 243A can be removed, for example. Furthermore, the heat treatment improves the crystallinity of the oxide film 230B, thereby offering a dense structure with higher density. Thus, diffusion of oxygen or impurities in the oxide film 230B can be reduced.

Next, a conductive film 242A is deposited over the oxide film 243A (see FIG. 11A to FIG. 11D). The conductive film 242A can be deposited by a sputtering method, a CVD method, an MBE method, a PLD method, an ALD method, or the like. For example, for the conductive film 242A, tantalum nitride is deposited by a sputtering method. Note that heat treatment may be performed before the deposition of the conductive film 242A. This heat treatment may be performed under reduced pressure, and the conductive film 242A may be successively deposited without exposure to the air. The treatment can remove moisture and hydrogen adsorbed onto the surface of the oxide film 243A and the like, and further can reduce the moisture concentration and the hydrogen concentration in the oxide film 230A, the oxide film 230B, and the oxide film 243A. The heat treatment is preferably performed at a temperature higher than or equal to 100° C. and lower than or equal to 400° C. In this embodiment, the heat treatment is performed at 200° C.

Next, an insulating film 271A is deposited over the conductive film 242A (see FIG. 11A to FIG. 11D). The insulating film 271A can be deposited by a sputtering method, a CVD method, an MBE method, a PLD method, an ALD method, or the like. As the insulating film 271A, an insulating film having a function of inhibiting passage of oxygen is preferably used. For example, for the insulating film 271A, aluminum oxide or silicon nitride may be deposited by a sputtering method.

In this embodiment, for the insulating film 271A, aluminum oxide is deposited by a pulsed DC sputtering method using an aluminum target in an atmosphere containing an oxygen gas. The RF power applied to the substrate is lower than or equal to 0.62 W/cm$^2$, preferably higher than or equal to 0 W/cm$^2$ and lower than or equal to 0.31 W/cm$^2$. With low RF power, the amount of oxygen implanted to the conductive film 242A can be reduced and oxidation of the conductive film 242A can be prevented.

Note that the conductive film 242A and the insulating film 271A are preferably deposited by a sputtering method without exposure to the air. For example, a multi-chamber deposition apparatus is used. As a result, the amounts of hydrogen in the deposited conductive film 242A and insulating film 271A can be reduced, and furthermore, entry of hydrogen in the films in intervals between deposition steps can be inhibited. In the case where a hard mask is provided over the insulating film 271A, a film to be the hard mask is preferably successively deposited without exposure to the air.

Next, the oxide film 230A, the oxide film 230B, the oxide film 243A, the conductive film 242A, and the insulating film 271A are processed to have an island shape by a lithography method to form the oxide 230a, the oxide 230b, an oxide layer 243B, a conductive layer 242B, and an insulating layer 271B (see FIG. 12A to FIG. 12D). A dry etching method or a wet etching method can be used for the processing. Processing by a dry etching method is suitable for microfabrication. The oxide film 230A, the oxide film 230B, the oxide film 243A, the conductive film 242A, and the insulating layer 271B may be processed under different conditions. In this step, the insulator 224 is processed into an island shape so as to overlap with the oxide 230a.

Note that in the lithography method, first, a resist is exposed to light through a mask. Next, a region exposed to light is removed or left using a developing solution, so that a resist mask is formed. Then, etching process through the resist mask is conducted, whereby a conductor, a semiconductor, an insulator, or the like can be processed into a desired shape. The resist mask is formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching process such as ashing, wet etching process, wet etching process after dry etching process, or dry etching process after wet etching process.

In addition, a hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps. In this embodiment, the insulating layer 271B is used as a hard mask. In the case where the insulating layer 271B is used as a hard mask, it is preferable to adjust the thickness of the insulating layer 271B as appropriate in order to prevent the insulating layer 271B from disappearing during the etching of the conductive film 242A or the like.

Here, the insulating layer 271B functions as a mask for the conductive layer 242B; thus, as illustrated in FIG. 12B and FIG. 12C, the conductive layer 242B does not have a curved surface between the side surface and the top surface. Thus, end portions at the intersections of the side surfaces and the top surfaces of the conductor 242a and the conductor 242b illustrated in FIG. 3B are angular. The cross-sectional area of the conductor 242 is larger in the case where the end portion at the intersection of the side surface and the top surface of the conductor 242 is angular than in the case where the end portion is rounded. Accordingly, the resistance of the conductor 242 is reduced, so that the on-state current of the transistor 200 can be increased.

Here, the insulator 224, the oxide 230a, the oxide 230b, the oxide layer 243B, the conductive layer 242B, and the insulating layer 271B are formed to at least partly overlap with the conductor 205. It is preferable that the side surfaces of the insulator 224, the oxide 230a, the oxide 230b, the oxide layer 243B, the conductive layer 242B, and the insulating layer 271B be substantially perpendicular to the top surface of the insulator 222. When the side surfaces of the insulator 224, the oxide 230a, the oxide 230b, the oxide layer 243B, the conductive layer 242B, and the insulating layer 271B are substantially perpendicular to the top surface of the insulator 222, a plurality of transistors 200 can be provided in a smaller area and at a higher density. Alternatively, a structure may be employed in which an angle formed by the side surfaces of the insulator 224, the oxide 230a, the oxide 230b, the oxide layer 243B, the conductive layer 242B, and the insulating layer 271B and the top surface of the insulator 222 is an angle less than 90°. In that case, the angle formed by the side surfaces of the insulator 224, the oxide 230a, the oxide 230b, the oxide layer 243B, the conductive layer 242B, and the insulating layer 271B and the top surface of the insulator 222 is preferably greater than or equal to 60° and less than 70°. With such a shape, in later steps, the coverage with the insulator 272 and the like can be improved, so that defects such as a void can be reduced.

A by-product generated in the etching process is sometimes formed in a layered manner on the side surfaces of the insulator 224, the oxide 230a, the oxide 230b, the oxide layer 243B, the conductive layer 242B, and the insulating layer 271B. In that case, the layered by-product is formed between the insulator 272 and the insulator 224, the oxide 230a, the oxide 230b, the oxide 243, the conductor 242, and the insulator 271. When the manufacturing process of the transistor 200 proceeds in a state where the layered by-product is formed, the reliability of the transistor 200 might decrease. Hence, the layered by-product is preferably removed.

Next, the insulator 272 is deposited over the insulator 222, the insulator 224, the oxide 230a, the oxide 230b, the oxide layer 243B, the conductive layer 242B, and the insulating layer 271B (see FIG. 13A to FIG. 13D). The insulator 272 can be deposited by a sputtering method, a CVD method, an MBE method, a PLD method, an ALD method, or the like. In this embodiment, for the insulator 272, aluminum oxide is deposited by a pulsed DC sputtering method using an aluminum target in an atmosphere containing an oxygen gas. The RF power applied to the substrate is lower than or equal to 0.62 W/cm², preferably higher than or equal to 0 W/cm² and lower than or equal to 0.31 W/cm². With low RF power, the amount of oxygen implanted to the insulator 224 can be reduced. The insulator 272 is in close contact with part of the top surface of the insulator 222.

Note that the insulator 272 may have a stacked-layer structure. For example, aluminum oxide may be deposited by a sputtering method and silicon nitride may be deposited over the aluminum oxide by a sputtering method. When the insulator 272 has such a multilayer structure, the function of inhibiting diffusion of impurities such as water and hydrogen and oxygen is improved in some cases.

In this manner, the oxide 230a, the oxide 230b, the oxide layer 243B, and the conductive layer 242B can be covered with the insulator 272 and the insulating layer 271B, which have a function of inhibiting diffusion of oxygen. This can inhibit diffusion of oxygen into the oxide 230a, the oxide 230b, the oxide layer 243B, and the conductive layer 242B in a later step.

Next, an insulating film to be the insulator 280 is deposited over the insulator 272. The insulating film can be deposited by a sputtering method, a CVD method, an MBE method, a PLD method, an ALD method, or the like. A silicon oxide film is deposited by a sputtering method as the insulating film, for example. When the insulating film to be the insulator 280 is deposited by a sputtering method in an atmosphere containing oxygen, the insulator 280 containing excess oxygen can be formed. Since hydrogen is not used as a deposition gas in the sputtering method, the concentration of hydrogen in the insulator 280 can be reduced. Note that heat treatment may be performed before the insulating film is deposited. The heat treatment may be performed under reduced pressure, and the insulating film may be successively deposited without exposure to the air. The treatment can remove moisture and hydrogen adsorbed onto a surface of the insulator 272 and the like, and further can reduce the moisture concentration and the hydrogen concentration in the oxide 230a, the oxide 230b, the oxide layer 243B, and the insulator 224. For the heat treatment, the above heat treatment conditions can be used.

Next, the insulating film to be the insulator 280 is subjected to CMP treatment, so that the insulator 280 with a flat top surface is formed (see FIG. 13A to FIG. 13D). Note that, for example, silicon nitride may be deposited over the insulator 280 by a sputtering method and CMP treatment may be performed on the silicon nitride until the insulator 280 is reached.

Then, part of the insulator 280, part of the insulator 272, part of the insulating layer 271B, part of the conductive layer 242B, and part of the oxide layer 243B are processed to form an opening reaching the oxide 230b. The opening is preferably formed to overlap with the conductor 205. The insulator 271a, the insulator 271b, the conductor 242a, the conductor 242b, the oxide 243a, and the oxide 243b are formed through the formation of the opening (see FIG. 14A to FIG. 14D).

An upper portion of the oxide 230b is sometimes removed when the opening is formed. When part of the oxide 230b is removed, a groove portion is formed in the oxide 230b. The groove portion may be formed in the same step as the formation of the opening or in a step different from the formation of the opening in accordance with the depth of the groove portion.

The part of the insulator 280, the part of the insulator 272, the part of the insulating layer 271B, the part of the conductive layer 242B, and the part of the oxide layer 243B can be processed by a dry etching method or a wet etching method. Processing by a dry etching method is suitable for microfabrication. The processing may be performed under different conditions. For example, the part of the insulator 280 may be processed by a dry etching method, the part of the insulator 272 and the part of the insulating layer 271B may be processed by a wet etching method, and the part of the conductive layer 242B and the part of the oxide layer 243B may be processed by a dry etching method. The part of the conductive layer 242B and the part of the oxide layer 243B may be processed under different conditions.

Here, in some cases, impurities are attached to or diffused into a side surface of the oxide 230a, the top and side surface of the oxide 230b, the side surface of the conductor 242, the side surface of the insulator 280, and the like. A step of removing the impurities may be performed. A damaged region is formed on a surface of the oxide 230b by the dry etching in some cases. Such a damaged region may be removed. The impurities come from components contained in the insulator 280, the insulator 272, part of the insulating layer 271B, and the conductive layer 242B; components contained in a member of an apparatus used to form the opening; and components contained in a gas or a liquid used for etching, for instance. Examples of the impurities include hafnium, aluminum, silicon, tantalum, fluorine, and chlorine.

In particular, impurities such as aluminum and silicon block the oxide 230b from becoming a CAAC-OS. It is thus preferable to reduce or remove impurity elements such as aluminum and silicon, which block the oxide from becoming a CAAC-OS. For example, the concentration of aluminum atoms in the oxide 230b and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that in a metal oxide, a region that is hindered from becoming a CAAC-OS by impurities such as aluminum and silicon and becomes an amorphous-like oxide semiconductor (a-like OS) is referred to as a non-CAAC region in some cases. In the non-CAAC region, the density of the crystal structure is reduced to increase $V_O H$; thus, the transistor is likely to be normally on. Hence, the non-CAAC region in the oxide 230b is preferably reduced or removed.

In contrast, the oxide 230b preferably has a layered CAAC structure. In particular, the CAAC structure preferably reaches a lower edge portion of a drain in the oxide 230b. Here, in the transistor 200, the conductor 242a or the conductor 242b, and its vicinity function as a drain. In other words, the oxide 230b in the vicinity of the lower edge portion of the conductor 242a (conductor 242b) preferably has a CAAC structure. In this manner, the damaged region of the oxide 230b is removed and the CAAC structure is formed in the edge portion of the drain, which significantly affects the drain withstand voltage, so that variation of the electrical characteristics of the transistor 200 can be further suppressed. The reliability of the transistor 200 can be improved.

In order to remove the above impurities and the like, cleaning treatment is performed. Examples of the cleaning method include wet cleaning using a cleaning solution and the like, plasma treatment using plasma, and cleaning by heat treatment, and any of these cleanings may be performed in appropriate combination. The cleaning treatment sometimes makes the groove portion deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted hydrofluoric acid is performed, and then, wet cleaning using pure water or carbonated water is performed. The cleaning treatment can remove impurities that are attached onto the surfaces of the oxide 230a, the oxide 230b, and the like or diffused into the oxide 230a, the oxide 230b, and the like. The crystallinity of the oxide 230b can be increased.

After the etching or the cleaning treatment, heat treatment may be performed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce the amount of oxygen vacancies $V_O$. In addition, the crystallinity of the oxide 230b can be improved by the heat treatment. The heat treatment may be performed under reduced pressure. Alternatively, heat treatment may be performed in an oxygen atmosphere, and then heat treatment may be successively performed in a nitrogen atmosphere without exposure to the air.

Next, an insulating film 250A to be the insulator 250a is deposited (see FIG. 15A to FIG. 15D). Heat treatment may be performed before the formation of the insulating film 250A; the heat treatment may be performed under reduced pressure, and the insulating film 250A may be formed successively without exposure to the air. The heat treatment is preferably performed in an atmosphere containing oxygen. Such treatment can remove moisture and hydrogen adsorbed onto the surface of the oxide 230b and the like, and further can reduce the moisture concentration and the hydrogen concentration in the oxide 230a and the oxide 230b. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. The insulating film 250A is preferably deposited by a deposition method using a gas in which hydrogen atoms are reduced or removed. This can reduce the hydrogen concentration in the insulating film 250A. The hydrogen concentration in the insulating film 250A is preferably reduced because the insulating film 250A becomes the insulator 250 that is in contact with the oxide 230b in a later step.

Figure 15A:
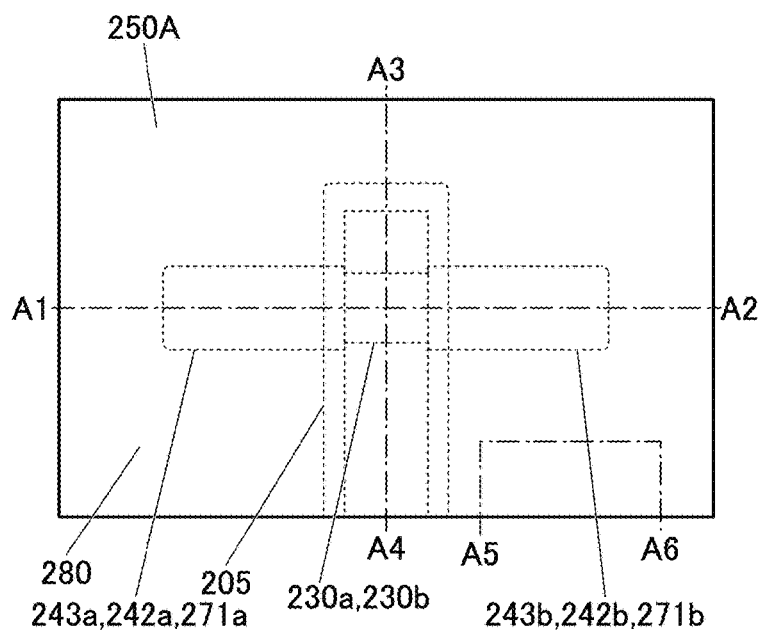
FIG. 15A is a top view illustrating the method for manufacturing the semiconductor device of one embodiment of the present invention.
Figure 15C:
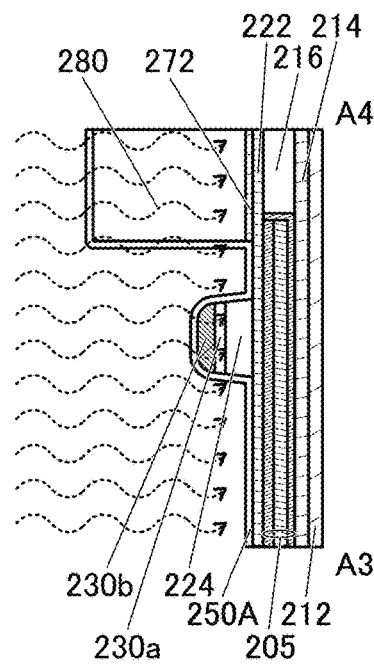
FIG. 15B to FIG. 15D are cross-sectional views illustrating the method for manufacturing the semiconductor device of one embodiment of the present invention.
Figure 15B:
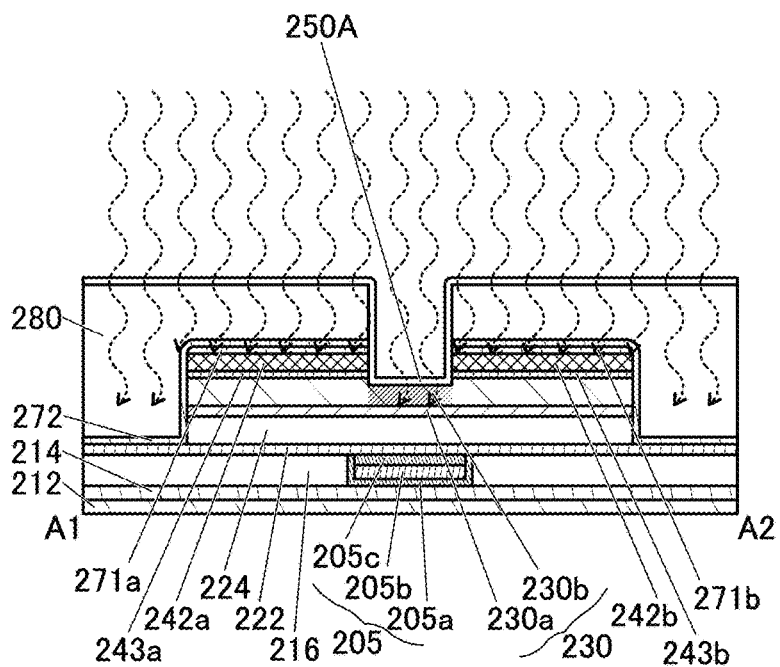

The insulating film 250A is preferably deposited by an ALD method. The thickness of the insulator 250, which functions as a gate insulating film of the miniaturized transistor 200, needs to be extremely small (e.g., approximately 5 nm to 30 nm) and have a small variation. In contrast, an ALD method is a deposition method in which a precursor and a reactant (oxidizer) are alternately introduced, and the film thickness can be adjusted with the number of repetition times of the sequence of the gas introduction; thus, accurate control of the film thickness is possible. Thus, the accuracy of the gate insulating film required by the miniaturized transistor 200 can be achieved. Furthermore, as illustrated in FIG. 15B and FIG. 15C, the insulating film 250A needs to be deposited on the bottom surface and the side surface of the opening formed in the insulator 280 and the like so as to have good coverage. One atomic layer can be deposited at a time on the bottom surface and the side surface of the opening, whereby the insulating film 250A can be deposited in the opening with good coverage.

For example, in the case where the insulating film 250A is deposited by a PECVD method, the deposition gas containing hydrogen is decomposed in plasma to generate a large amount of hydrogen radicals. Oxygen in the oxide 230b is extracted by reduction reaction of hydrogen radicals to form $V_OH$, so that the hydrogen concentration in the oxide 230b increases. In contrast, when the insulating film 250A is deposited by an ALD method, the generation of hydrogen radicals can be inhibited at the introduction of a precursor and the introduction of a reactant. Thus, the use of the ALD method for depositing the insulating film 250A can prevent an increase in the hydrogen concentration in the oxide 230b.

In the case where the above impurities are not removed before the deposition of the insulating film 250A, the impurities remain between the insulator 250a and the oxide 230a, the oxide 230b, the conductor 242, the insulator 280, and the like in some cases.

Next, microwave treatment may be performed in an atmosphere containing oxygen (see FIG. 15A to FIG. 15D). Here, dotted lines in FIG. 15B to FIG. 15D indicate microwaves, high-frequency waves such as RF, oxygen plasma, oxygen radicals, or the like. For the microwave treatment, a microwave treatment apparatus including a power source for generating high-density plasma using a microwave is preferably used, for example. The microwave treatment apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the oxide 230b. The microwave treatment is preferably performed under reduced pressure, and the pressure is set to 60 Pa or higher, preferably 133 Pa or higher, further preferably 200 Pa or higher, still further preferably 400 Pa or higher, and 700 Pa or lower. Furthermore, the oxygen flow rate ratio ($O_2/O_2$+Ar) is lower than or equal to 50%, preferably higher than or equal to 10% and lower than or equal to 30%. The treatment temperature is lower than or equal to 750° C., preferably lower than or equal to 500° C., and is approximately 400° C., for example. Heat treatment may be successively performed without exposure to the air after the oxygen plasma treatment.

Figure 15D:
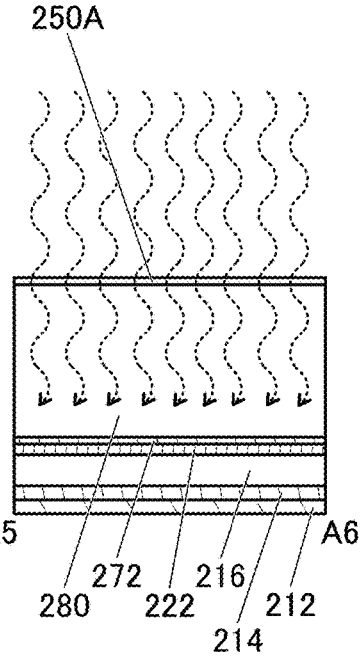
Figure 16A:
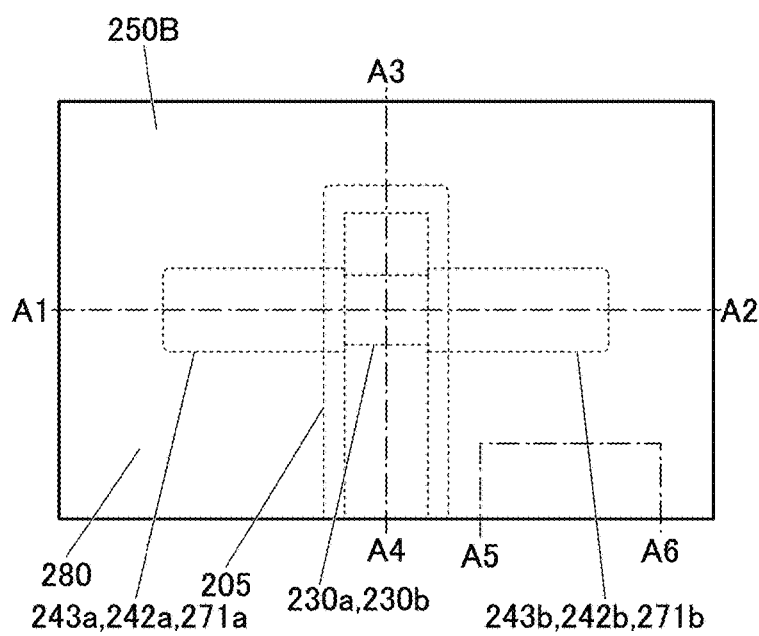
FIG. 16A is a top view illustrating the method for manufacturing the semiconductor device of one embodiment of the present invention.
Figure 16C:
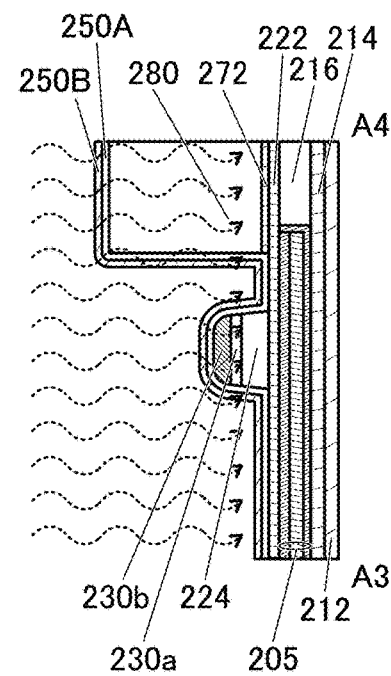
FIG. 16B to FIG. 16D are cross-sectional views illustrating the method for manufacturing the semiconductor device of one embodiment of the present invention.
Figure 16B:
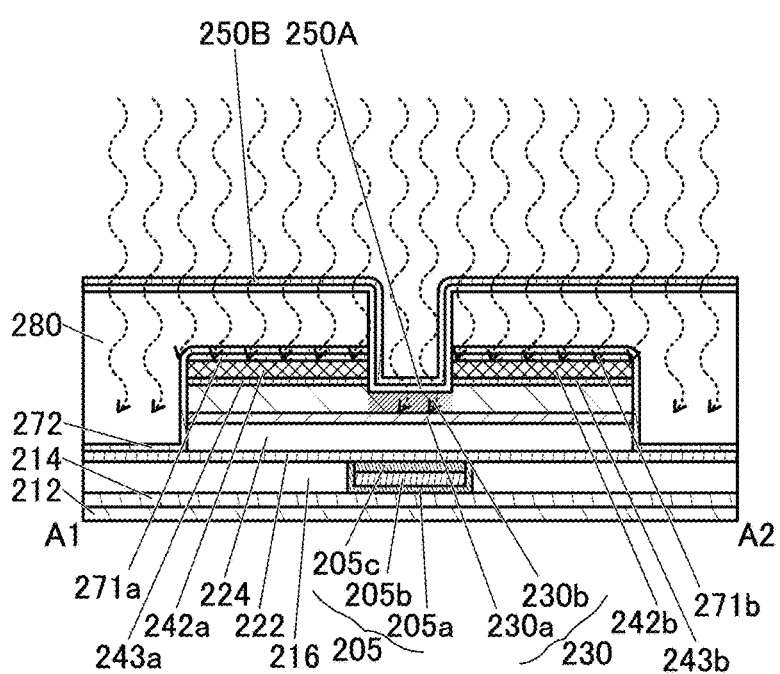
Figure 16D:
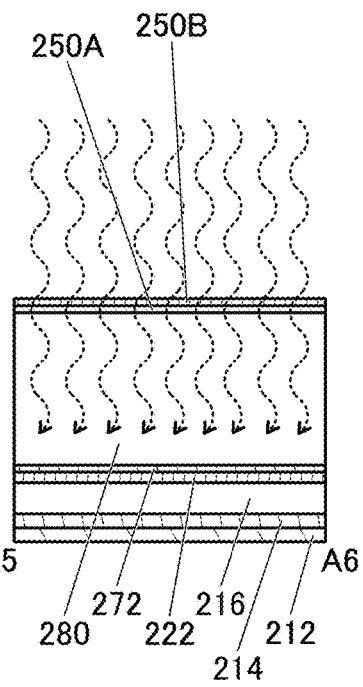
Figure 18A:
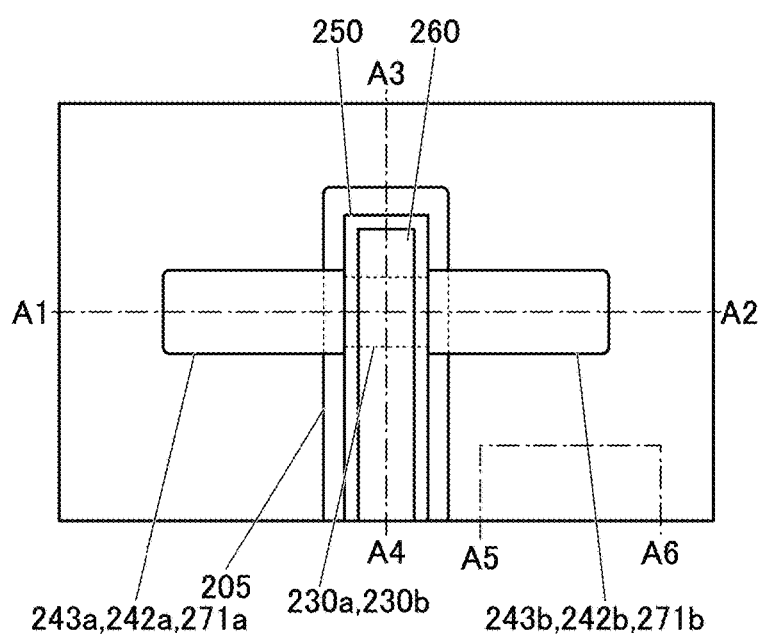
FIG. 18A is a top view illustrating the method for manufacturing the semiconductor device of one embodiment of the present invention.
Figure 18C:
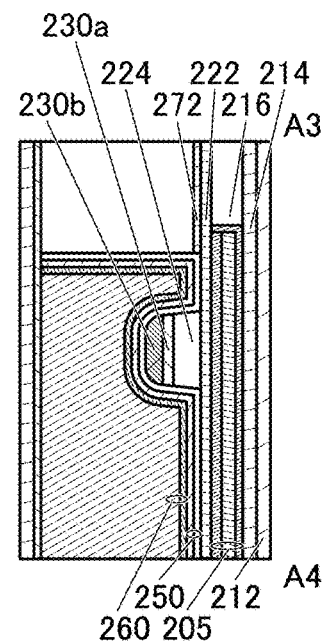
FIG. 18B to FIG. 18D are cross-sectional views illustrating the method for manufacturing the semiconductor device of one embodiment of the present invention.
Figure 18B:
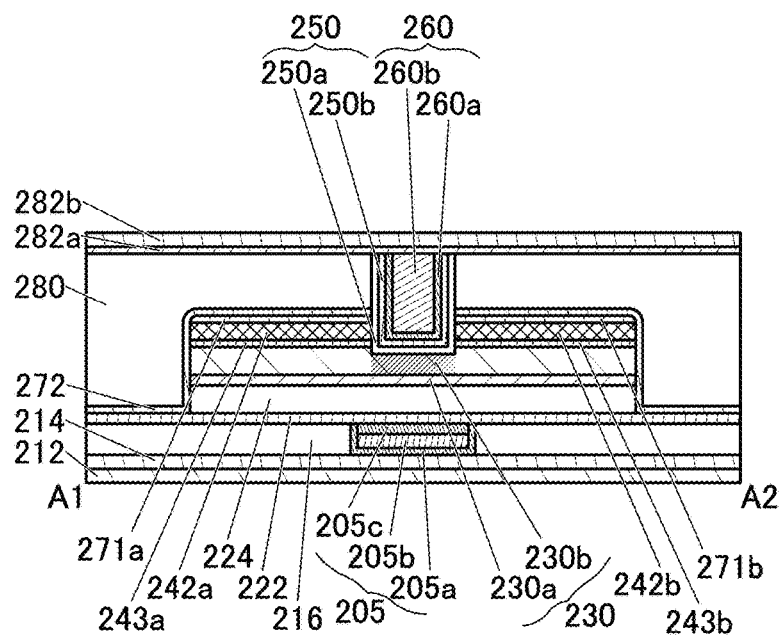
Figure 18D:
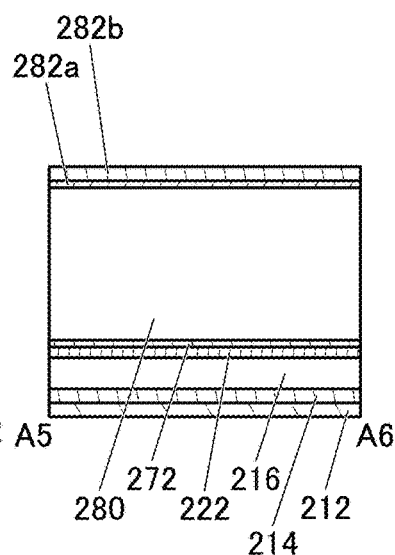

As illustrated in FIG. 15B to FIG. 15D, the microwave treatment in an atmosphere containing oxygen can convert an oxygen gas into plasma using a high-frequency wave such as the microwave or RF, and apply the oxygen plasma to a region of the oxide 230b that is between the conductor 242a and the conductor 242b. At this time, the region 230bc can also be irradiated with the high-frequency wave such as the microwave or RF. In other words, the microwave, the high-frequency wave such as RF, the oxygen plasma, or the like can be applied to the region 230bc in FIG. 4. The effect of the plasma, the microwave, or the like enables $V_OH$ in the region 230bc to be cut, and hydrogen H to be removed from the region 230bc. That is, the reaction "$V_OH \rightarrow H+V_O$" occurs in the region 230bc, so that the concentration of hydrogen in the region 230bc can be reduced. As a result, oxygen vacancies and $V_OH$ in the region 230bc can be reduced to lower the carrier concentration. In addition, oxygen radicals generated by the oxygen plasma or oxygen contained in the insulator 250 can be supplied to oxygen vacancies formed in the region 230bc, thereby further reducing oxygen vacancies and lowering the carrier concentration in the region 230bc.

In contrast, the conductor 242a and the conductor 242b are provided over the region 230ba and the region 230bb illustrated in FIG. 4. As illustrated in FIG. 15B to FIG. 15D, the effect of the microwave, the high-frequency wave such as RF, the oxygen plasma, or the like is blocked by the conductor 242a and the conductor 242b, and thus does not reach the region 230ba and the region 230bb. Hence, a reduction in $V_OH$ and supply of an excess amount of oxygen due to the microwave treatment do not occur in the region 230ba and the region 230bb, preventing a decrease in carrier concentration.

In the above manner, oxygen vacancies and $V_OH$ can be selectively removed from the region 230bc in the oxide semiconductor, whereby the region 230bc can be an i-type or substantially i-type region. Furthermore, supply of an excess amount of oxygen to the region 230ba and the region 230bb functioning as the source region and the drain region can be inhibited and the n-type regions can be maintained. As a result, change in the electrical characteristics of the transistor 200 can be inhibited, and thus variation in the electrical characteristics of the transistors 200 in the substrate plane can be inhibited.

Thus, a semiconductor device with little variation in transistor characteristics can be provided. A semiconductor device having favorable reliability can be provided. A semiconductor device having favorable electrical characteristics can be provided.

Next, an insulating film 250B to be the insulator 250b is deposited (see FIG. 16A to FIG. 16D). The insulating film 250B can be deposited by a sputtering method, a CVD method, an MBE method, a PLD method, an ALD method, or the like. The insulating film 250B is preferably formed using an insulator having a function of inhibiting diffusion of oxygen. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, the insulating film 250A can be formed using the above-described material that can be used for the insulator 250, and the insulating film 250B can be formed using a material similar to that for the insulator 222.

Specifically, for the insulating film 250B, a metal oxide containing one kind or two or more kinds selected from hafnium, aluminum, gallium, yttrium, zirconium, tungsten, titanium, tantalum, nickel, germanium, magnesium, and the like, or a metal oxide that can be used for the oxide 230 can be used. In particular, an insulator including an oxide of one or both of aluminum and hafnium is preferably used.

In this embodiment, silicon oxynitride is deposited for the insulating film 250A by a CVD method, and hafnium oxide is deposited for the insulating film 250B by a thermal ALD method.

After the insulating film 250B is deposited, microwave treatment may be performed. For the microwave treatment, the conditions for the microwave treatment performed after the deposition of the insulating film 250A may be used. Alternatively, microwave treatment may be performed after the deposition of the insulating film 250B without performing microwave treatment after the deposition of the insulating film 250A.

Heat treatment with the reduced pressure being maintained may be performed after each of microwave treatment after the deposition of the insulating film 250A and microwave treatment after the deposition of the insulating film 250B. Such treatment enables hydrogen in the insulating film 250A, the insulating film 250B, the oxide 230b, and the oxide 230a to be removed efficiently. Part of hydrogen is gettered by the conductor 242 (the conductor 242a and the conductor 242b) in some cases. Alternatively, the step of performing microwave treatment and then performing heat treatment with the reduced pressure being maintained may be repeated a plurality of cycles. The repetition of the heat treatment enables hydrogen in the insulating film 250A, the oxide 230b, and the oxide 230a to be removed more efficiently. Note that the temperature of the heat treatment is preferably higher than or equal to 300° C. and lower than or equal to 500° C.

Furthermore, the microwave treatment improves the film quality of the insulating film 250A and the insulating film 250B, thereby inhibiting diffusion of hydrogen, water, impurities, and the like. Accordingly, hydrogen, water, impurities, and the like can be inhibited from diffusing into the oxide 230b, the oxide 230a, and the like through the insulator 250 in a later step such as deposition of a conductive film to be the conductor 260 or later treatment such as heat treatment.

Next, a conductive film to be the conductor 260a and a conductive film to be the conductor 260b are deposited in this order. The conductive film to be the conductor 260a and the conductive film to be the conductor 260b can be deposited by a sputtering method, a CVD method, an MBE method, a PLD method, an ALD method, or the like. In this embodiment, the conductive film to be the conductor 260a is deposited by an ALD method, and the conductive film to be the conductor 260b is deposited by a CVD method.

Then, the insulating film 250A, the insulating film 250B, the conductive film to be the conductor 260a, and the conductive film to be the conductor 260b are polished by CMP treatment until the insulator 280 is exposed, whereby the insulator 250a, the insulator 250b, and the conductor 260 (the conductor 260a and the conductor 260b) are formed (see FIG. 17A to FIG. 17D). Accordingly, the insulator 250 is placed to cover the inner wall (the side wall and the bottom surface) of the opening reaching the oxide 230b and the groove portion of the oxide 230b. The conductor 260 is placed to fill the opening and the groove portion with the insulator 250 therebetween.

Then, heat treatment may be performed under conditions similar to those of the above heat treatment. In this embodiment, treatment is performed at 400° C. in a nitrogen atmosphere for one hour. The heat treatment can reduce the moisture concentration and the hydrogen concentration in the insulator 250 and the insulator 280. After the heat treatment, the deposition of the insulator 282 may be performed successively without exposure to the air.

Next, the insulator 282a and the insulator 282b are successively formed over the insulator 250, the conductor 260, and the insulator 280 (see FIG. 18A to FIG. 18D). The insulator 282a and the insulator 282b can be deposited by a sputtering method, a CVD method, an MBE method, a PLD method, an ALD method, or the like. The insulator 282a and the insulator 282b are preferably deposited by a sputtering method. Since hydrogen is not used as a deposition gas in the sputtering method, the hydrogen concentrations in the insulator 282a and the insulator 282b can be reduced.

In this embodiment, for the insulator 282a and the insulator 282b, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality. The RF power applied to the substrate is lower than or equal to 1.86 W/cm$^2$, preferably higher than or equal to 0 W/cm$^2$ and lower than or equal to 0.31 W/cm$^2$. With low RF power, the amount of oxygen implanted to the insulator 280 can be reduced. In this embodiment, the insulator 282a is deposited with the RF power applied to the substrate of 0 W/cm$^2$, and the insulator 282b is deposited with the RF power applied to the substrate of 0.31 W/cm$^2$.

Figure 19A:
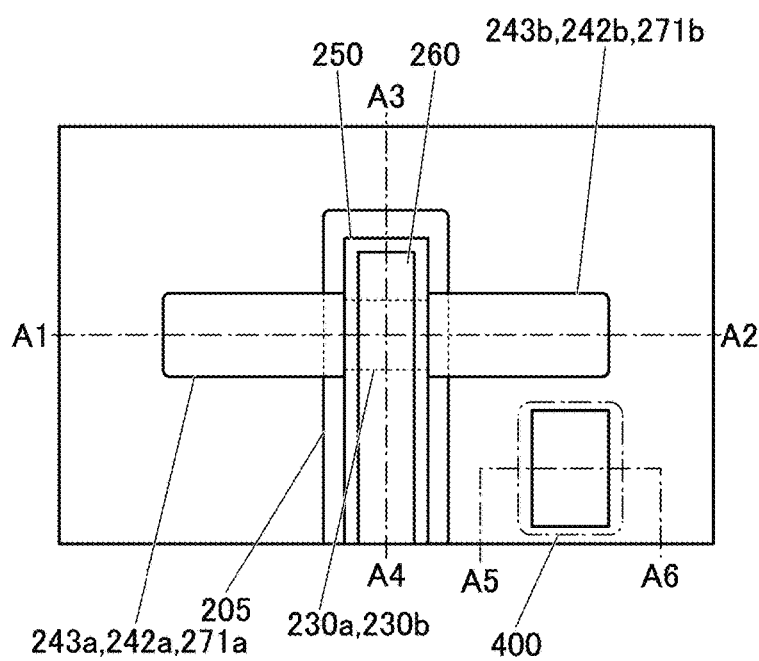
FIG. 19A is a top view illustrating the method for manufacturing the semiconductor device of one embodiment of the present invention.
Figure 19C:
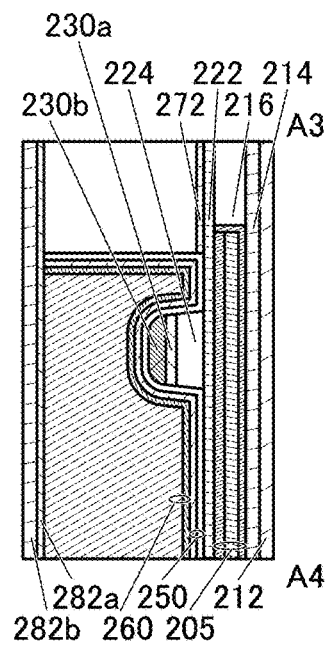
FIG. 19B to FIG. 19D are cross-sectional views illustrating the method for manufacturing the semiconductor device of one embodiment of the present invention.
Figure 19B:
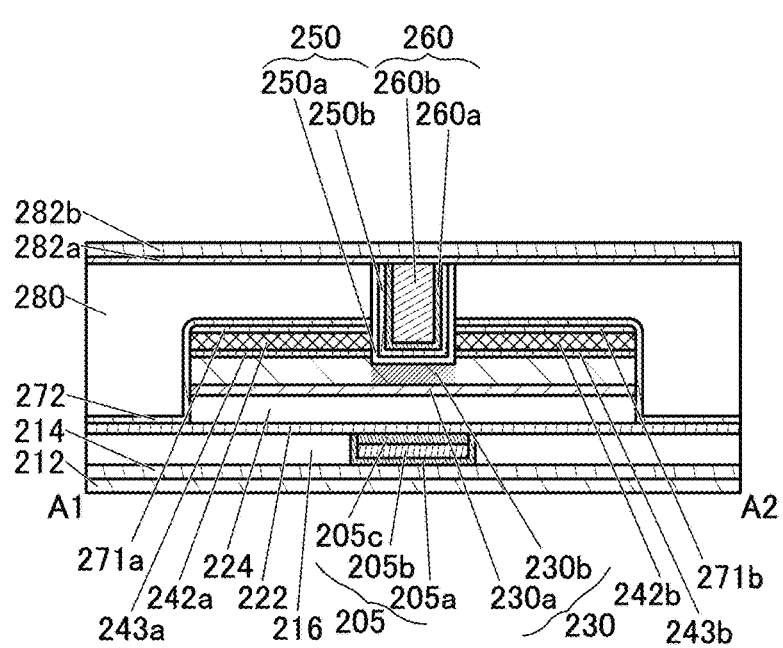
Figure 19D:
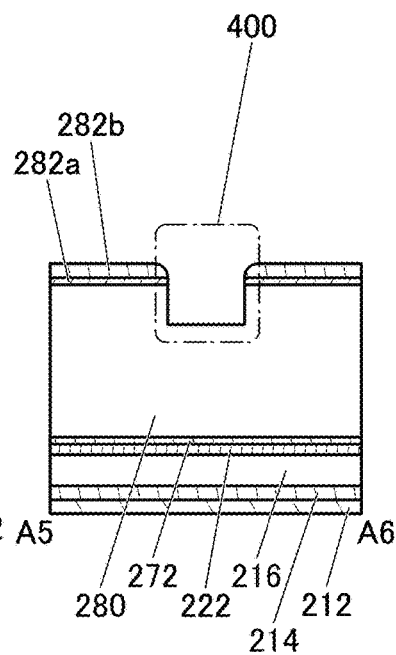

Next, part of the insulator 282a and part of the insulator 282b are processed to form the opening region 400 (see FIG. 19D). In the opening region 400, the insulator 280 has a recess portion in some cases. Wet etching can be used for the processing of the part of the insulator 282a, the part of the insulator 282b, and the part of the insulator 280; however, dry etching is preferably used for microfabrication. The depth of the recess portion of the insulator 280 is greater than or equal to ¼ and less than or equal to ½ of the maximum thickness of the insulator 280 in the semiconductor device.

Figure 20A:
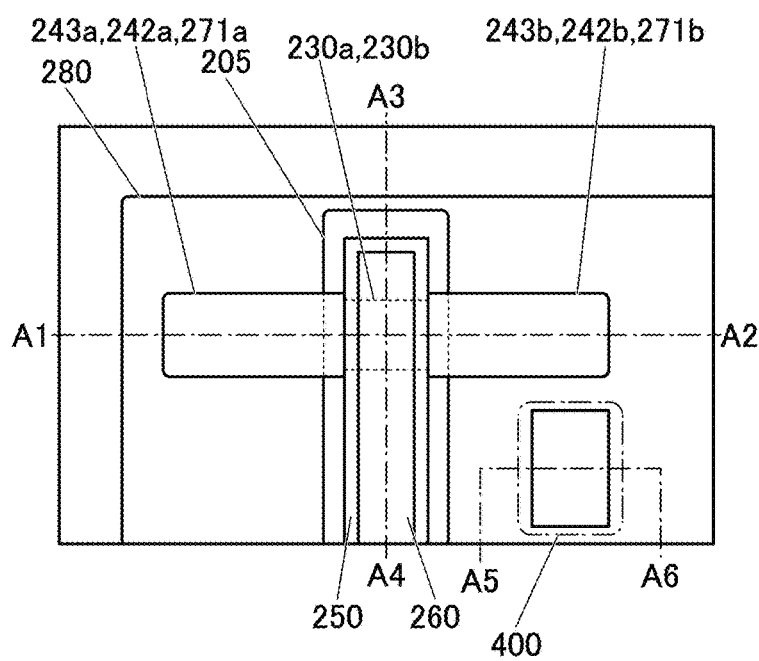
FIG. 20A is a top view illustrating the method for manufacturing the semiconductor device of one embodiment of the present invention.
Figure 20C:
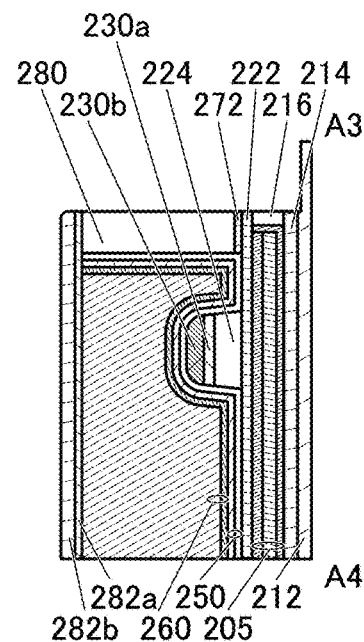
FIG. 20B to FIG. 20D are cross-sectional views illustrating the method for manufacturing the semiconductor device of one embodiment of the present invention.
Figure 20B:
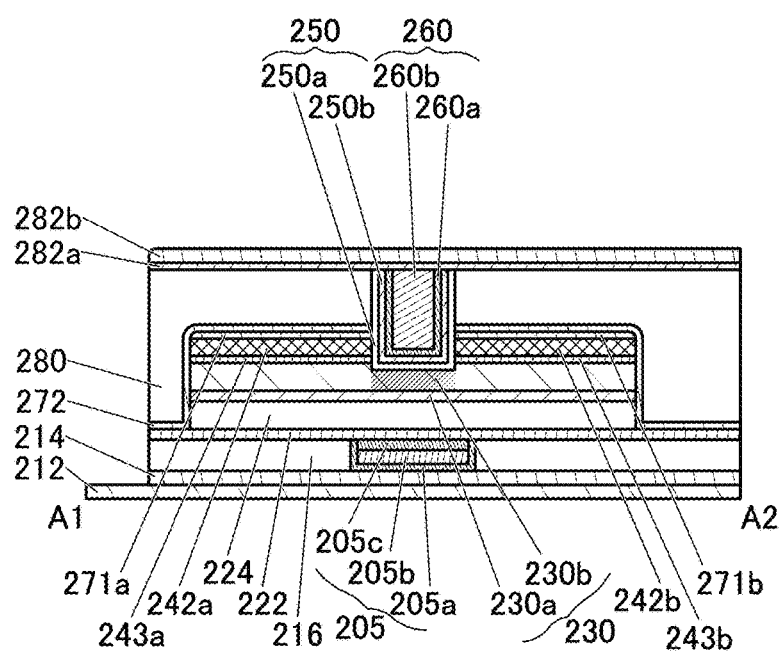
Figure 20D:
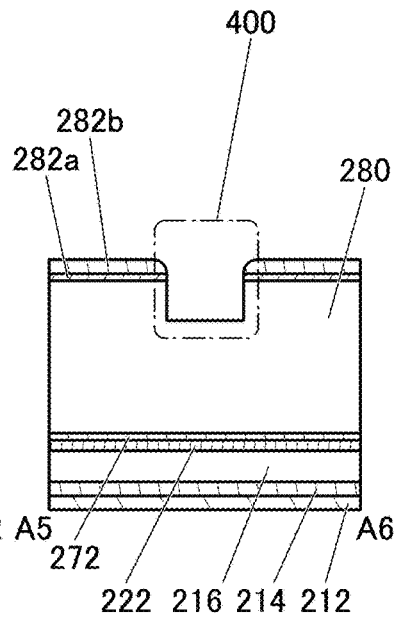

Next, the insulator 282a, the insulator 282b, the insulator 280, the insulator 272, the insulator 222, the insulator 216, and the insulator 214 are processed until part of each of them reaches the top surface of the insulator 212 (see FIG. 20A to FIG. 20C). Wet etching can be used for the processing; however, dry etching is preferably used for microfabrication.

Next, heat treatment may be performed. The heat treatment is performed at higher than or equal to 250° C. and lower than or equal to 650° C., preferably higher than or equal to 400° C. and lower than or equal to 600° C. The heat treatment is preferably performed at a temperature lower than that of the heat treatment performed after the deposition of the oxide film 243A. Note that the heat treatment is performed in an atmosphere of a nitrogen gas or an inert gas. By the heat treatment, oxygen contained in the insulator 280 and hydrogen bonded to the oxygen can be released to the outside from the side surface of the insulator 280 formed by the processing of the insulator 282a, the insulator 282b, the insulator 280, the insulator 272, the insulator 222, the insulator 216, and the insulator 214. Moreover, oxygen contained in the insulator 280 and hydrogen bonded to the oxygen can be released to the outside through the opening region 400. Note that the hydrogen bonded to oxygen is released as water. Thus, unnecessary oxygen and hydrogen contained in the insulator 280 can be reduced. Note that the heat treatment may be performed after the formation of the opening region 400 and may further performed after the processing of the insulator 280, the insulator 272, the insulator 222, the insulator 216, and the insulator 214.

Next, the insulator 283 is formed over the insulator 282b (see FIG. 21A to FIG. 21D). The insulator 283 is preferably in contact with the insulator 280 in the opening region 400. The insulator 283 can be deposited by a sputtering method, a CVD method, an MBE method, a PLD method, an ALD method, or the like. The insulator 283 is preferably deposited by a sputtering method. Since hydrogen is not used as a deposition gas in the sputtering method, the hydrogen concentration in the insulator 283 can be reduced. The insulator 283 may be a multilayer. For example, silicon nitride may be deposited by a sputtering method and silicon nitride may be deposited by an ALD method over the silicon nitride. Surrounding the transistor 200 by the insulator 283 and the insulator 212 having high barrier properties can prevent entry of moisture and hydrogen from the outside.

Figure 21A:
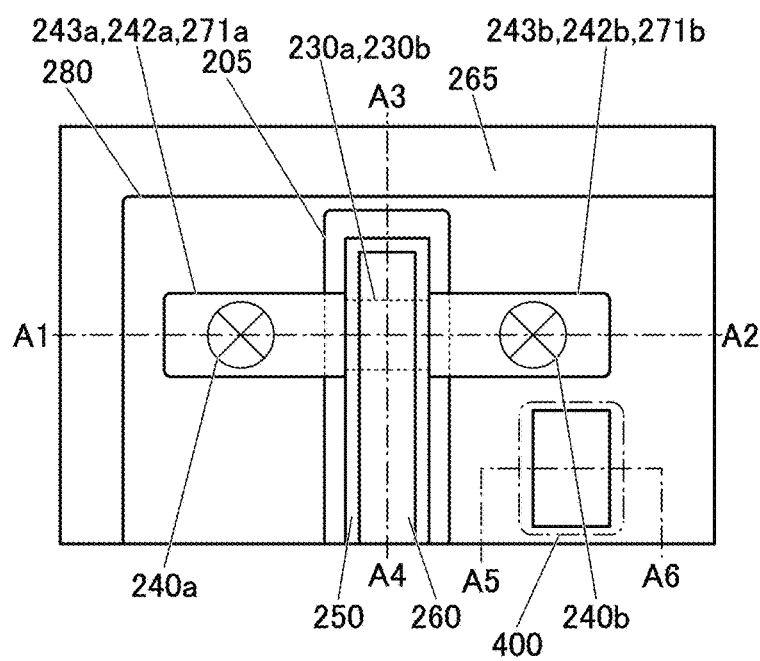
FIG. 21A is a top view illustrating the method for manufacturing the semiconductor device of one embodiment of the present invention.
Figure 21C:
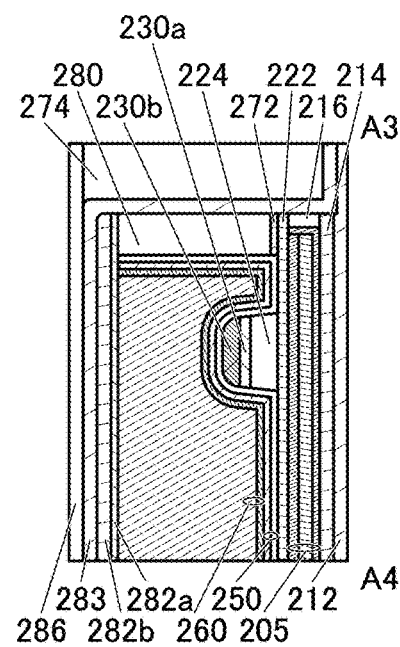
FIG. 21B to FIG. 21D are cross-sectional views illustrating the method for manufacturing the semiconductor device of one embodiment of the present invention.
Figure 21B:
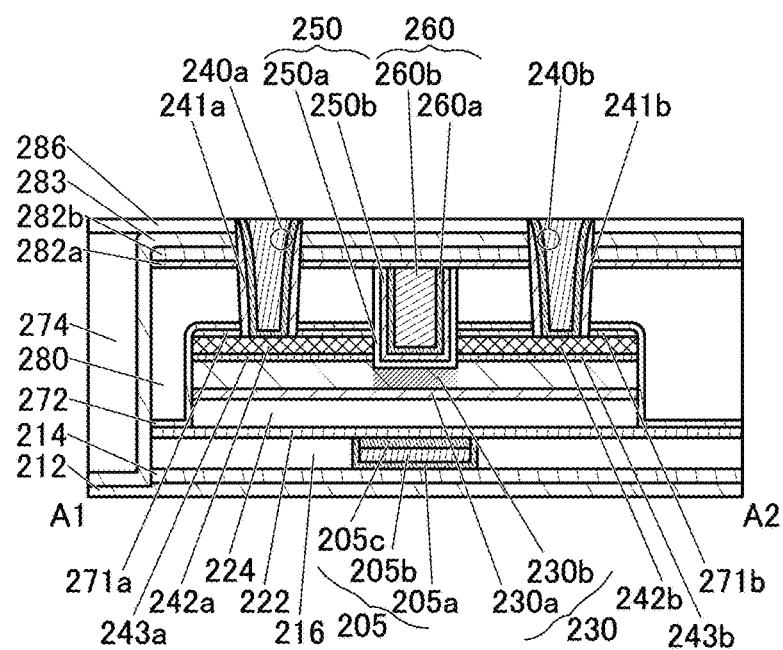
Figure 21D:
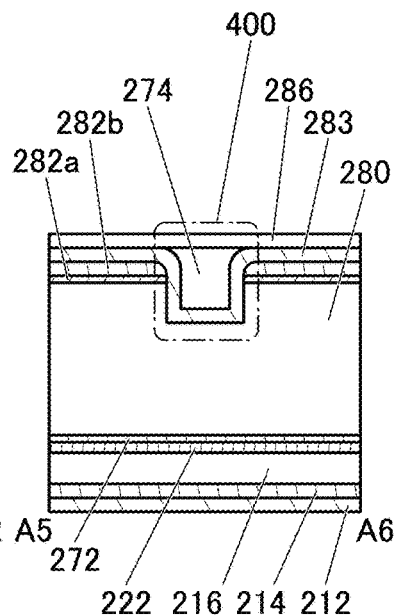

Next, the insulator 274 is formed over the insulator 283 (see FIG. 21B to FIG. 21D). The insulator 274 can be deposited by a sputtering method, a CVD method, an MBE method, a PLD method, an ALD method, or the like. In this embodiment, for the insulator 274, silicon oxide is deposited by a CVD method.

Next, the insulator 274 is polished by CMP treatment until the insulator 283 is exposed, whereby a top surface of the insulator 274 is planarized (see FIG. 21B to FIG. 21D). The top surface of the insulator 283 is partly removed by the CMP treatment in some cases. The opening region 400 is filled with part of the insulator 274 over the insulator 283 by the CMP treatment.

Next, the insulator 286 is formed over the insulator 274 and the insulator 283 (see FIG. 21A to FIG. 21D). The insulator 286 can be deposited by a sputtering method, a CVD method, an MBE method, a PLD method, an ALD method, or the like. In this embodiment, for the insulator 286, silicon oxide is deposited by a sputtering method.

Subsequently, openings reaching the conductor 242 are formed in the insulator 271, the insulator 272, the insulator 280, the insulator 282, the insulator 283, and the insulator 286 (see FIG. 21A and FIG. 21B). The openings are formed by a lithography method. Note that the openings in the top view in FIG. 21A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Subsequently, an insulating film to be the insulator 241 is deposited and the insulating film is subjected to anisotropic etching, so that the insulator 241 is formed. (See FIG. 21B). The insulating film to be the insulator 241 can be deposited by a sputtering method, a CVD method, an MBE method, a PLD method, an ALD method, or the like. As the insulating film to be the insulator 241, an insulating film having a function of inhibiting passage of oxygen is preferably used. For example, aluminum oxide is preferably deposited by an ALD method. Alternatively, silicon nitride is preferably deposited by a PEALD method. Silicon nitride is preferable because it has a high blocking property against hydrogen.

As an anisotropic etching for the insulating film to be the insulator 241, a dry etching method may be performed, for example. When the insulator 241 is provided on the side wall portions of the openings, passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is deposited. The conductive film to be the conductor 240a and the conductor 240b desirably has a stacked-layer structure which includes a conductor having a function of inhibiting passage of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Then, part of the conductive film to be the conductor 240a and the conductor 240b is removed by CMP treatment to expose the top surface of the insulator 274. As a result, the conductive film remains only in the openings, so that the conductor 240a and the conductor 240b having flat top surfaces can be formed (see FIG. 21B). Note that the top surface of the insulator 286 is partly removed by the CMP treatment in some cases.

Next, a conductive film to be the conductor 246 is deposited. The conductive film to be the conductor 246 can be deposited by a sputtering method, a CVD method, an MBE method, a PLD method, an ALD method, or the like.

Then, the conductive film to be the conductor 246 is processed by a lithography method, thereby forming the conductor 246a in contact with the top surface of the conductor 240a and the conductor 246b in contact with the top surface of the conductor 240b. Although not illustrated, in this case, part of the insulator 286 in a region where the conductor 246a and the conductor 246b do not overlap with the insulator 286 is sometimes removed.

Through the above process, the semiconductor device including the transistor 200 illustrated in FIG. 3A to FIG. 3D can be manufactured. As illustrated in FIG. 6A to FIG. 21D, the transistor 200 can be manufactured with the use of the method for manufacturing the semiconductor device described in this embodiment.

<Microwave Treatment Apparatus>

A microwave treatment apparatus that can be used for the above method for manufacturing the semiconductor device will be described below.

Figure 23:
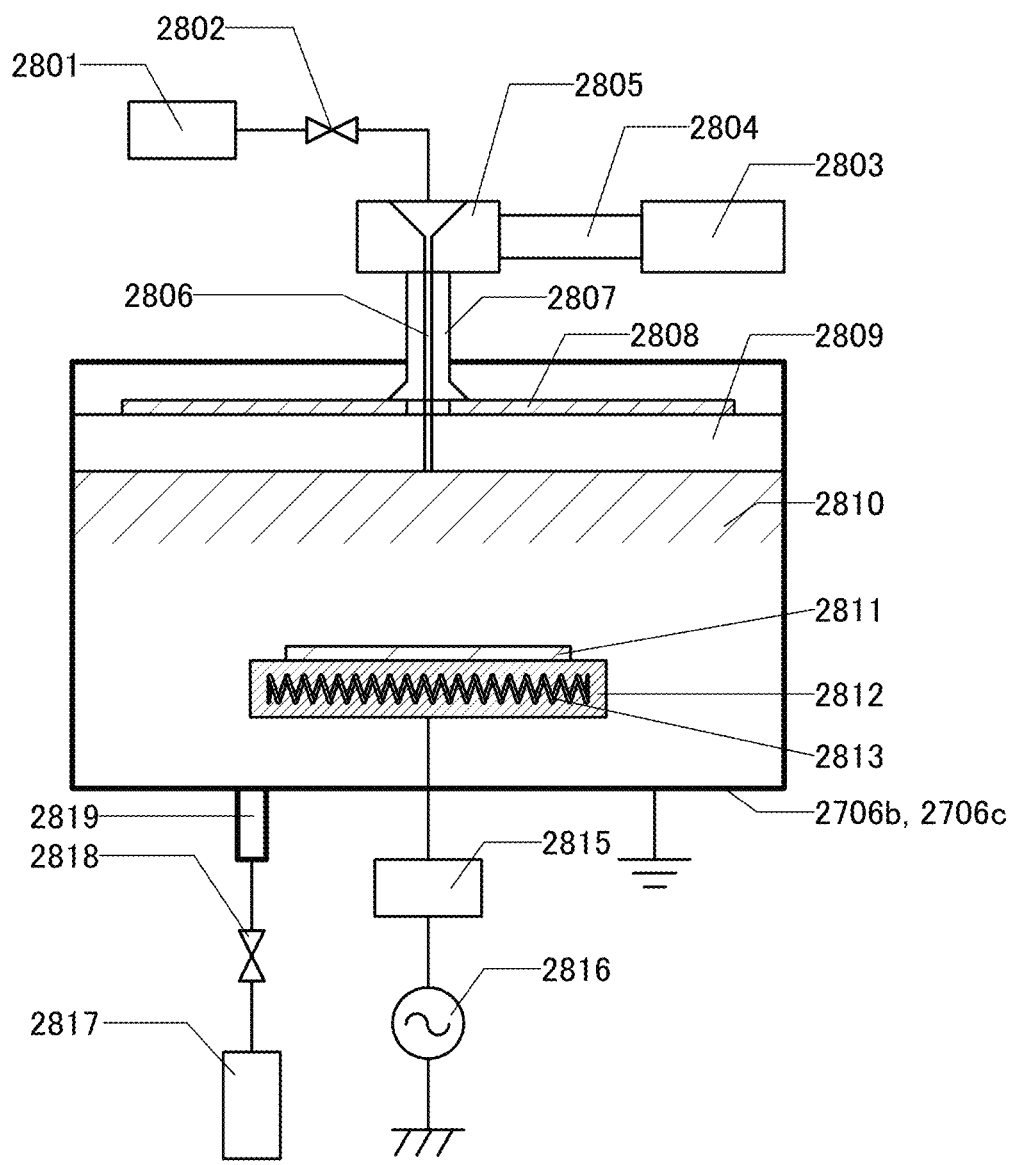
FIG. 23 is a cross-sectional view illustrating the microwave treatment apparatus of one embodiment of the present invention.
Figure 24:
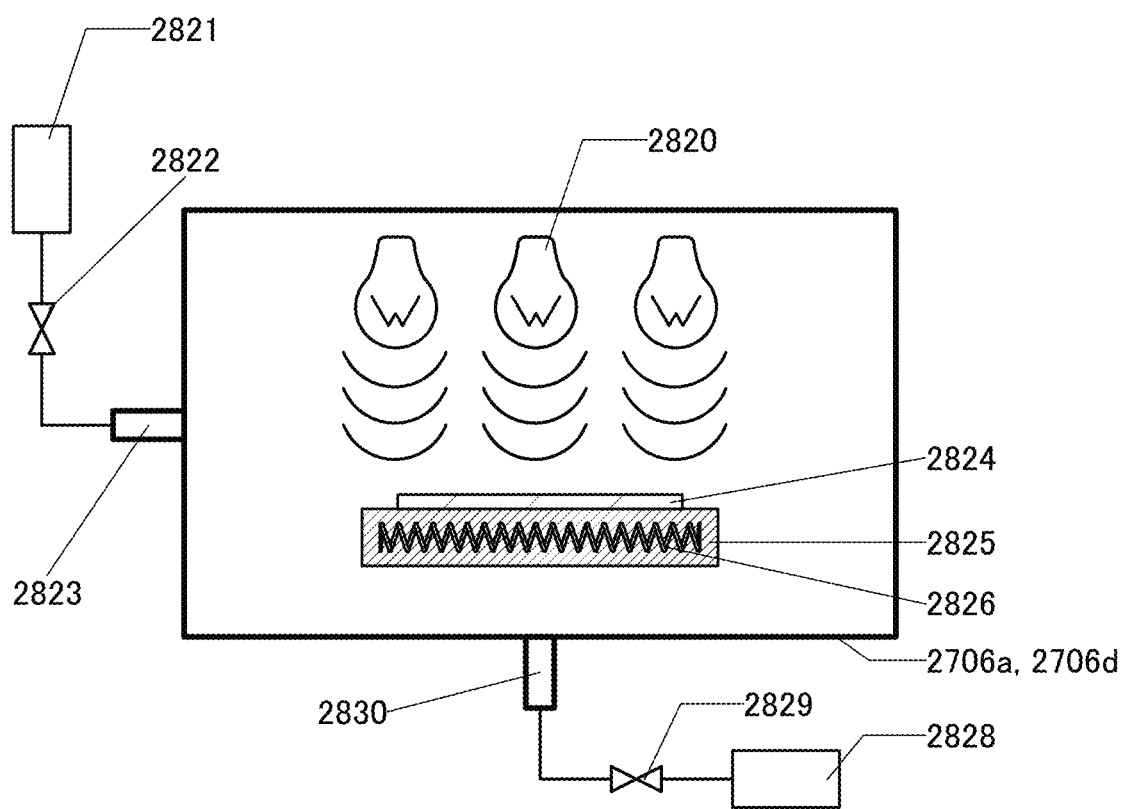
FIG. 24 is a cross-sectional view illustrating the microwave treatment apparatus of one embodiment of the present invention.
Figure 25A:
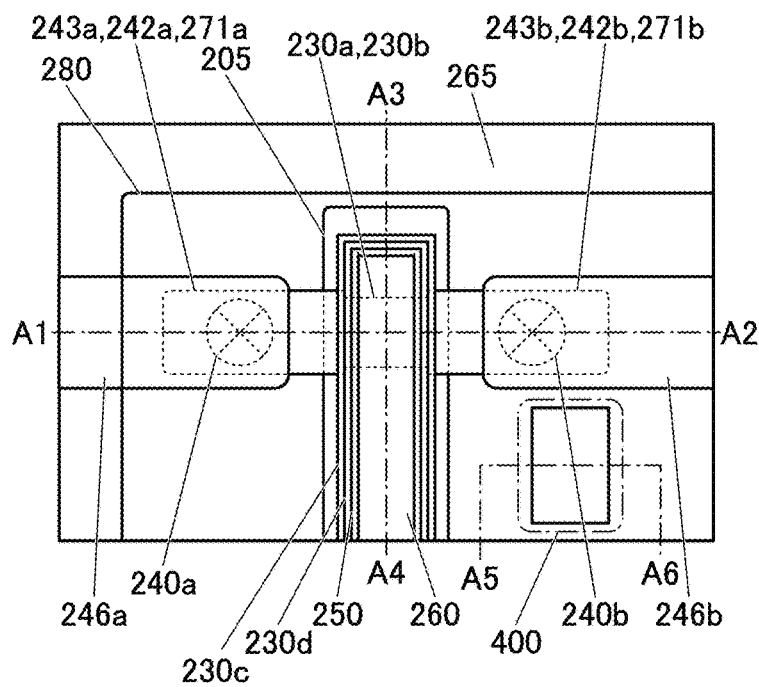
FIG. 25A is a top view of a semiconductor device of one embodiment of the present invention.
Figure 25C:
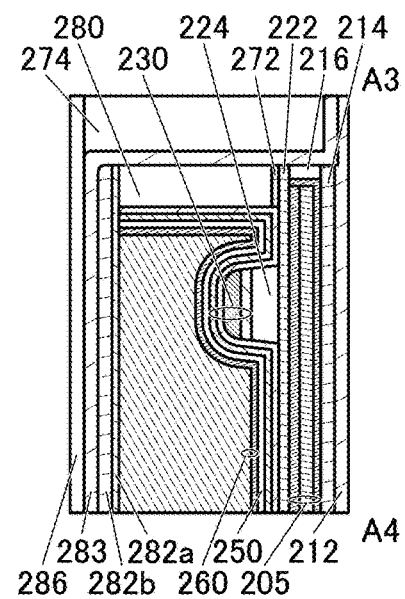
FIG. 25B to FIG. 25D are cross-sectional views of the semiconductor device of one embodiment of the present invention.
Figure 25B:
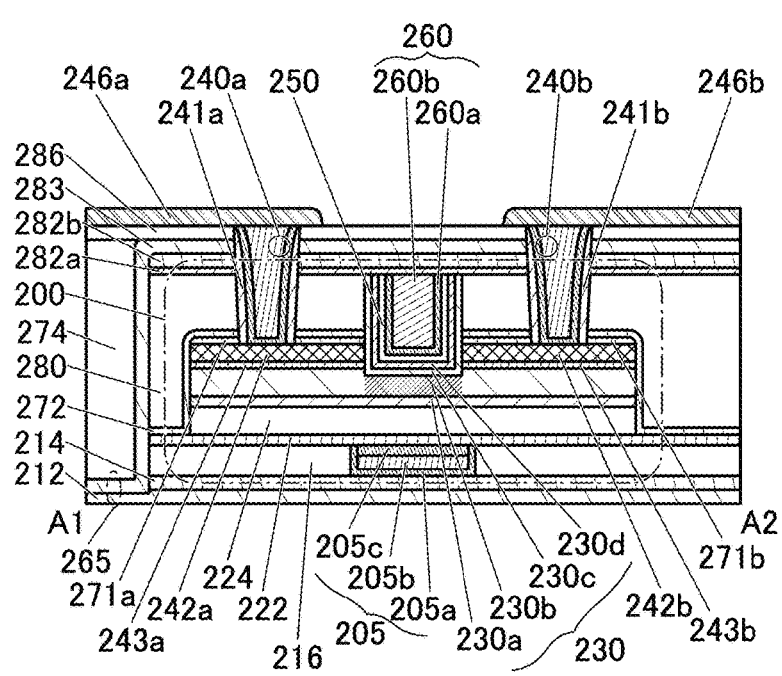
Figure 25D:
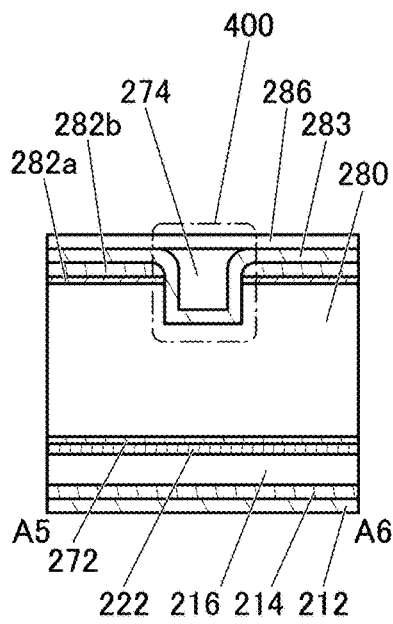

First, a structure of a manufacturing apparatus that hardly allows entry of impurities in manufacturing a semiconductor device or the like is described with reference to FIG. 22, FIG. 23, and FIG. 24.

Figure 22:
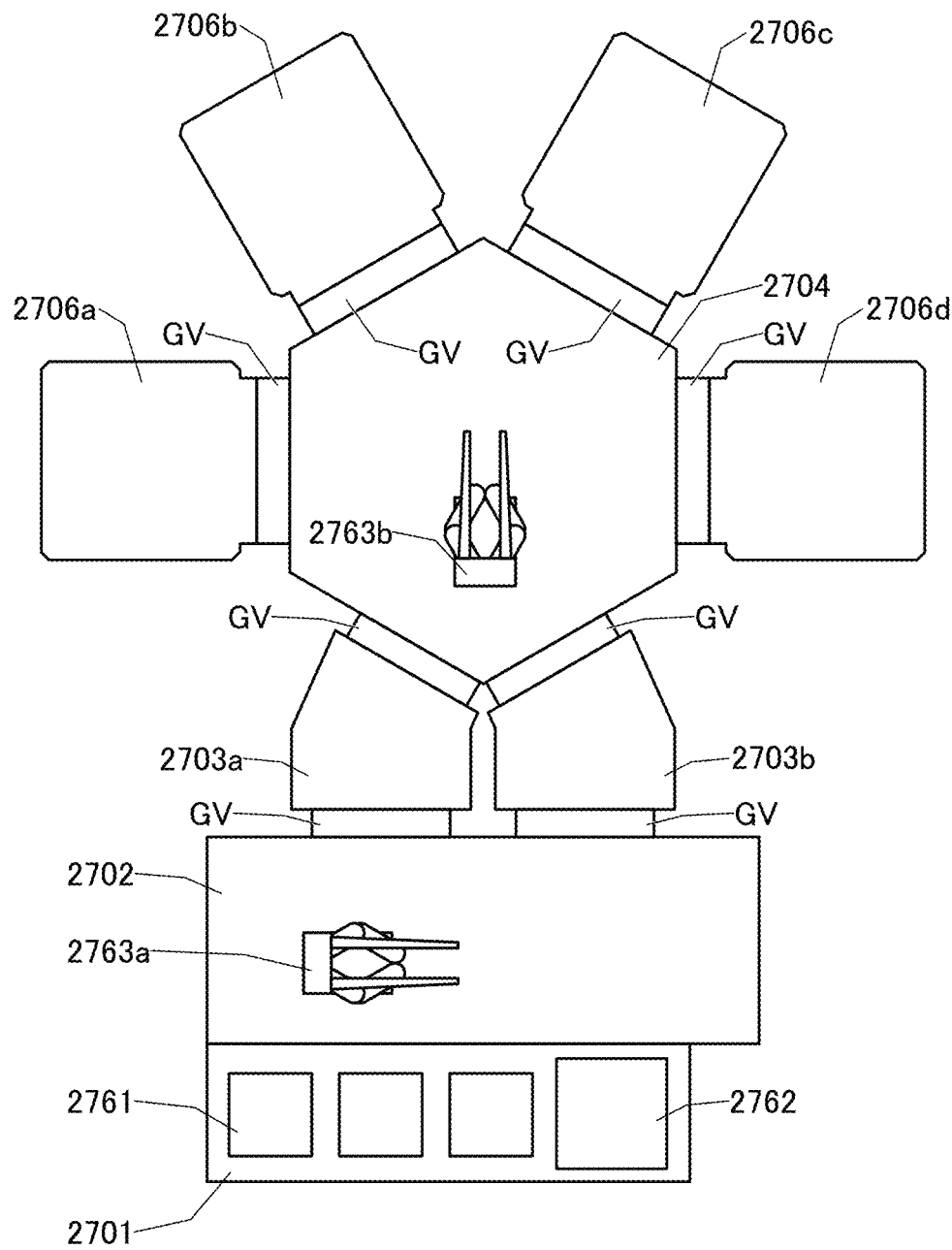
FIG. 22 is a top view illustrating a microwave treatment apparatus of one embodiment of the present invention.

FIG. 22 schematically illustrates a top view of a single wafer multi-chamber manufacturing apparatus 2700. The manufacturing apparatus 2700 includes an atmosphere-side substrate supply chamber 2701 including a cassette port 2761 for storing substrates and an alignment port 2762 for performing alignment of substrates; an atmosphere-side substrate transfer chamber 2702 through which a substrate is transferred from the atmosphere-side substrate supply chamber 2701; a load lock chamber 2703a where a substrate is carried in and the pressure inside the chamber is switched from atmospheric pressure to reduced pressure or from reduced pressure to atmospheric pressure; an unload lock chamber 2703b where a substrate is carried out and the pressure inside the chamber is switched from reduced pressure to atmospheric pressure or from atmospheric pressure to reduced pressure; a transfer chamber 2704 through which a substrate is transferred in a vacuum; a chamber 2706a; a chamber 2706b; a chamber 2706c; and a chamber 2706d.

Furthermore, the atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chamber 2706a, the chamber 2706b, the chamber 2706c, and the chamber 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. Furthermore, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

The back pressure (total pressure) in the transfer chamber 2704 and each of the chambers is, for example, lower than or equal to $1\times10^{-4}$ Pa, preferably lower than or equal to $3\times10^{-5}$ Pa, further preferably lower than or equal to $1\times10^{-5}$ Pa. Furthermore, the partial pressure of a gas molecule (atom) having a mass-to-charge ratio (m/z) of 18 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa. Furthermore, the partial pressure of a gas molecule (atom) having m/z of 28 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa. Furthermore, the partial pressure of a gas molecule (atom) having m/z of 44 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa.

Note that the total pressure and the partial pressure in the transfer chamber 2704 and each of the chambers can be measured using a mass analyzer. For example, Qulee CGM-051, a quadrupole mass analyzer (also referred to as Q-mass) produced by ULVAC, Inc. can be used.

Furthermore, the transfer chamber 2704 and the chambers each desirably have a structure in which the amount of external leakage or internal leakage is small. For example, the leakage rate in the transfer chamber 2704 and each of the chambers is less than or equal to $3\times10^{-6}$ Pa·m³/s, preferably less than or equal to $1\times10^{-6}$ Pa·m³/s. Furthermore, for example, the leakage rate of a gas molecule (atom) having m/z of 18 is less than or equal to $1\times10^{-7}$ Pa·m³/s, preferably less than or equal to $3\times10^{4}$ Pa·m³/s. Furthermore, for example, the leakage rate of a gas molecule (atom) having m/z of 28 is less than or equal to $1\times10^{-5}$ Pa·m³/s, preferably less than or equal to $1\times10^{-6}$ Pa·m³/s. Furthermore, for example, the leakage rate of a gas molecule (atom) having m/z of 44 is less than or equal to $3\times10^{-6}$ Pa·m³/s, preferably less than or equal to $1\times10^{-6}$ Pa·m³/s.

Note that a leakage rate can be derived from the total pressure and partial pressure measured using the above-described mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or released gas from an internal member. Measures need to be taken from both aspects of external leakage and internal leakage in order that the leakage rate can be set to less than or equal to the above-described value.

For example, open/close portions of the transfer chamber 2704 and each of the chambers are preferably sealed with a metal gasket. For the metal gasket, metal covered with iron fluoride, aluminum oxide, or chromium oxide is preferably used. The metal gasket achieves higher adhesion than an O-ring and can reduce the external leakage. Furthermore, with the use of the metal covered with iron fluoride, aluminum oxide, chromium oxide, or the like, which is in the passive state, the release of gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of gas containing impurities, is used. Furthermore, an alloy containing iron, chromium, nickel, and the like covered with the above-described metal, which releases a small amount of gas containing impurities, may be used. The alloy containing iron, chromium, nickel, and the like is rigid, resistant to heat, and suitable for processing. Here, when surface unevenness of the member is reduced by polishing or the like to reduce the surface area, the release of gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of gas.

An adsorbed substance present in the transfer chamber 2704 and each of the chambers does not affect the pressure in the transfer chamber 2704 and each of the chambers because it is adsorbed onto an inner wall or the like; however, it causes a release of gas when the transfer chamber 2704 and each of the chambers are evacuated. Thus, although there is no correlation between the leakage rate and the exhaust rate, it is important that the adsorbed substance present in the transfer chamber 2704 and each of the chambers be desorbed as much as possible and exhaust be performed in advance with the use of a pump with high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure in the transfer chamber 2704 and each of the chambers. The introduction of the heated gas can desorb the adsorbed substance in the transfer chamber 2704 and each of the chambers, and impurities present in the transfer chamber 2704 and each of the chambers can be reduced. Note that this treatment is effective when repeated more than or equal to 2 times and less than or equal to 30 times, preferably more than or equal to 5 times and less than or equal to 15 times. Specifically, an inert gas, oxygen, or the like at a temperature higher than or equal to 40° C. and lower than or equal to 400° C., preferably higher than or equal to 50° C. and lower than or equal to 200° C. is introduced, so that the pressure in the transfer chamber 2704 and each of the chambers can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the transfer chamber 2704 and each of the chambers are evacuated in the time range of 5 minutes to 300 minutes, preferably 10 minutes to 120 minutes.

Next, the chamber 2706b and the chamber 2706c are described with reference to a schematic cross-sectional view illustrated in FIG. 23.

The chamber 2706b and the chamber 2706c are chambers in which microwave treatment can be performed on an object, for example. Note that the chamber 2706b is different from the chamber 2706c only in the atmosphere in performing the microwave treatment. The other structures are common and thus collectively described below.

The chamber 2706b and the chamber 2706c each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706b and the chamber 2706c, for example.

The high-frequency generator 2803 is connected to the mode converter 2805 through the waveguide 2804. The mode converter 2805 is connected to the slot antenna plate 2808 through the waveguide 2807. The slot antenna plate 2808 is placed in contact with the dielectric plate 2809. Furthermore, the gas supply source 2801 is connected to the mode converter 2805 through the valve 2802. Then, gas is transferred to the chamber 2706b and the chamber 2706c through the gas pipe 2806 that runs through the mode converter 2805, the waveguide 2807, and the dielectric plate 2809. Furthermore, the vacuum pump 2817 has a function of exhausting gas or the like from the chamber 2706b and the chamber 2706c through the valve 2818 and the exhaust port 2819. Furthermore, the high-frequency power source 2816 is connected to the substrate holder 2812 through the matching box 2815.

The substrate holder 2812 has a function of holding a substrate 2811. For example, the substrate holder 2812 has a function as an electrostatic chuck or a mechanical chuck for holding the substrate 2811. Furthermore, the substrate holder 2812 has a function as an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2817, a cryotrap may be used. The use of the cryopump and the cryotrap is particularly preferable because water can be efficiently exhausted.

Furthermore, for example, the heating mechanism 2813 is a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (an argon gas or the like) is used.

As the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high-density region of high-density plasma 2810 described later; thus, provision of the protective layer can reduce the damage. Consequently, an increase in the number of particles or the like during the treatment can be inhibited.

The high-frequency generator 2803 has a function of generating a microwave of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave passes through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF power source with a frequency of 13.56 MHz, 27.12 MHz, or the like is used, for example. The application of a bias to the substrate side allows ions in the high-density plasma 2810 to efficiently reach a deep portion of an opening portion of the film or the like over the substrate 2811.

For example, in the chamber 2706b or the chamber 2706c, oxygen radical treatment using the high-density plasma 2810 can be performed by introducing oxygen from the gas supply source 2801.

Next, the chamber 2706a and the chamber 2706d are described with reference to a schematic cross-sectional view illustrated in FIG. 24.

The chamber 2706a and the chamber 2706d are chambers in which an object can be irradiated with an electromagnetic wave, for example. Note that the chamber 2706a is different from the chamber 2706d only in the kind of the electromagnetic wave. The other structures have many common portions and thus are collectively described below.

The chamber 2706a and the chamber 2706d each include one or a plurality of lamps 2820, a substrate holder 2825, a gas inlet 2823, and an exhaust port 2830. Furthermore, a gas supply source 2821, a valve 2822, a vacuum pump 2828, and a valve 2829 are provided outside the chamber 2706a and the chamber 2706d, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of emitting an electromagnetic wave such as visible light or ultraviolet light is used, for example. For example, a light source having a function of emitting an electromagnetic wave which has a peak in a wavelength region of longer than or equal to 10 nm and shorter than or equal to 2500 nm, longer than or equal to 500 nm and shorter than or equal to 2000 nm, or longer than or equal to 40 nm and shorter than or equal to 340 nm is used.

As the lamp 2820, a light source such as a halogen lamp, a metal halide lamp, a xenon arc lamp, a carbon arc lamp, a high-pressure sodium lamp, or a high-pressure mercury lamp is used, for example.

For example, part or the whole of electromagnetic wave emitted from the lamp 2820 is absorbed by the substrate 2824, so that the quality of a film or the like over the substrate 2824 can be modified. For example, generation or reduction of defects or removal of impurities can be performed. Note that generation or reduction of defects, removal of impurities, or the like can be efficiently performed while the substrate 2824 is heated.

Alternatively, for example, the electromagnetic wave emitted from the lamp 2820 may generate heat in the substrate holder 2825 to heat the substrate 2824. In this case, the substrate holder 2825 does not need to include the heating mechanism 2826 therein.

For the vacuum pump 2828, refer to the description of the vacuum pump 2817. Furthermore, for the heating mechanism 2826, refer to the description of the heating mechanism 2813. Furthermore, for the gas supply source 2821, refer to the description of the gas supply source 2801.

With the use of the above-described manufacturing apparatus, the quality of a film or the like can be modified while the entry of impurities into an object is inhibited.

<Modification Example of Semiconductor Device>

Examples of the semiconductor device of one embodiment of the present invention will be described below with reference to FIG. 25A to FIG. 28B.

Note that A of each drawing is a top view of the semiconductor device. Moreover, B of each drawing is a cross-sectional view corresponding to a portion indicated by dashed-dotted line A1-A2 in A of each drawing. Furthermore, C of each drawing is a cross-sectional view corresponding to a portion indicated by dashed-dotted line A3-A4 in A of each drawing. Furthermore, D of each drawing is a cross-sectional view corresponding to a portion indicated by dashed-dotted line A5-A6 in A of each drawing. Note that for clarity of the drawing, some components are not illustrated in the top view of A of each drawing.

Note that in the semiconductor device illustrated in A to D of each drawing, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

<Modification Example 1 of Semiconductor Device>

A semiconductor device illustrated in FIG. 25A to FIG. 25D is a modification example of the semiconductor device illustrated in FIG. 3A to FIG. 3D. The semiconductor device illustrated in FIG. 25A to FIG. 25D is different from the semiconductor device illustrated in FIG. 3A to FIG. 3D in including an oxide 230c and an oxide 230d.

The semiconductor device illustrated in FIG. 25A to FIG. 25D further includes the oxide 230c over the oxide 230b and the oxide 230d over the oxide 230c. The oxide 230c and the oxide 230d are provided in the opening formed in the insulator 280 and the insulator 272. The oxide 230c is in contact with a side surface of the oxide 243a, a side surface of the oxide 243b, a side surface of the conductor 242a, a side surface of the conductor 242b, the side surface of the insulator 271a, the side surface of the insulator 271b, and a side surface of the insulator 272. A top surface of the oxide 230c and a top surface of the oxide 230d are in contact with the insulator 282.

The oxide 230d is positioned over the oxide 230c, whereby impurities can be inhibited from diffusing into the oxide 230b or the oxide 230c from components formed over the oxide 230d. When the oxide 230d is positioned over the oxide 230c, oxygen can be inhibited from diffusing upward from the oxide 230b or the oxide 230c.

In a cross-sectional view of the transistor in the channel length direction, it is preferable that a groove portion be provided in the oxide 230b and the oxide 230c be embedded in the groove portion. At this time, the oxide 230c is placed to cover the inner wall (the side wall and the bottom surface) of the groove portion. It is preferable that the thickness of the oxide 230c be approximately the same as the depth of the groove portion. With such a structure, even when the opening in which the conductor 260 and the like are embedded is formed and a damaged region is formed on the surface of the oxide 230b at the bottom portion of the opening, the damaged region can be removed. Accordingly, defects in the electrical characteristics of the transistor 200 due to the damaged region can be reduced.

The atomic ratio of In to the element M in the metal oxide used for the oxide 230c is preferably greater than the atomic ratio of In to the metal element M in the metal oxide used for the oxide 230a or the oxide 230d.

In order to make the oxide 230c serve as a main carrier path, the atomic ratio of indium to a metal element that is a main component in the oxide 230c is preferably greater than the atomic ratio of indium to a metal element that is a main component in the oxide 230b. Furthermore, the atomic ratio of In to the element M in the oxide 230c is preferably greater than the atomic ratio of In to the element M in the oxide 230b. When a metal oxide having a high content of indium is used for a channel formation region, the on-state current of the transistor can be increased. Accordingly, when the atomic ratio of indium to a metal element that is a main component in the oxide 230c is greater than the atomic ratio of indium to a metal element that is a main component in the oxide 230b, the oxide 230c can serve as a main carrier path. The conduction band minimum of the oxide 230c is preferably remoter from the vacuum level than the conduction band minimum of each of the oxide 230a and the oxide 230b is. In other words, the electron affinity of the oxide 230c is preferably larger than the electron affinity of each of the oxide 230a and the oxide 230b. At this time, the oxide 230c serves as a main carrier path.

As the oxide 230c, specifically, a metal oxide with In:M:Zn=4:2:3 [atomic ratio] or a composition in the neighborhood thereof, In:M:Zn=5:1:3 [atomic ratio] or a composition in the neighborhood thereof, or In:M:Zn=10:1:3 [atomic ratio] or a composition in the neighborhood thereof, indium oxide, or the like may be used.

In addition, a CAAC-OS is preferably used for the oxide 230c; the c-axis of a crystal included in the oxide 230c is preferably aligned in a direction substantially perpendicular to the formation surface or top surface of the oxide 230c. The CAAC-OS has a property of making oxygen move easily in the direction perpendicular to the c-axis. Thus, oxygen contained in the oxide 230c can be efficiently supplied to the oxide 230b.

The oxide 230d preferably contains at least one of the metal elements contained in the metal oxide used for the oxide 230c, and further preferably contains all of these metal elements. For example, it is preferable that an In-M-Zn oxide, an In—Zn oxide, or an indium oxide be used for the oxide 230c, and an In-M-Zn oxide, an M-Zn oxide, or an oxide of the element M be used for the oxide 230d. Accordingly, the density of defect states at the interface between the oxide 230c and the oxide 230d can be decreased.

The conduction band minimum of the oxide 230d is preferably closer to the vacuum level than the conduction band minimum of the oxide 230c. In other words, the electron affinity of the oxide 230d is preferably smaller than the electron affinity of the oxide 230c. In that case, a metal oxide that can be used for the oxide 230a or the oxide 230b is preferably used for the oxide 230d. At this time, the oxide 230c serves as a main carrier path.

Specifically, for the oxide 230c, a metal oxide with a composition of In:M:Zn=4:2:3 [atomic ratio] or in the neighborhood thereof, In:M:Zn=5:1:3 [atomic ratio] or in the neighborhood thereof, or In:M:Zn=10:1:3 [atomic ratio] or in the neighborhood thereof, or indium oxide may be used. For the oxide 230d, a metal oxide with a composition of In:M:Zn=1:3:4 [atomic ratio] or in the neighborhood thereof, M:Zn=2:1 [atomic ratio] or in the neighborhood thereof, M:Zn=2:5 [atomic ratio] or in the neighborhood thereof, or an oxide of the element M may be used. Note that a composition in the neighborhood includes the range of ±30% of an intended atomic ratio. Gallium is preferably used as the element M.

The oxide 230d is preferably formed using a metal oxide that inhibits diffusion or passage of oxygen more readily than the oxide 230c. Providing the oxide 230d between the insulator 250 and the oxide 230c enables oxygen to be supplied efficiently to the oxide 230b through the oxide 230c.

When the atomic ratio of In to the metal element that is a main component in the metal oxide used for the oxide 230d is smaller than the atomic ratio of In to the metal element that is a main component in the metal oxide used for the oxide 230c, diffusion of In to the insulator 250 side can be inhibited. For example, the atomic ratio of In to the element M in the oxide 230d is smaller than the atomic ratio of In to the element M in the oxide 230c. Since the insulator 250 functions as a gate insulator, the transistor exhibits poor characteristics when In enters the insulator 250 and the like. Thus, the oxide 230d provided between the oxide 230c and the insulator 250 allows the semiconductor device to have high reliability.

Note that the oxide 230c may be provided for each of the transistors 200. That is, the oxide 230c of the transistor 200 is not necessarily in contact with the oxide 230c of the adjacent transistor 200. Furthermore, the oxide 230c of the transistor 200 may be apart from the oxide 230c of the adjacent transistor 200. In other words, a structure in which the oxide 230c is not placed between the transistor 200 and the adjacent transistor 200 may be employed.

When the above structure is employed for the semiconductor device where a plurality of transistors 200 are arranged in the channel width direction, the oxide 230c can be independently provided for each transistor 200. Accordingly, generation of a parasitic transistor between the transistor 200 and another transistor 200 adjacent to the transistor 200 can be prevented, and generation of the leakage path can be prevented. Thus, a semiconductor device that has favorable electrical characteristics and can be miniaturized or highly integrated can be provided.

<Modification Example 2 of Semiconductor Device>

An example of the semiconductor device of one embodiment of the present invention will be described below with reference to FIG. 26A and FIG. 26B.

Figure 26A:
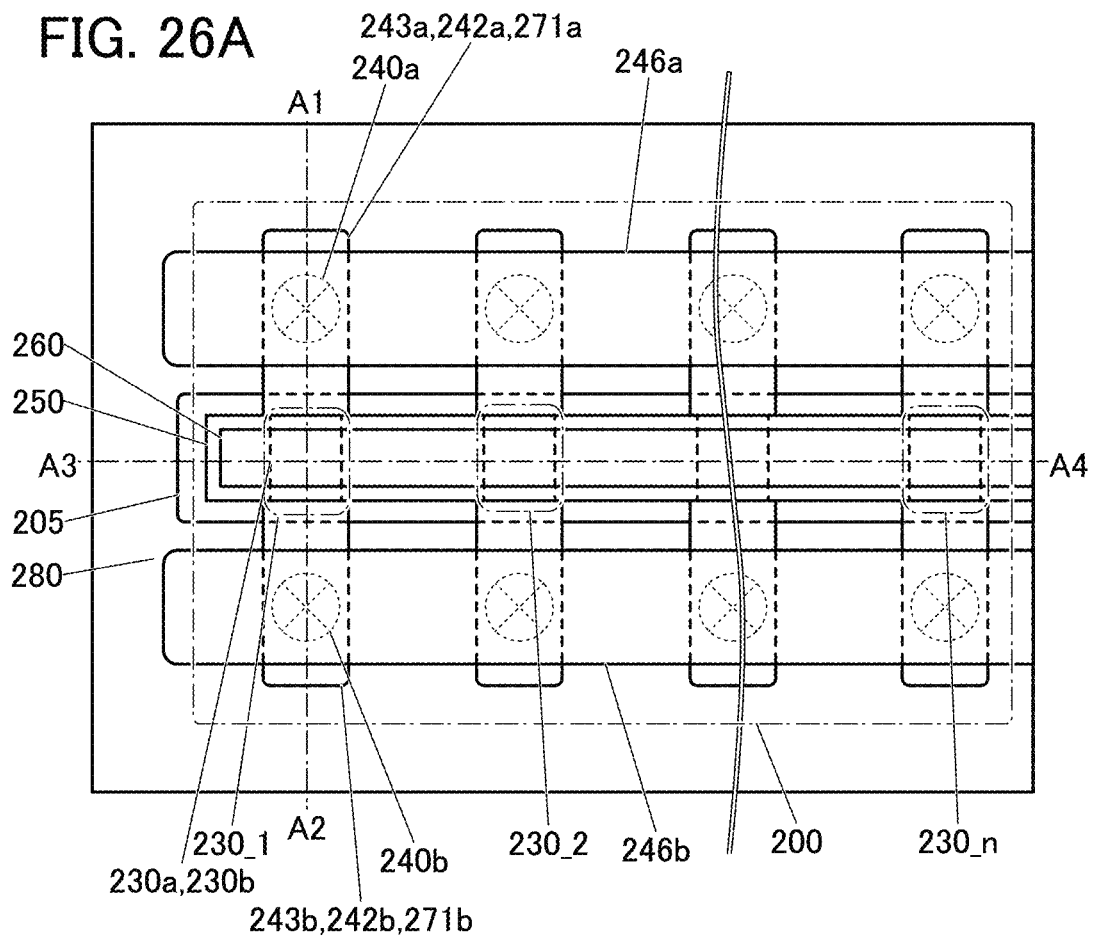
FIG. 26A is a top view of a semiconductor device of one embodiment of the present invention.

FIG. 26A is a top view of the semiconductor device. FIG. 26B is a cross-sectional view corresponding to a portion indicated by dashed-dotted line A3-A4 in FIG. 26A. Note that the cross-sectional view corresponding to a portion indicated by dashed-dotted line A1-A2 in FIG. 26A can be referred to for the transistor 200 illustrated in FIG. 3B. Note that for clarity of the drawing, some components are not illustrated in the top view of FIG. 26A.

Note that in the semiconductor device illustrated in FIG. 3A to FIG. 3D, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

Figure 26B:
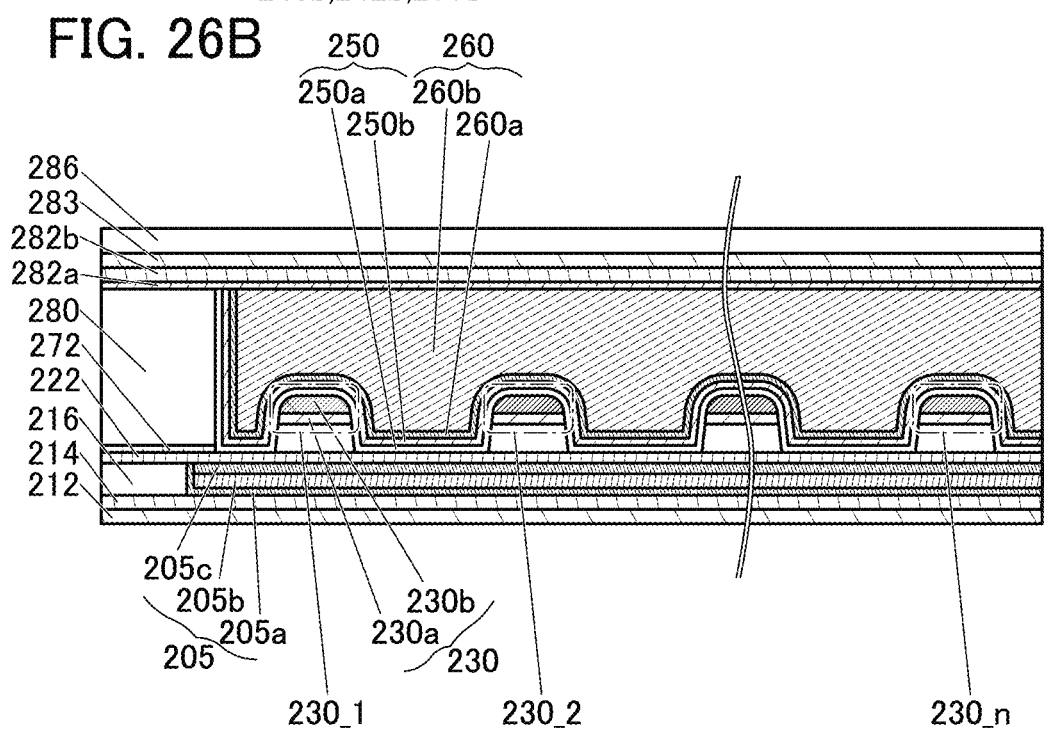
FIG. 26B is a cross-sectional view of the semiconductor device of one embodiment of the present invention.

The semiconductor device illustrated in FIG. 26A and FIG. 26B is a modification example of the semiconductor device illustrated in FIG. 3A to FIG. 3D. The semiconductor device illustrated in FIG. 26A and FIG. 26B is different from the semiconductor device illustrated in FIG. 3A to FIG. 3D in the transistor 200 includes n oxides 230 (oxide 230_1 to oxide 230_n: n is a natural number). Each of the oxide 230_1 to the oxide 230_n includes a channel formation region.

In the semiconductor device illustrated in FIG. 26A and FIG. 26B, the conductor 260 is provided over top surfaces and side surfaces of a plurality of channel formation regions with the insulator 250 therebetween. The conductor 246 (the conductor 246a and the conductor 246b) extends in the A3-A4 direction and is electrically connected to the oxide 230_1 to the oxide 230_n through the conductor 240.

That is, in the semiconductor device illustrated in FIG. 26A and FIG. 26B, the transistor 200 includes a plurality of channel formation regions with respect to one gate electrode. By including the plurality of channel formation regions, the transistor 200 illustrated in FIG. 26A and FIG. 26B can have a high on-state current. Furthermore, each channel formation region is surrounded by the gate electrode; in other words, an s-channel structure is employed; thus, a high on-state current can be obtained in each channel formation region. In the channel width direction of the transistor 200, when the bottom surface of the insulator 222 is regarded as a basis, the level of the bottom surface of the conductor 260 in the region where the conductor 260 and the oxide 230b do not overlap with each other is lower than the level of the interface between the uppermost surface of the oxide 230b and the insulator 250; therefore, a high on-state current can be obtained in each channel formation region.

Note that for other components, the components of the semiconductor device illustrated in FIG. 3A to FIG. 3D can be referred to.

<Modification Example 3 of Semiconductor Device>

An example of the semiconductor device of one embodiment of the present invention will be described below with reference to FIG. 27A and FIG. 27B.

Figure 27A:
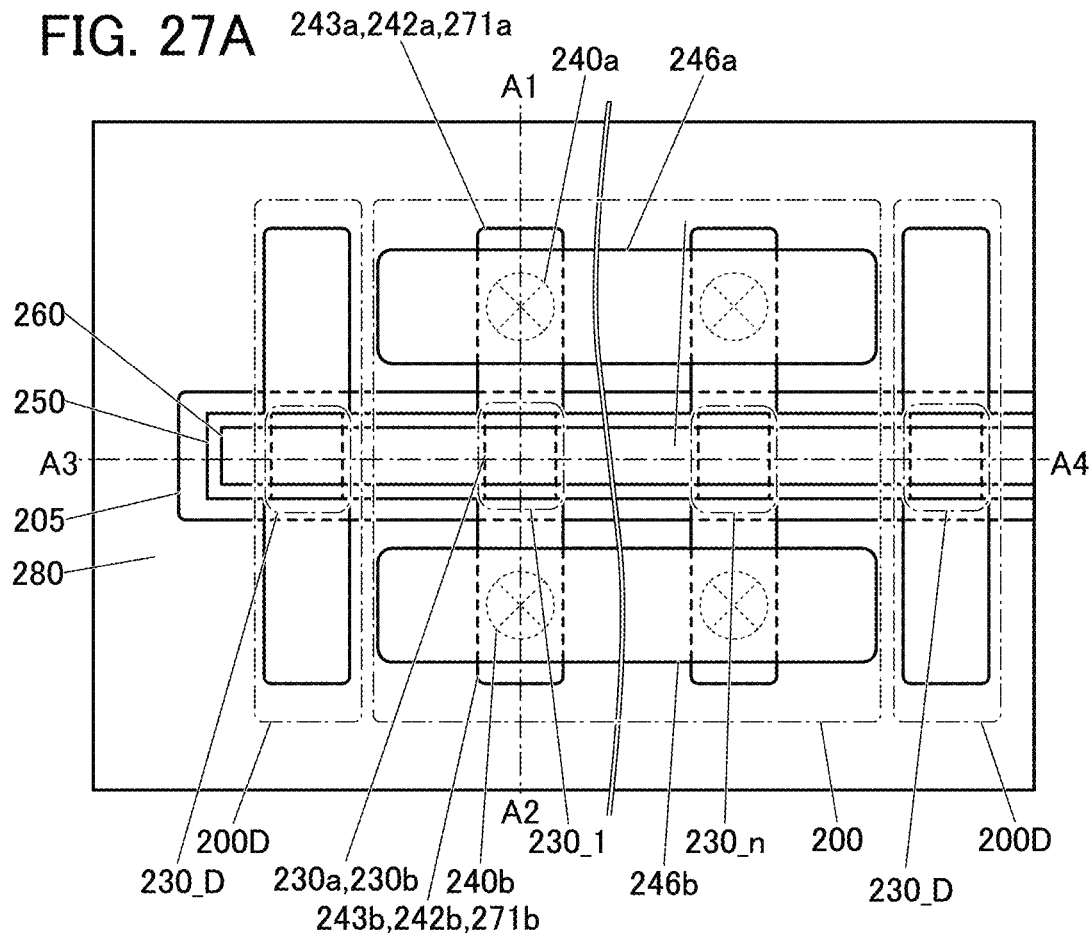
FIG. 27A is a top view of a semiconductor device of one embodiment of the present invention.

FIG. 27A is a top view of the semiconductor device. FIG. 27B is a cross-sectional view corresponding to a portion indicated by dashed-dotted line A3-A4 in FIG. 27A. Note that the cross-sectional view corresponding to a portion indicated by dashed-dotted line A1-A2 in FIG. 27A can be referred to for the transistor 200 illustrated in FIG. 3B. Note that for clarity of the drawing, some components are not illustrated in the top view of FIG. 27A.

Figure 27B:
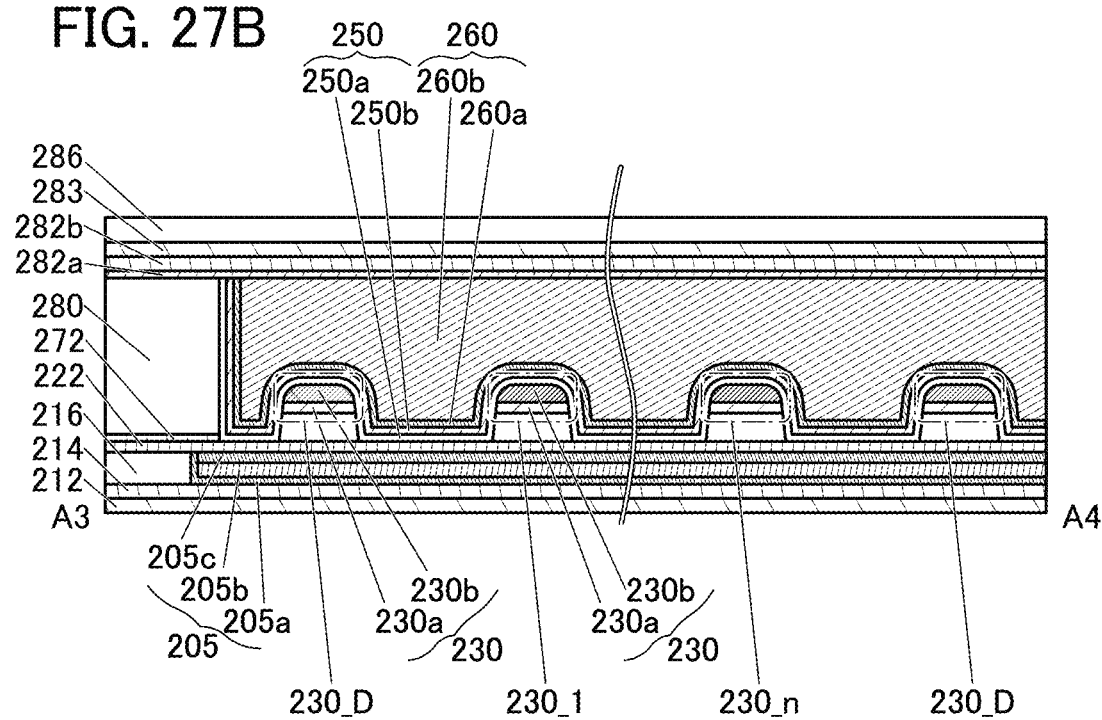
FIG. 27B is a cross-sectional view of the semiconductor device of one embodiment of the present invention.

Note that in the semiconductor device illustrated in FIG. 27A and FIG. 27B, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

The semiconductor device illustrated in FIG. 27A and FIG. 27B is a modification example of the semiconductor device illustrated in FIG. 26A and FIG. 26B. In the semiconductor device illustrated in FIG. 27A and FIG. 27B, the transistor 200 includes n oxides 230 (oxide 230_1 to oxide 230_n: n is a natural number). Each of the oxide 230_1 to the oxide 230_n includes a channel formation region.

In the semiconductor device illustrated in FIG. 27A and FIG. 27B, the conductor 260 is provided over top surfaces and side surfaces of a plurality of channel formation regions with the insulator 250 therebetween. The conductor 246 (the conductor 246a and the conductor 246b) extends in the A3-A4 direction and is electrically connected to the oxide 230_1 to the oxide 230_n through the conductor 240.

The semiconductor device illustrated in FIG. 27A and FIG. 27B includes transistors 200D on both sides of the transistor 200 including the plurality of channel formation regions. The transistor 200D including at least an oxide 230_D is placed in adjacent to the oxide 230_1 placed on an end portion of the transistor 200. Similarly, the transistor 200D is placed in adjacent to the oxide 230_n placed on an end portion of the transistor 200.

That is, the semiconductor device illustrated in FIG. 27A and FIG. 27B is different from the semiconductor device illustrated in FIG. 26A and FIG. 26B in including the transistor(s) 200D on one or both end portions in the direction in which the plurality of channel formation regions of the transistor 200 are arranged in parallel.

Here, the transistor 200D is not necessarily electrically connected to any one of or all of a gate wiring, a source wiring, and a drain wiring. In other words, the transistor 200D is provided in a state of not functioning as a transistor in some cases. Accordingly, the transistor 200D is referred to as a dummy transistor (a sacrificial transistor) in some cases.

It is preferable that the shortest distance between the oxide 230_D and the oxide 230_1 be substantially equal to the shortest distance between the oxide 230_1 and the oxide 230_2. Similarly, it is preferable that the shortest distance between the oxide 230_D and the oxide 230_n be substantially equal to the shortest distance between the oxide 230_n-1 and the oxide 230_n. Note that in the case where n is 1, the shortest distance between one of the oxides 230_D and the oxide 230_1 is preferably substantially equal to the shortest distance between the other oxide 230_D and the oxide_1.

In addition, the shortest distance between the conductor 242a and the conductor 242b in the oxide 230_D is substantially equal to or longer than the shortest distance between the conductor 242a and the conductor 242b in the oxide 230_1 in some cases. Similarly, the shortest distance between the conductor 242a and the conductor 242b in the oxide 230_D is substantially equal to or longer than the shortest distance between the conductor 242a and the conductor 242b in the oxide 230_n in some cases.

In the case where the plurality of oxides 230 are formed in parallel, the shapes of the oxides 230 positioned on the end portions are easily changed due to processing. In a process in which part of the insulator 280 and a stacked-layer structure over the channel formation region of the oxide 230 are removed to form an opening and part of the top surface of the oxide 230 is exposed, variation in an area of the exposed top surface of the oxide 230 might occur due to an influence of variation in shape of an end portion of a region to be removed (also referred to as an opening), variation in the distance between the oxide 230 and the end portion of the opening, or the like.

Thus, by providing the transistors 200D as illustrated in FIG. 27A and FIG. 27B, even when a shape defect of the oxide 230_D included in the transistor 200D occurs or when a shape defect of the opening over the oxide 230_D occurs, the shape of the oxide 230 formed in a region sandwiched between the transistors 200D has a uniform quality.

Accordingly, when a plurality of transistors 200 are provided, the provision of the transistors 200D adjacent to the transistor 200 can reduce variation in characteristics of the plurality of transistors 200.

When a plurality of oxides 230 are provided at regular intervals in a region, designing of a circuit can be easily achieved by changing a wiring layout.

In the semiconductor device illustrated in FIG. 27A and FIG. 27B, the transistor 200 includes a plurality of channel formation regions with respect to one gate electrode. By including the plurality of channel formation regions, the transistor 200 illustrated in FIG. 27A and FIG. 27B can have a high on-state current. Furthermore, each channel formation region is surrounded by the gate electrode; in other words, an s-channel structure is employed; thus, a high on-state current can be obtained in each channel formation region. In the channel width direction of the transistor 200, when the bottom surface of the insulator 222 is regarded as a basis, the level of the bottom surface of the conductor 260 in the region where the conductor 260 and the oxide 230b do not overlap with each other is lower than the level of the interface between the uppermost surface of the oxide 230b and the insulator 250; therefore, a high on-state current can be obtained in the channel formation regions.

Note that for other components, the components of the semiconductor device illustrated in FIG. 3A to FIG. 3D can be referred to.

<Modification Example 4 of Semiconductor Device>

An example of the semiconductor device of one embodiment of the present invention will be described below with reference to FIG. 28A and FIG. 28B.

Figure 28A:
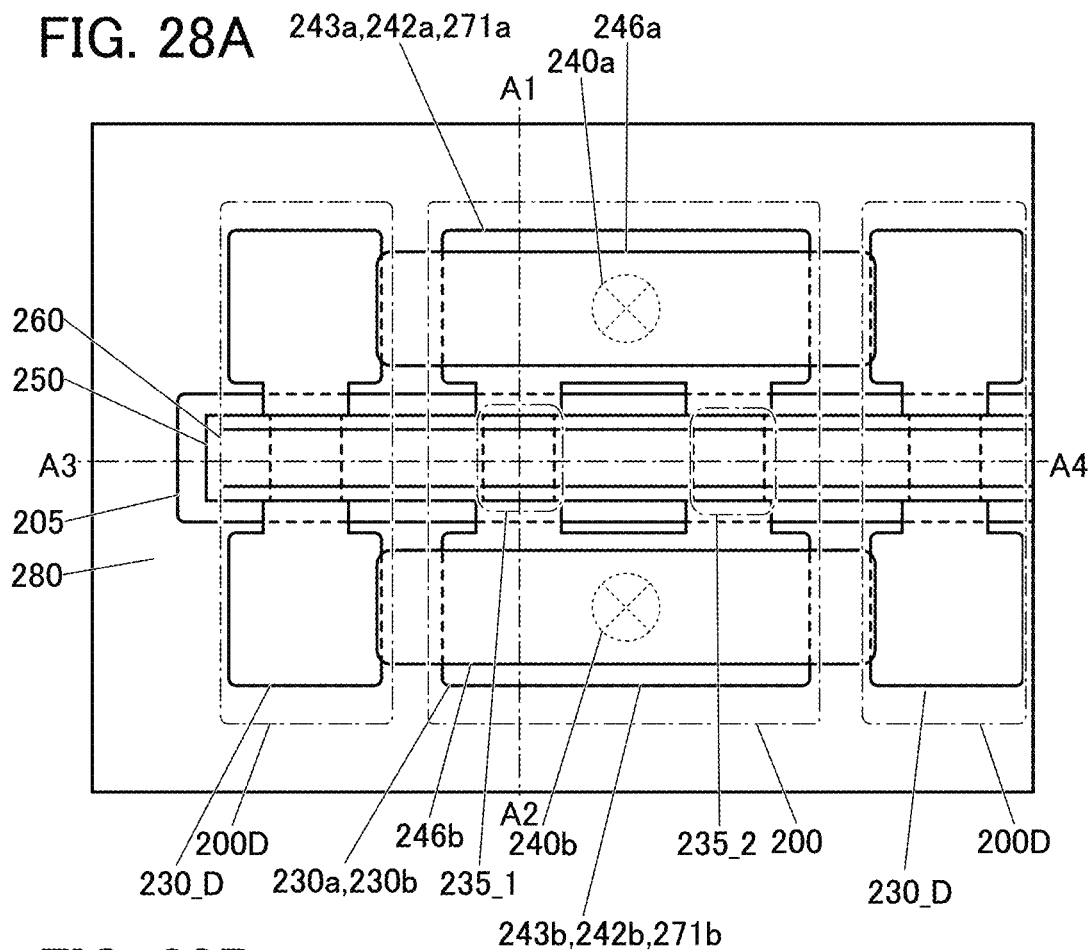
FIG. 28A is a top view of a semiconductor device of one embodiment of the present invention.

FIG. 28A is a top view of the semiconductor device. FIG. 28B is a cross-sectional view corresponding to a portion indicated by dashed-dotted line A3-A4 in FIG. 28A. Note that the cross-sectional view corresponding to a portion indicated by dashed-dotted line A1-A2 in FIG. 28A can be referred to for the transistor 200 illustrated in FIG. 3B. Note that for clarity of the drawing, some components are not illustrated in the top view of FIG. 28A.

Figure 28B:
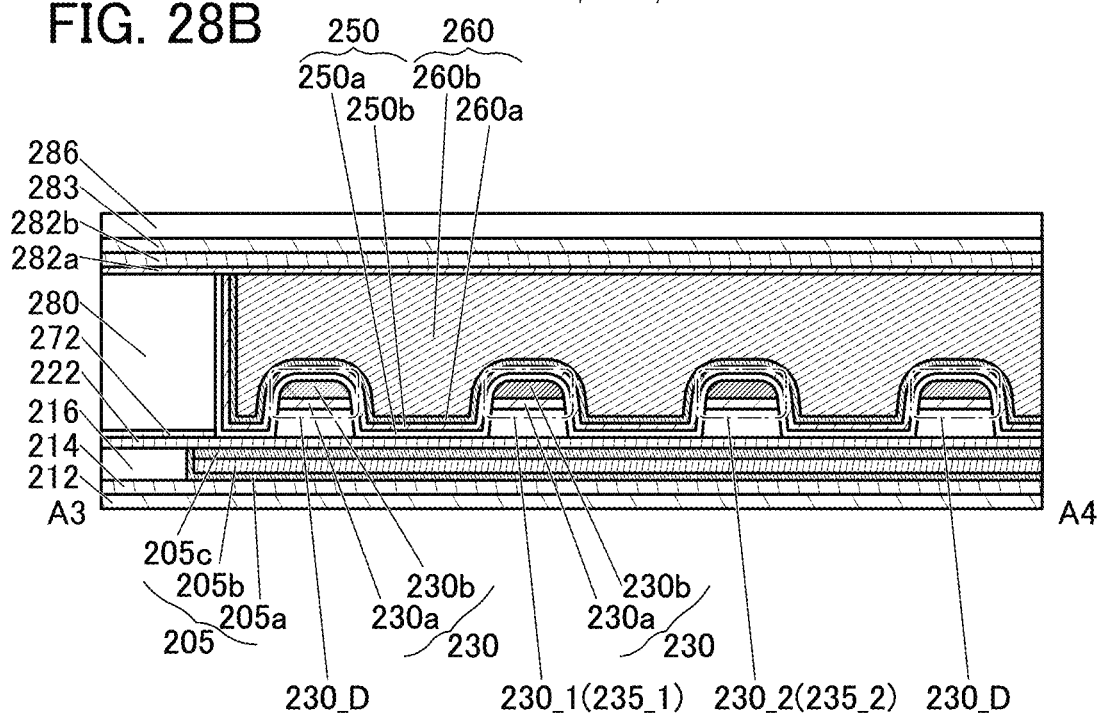
FIG. 28B is a cross-sectional view of the semiconductor device of one embodiment of the present invention.

Note that in the semiconductor device illustrated in FIG. 28A and FIG. 28B, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

The semiconductor device described in this section is a modification example of the semiconductor device illustrated in FIG. 27A and FIG. 27B. The transistor 200 is different from the semiconductor device illustrated in FIG. 27A and FIG. 27B in including the oxide 230 including n channel formation regions (note that the n channel formation regions are a channel formation region 235_1 to a channel formation region 235_*n*: n is a natural number). The conductor 260 is provided over top surfaces and side surfaces of a plurality of channel formation regions with the insulator 250 therebetween.

The conductor 242 (the conductor 242*a* and the conductor 242*b*) extends in the A3-A4 direction and is electrically connected to the conductor 246 (the conductor 246*a* and the conductor 246*b*) through the conductor 240 (the conductor 240*a* and the conductor 240*b*).

Here, for simplifying description, FIG. 28A and FIG. 28B illustrate the case where n=2. Thus, the transistor 200 includes the oxides 230 including two channel formation regions (the channel formation region 235_1 and the channel formation region 235_2).

In the oxide 230, a source region and a drain region are electrically connected to the conductor 242*a* or the conductor 242*b*. Thus, for example, when the conductor 242*a* and the conductor 246*a* are electrically connected with each other through at least one or more conductors 240*a*, a voltage can be applied to the plurality of channel formation regions (the channel formation region 235_1 to the channel formation region 235_*n*).

That is, n conductors 240 are not necessarily provided for n channel formation regions 235 in the transistor 200. For n channel formation regions in the transistor, the number of conductors 240 is preferably greater than or equal to 1, further preferably greater than or equal to 1 and less than n.

Note that with miniaturization of the transistor, the size of a plug electrically connecting the transistor and a conductor functioning as a wiring also needs to be reduced. The wiring resistance tends to increase when a contact area between a conductor functioning as a plug and the conductor functioning as a wiring becomes small.

In the semiconductor device described in this section, plugs in the number which is smaller than n is provided for the transistor 200 including n channel formation regions; thus, the size of each of the conductors 240 functioning as plugs can be larger than that of the conductor 240 in the semiconductor device illustrated in FIG. 27A and FIG. 27B, so that the power consumption can be reduced.

The semiconductor device illustrated in FIG. 28A and FIG. 28B includes the transistors 200D on both sides of the transistor 200 including the plurality of channel formation regions. The transistor 200D including at least the oxide 230_D is placed in adjacent to the oxide 230_1 placed on an end portion of the transistor 200. Similarly, the transistor 200D is placed in adjacent to the oxide 230_2 placed on an end portion of the transistor 200.

Accordingly, in the semiconductor device illustrated in FIG. 28A and FIG. 28B, the conductor 260 is provided over top surfaces and side surfaces of the plurality of channel formation regions with the insulator 250 therebetween. The conductor 246*a* and the conductor 246*b* extend in the A3-A4 direction and are electrically connected to the oxide 230_2.

The semiconductor device illustrated in FIG. 28A and FIG. 28B includes the transistors 200D on both sides of the transistor 200 including the plurality of channel formation regions. The transistor 200D including at least the oxide 230_D is placed in adjacent to the channel formation region 235_1 placed on an end portion of the transistor 200. Similarly, the transistor 200D is placed in adjacent to the channel formation region 235_*n* placed on an end portion of the transistor 200.

That is, the transistor(s) 200D is/are provided on one or both end portions in the direction in which the plurality of channel formation regions of the transistor 200 are arranged in parallel.

Here, the transistor 200D is not necessarily electrically connected to any one of or all of a gate wiring, a source wiring, and a drain wiring. In other words, the transistor 200D is provided in a state of not functioning as a transistor in some cases. Accordingly, the transistor 200D is referred to as a dummy transistor (a sacrificial transistor) in some cases.

It is preferable that the shortest distance between the oxide 230_D and the oxide 230_1 be substantially equal to the shortest distance between the oxide 230_1 and the oxide 230_2. Similarly, it is preferable that the shortest distance between the oxide 230_D and the oxide 230_*n* be substantially equal to the shortest distance between an oxide 230_*n*-1 and the oxide 230_*n*. Note that in the case where n is 1, the shortest distance between one of the oxides 230_D and the oxide 230_1 is preferably substantially equal to the shortest distance between the other oxide 230_D and the oxide_1.

In addition, the shortest distance between the conductor 242*a* and the conductor 242*b* in the oxide 230_D is substantially equal to or longer than the shortest distance between the conductor 242*a* and the conductor 242*b* in the oxide 230_1 in some cases. Similarly, the shortest distance between the conductor 242*a* and the conductor 242*b* in the oxide 230_D is substantially equal to or longer than the shortest distance between the conductor 242*a* and the conductor 242*b* in the oxide 230_*n* in some cases.

Note that the difference between the shortest distance between the conductor 242*a* and the conductor 242*b* in the oxide 230_D and the shortest distance between the conductor 242*a* and the conductor 242*b* in the oxide 230_1 is larger than the difference between the shortest distance between the conductor 242*a* and the conductor 242*b* in the oxide 230_1 (the channel formation region 235_1) and the shortest distance between the conductor 242*a* and the conductor 242*b* in the oxide 230_2 (the channel formation region 235_2) in some cases.

In the case where the plurality of channel formation regions 235 are formed in parallel, the shapes of the channel formation regions 235 positioned on the end portions is easily changed due to processing. In a process in which part of the insulator 280 and a stacked-layer structure over the channel formation region of the oxide 230 are removed to form an opening and part of the top surface of the oxide 230 is exposed, variation in an area of the exposed top surface of the oxide 230 might occur due to an influence of variation in shape of an end portion of a region to be removed (also referred to as an opening), variation in the distance between the oxide 230 and the end portion of the opening, or the like.

Thus, by providing the transistors 200D as illustrated in FIG. 28A and FIG. 28B, even when a shape defect of the oxide 230_D included in the transistor 200D occurs or when a shape defect of the opening over the oxide 230_D occurs, the shape of the oxide 230 formed in a region sandwiched between the transistors 200D has a uniform quality.

Accordingly, when a plurality of transistors 200 are provided, the provision of the transistors 200D adjacent to the transistor 200 can reduce variation in characteristics of the plurality of transistors 200.

In the semiconductor device illustrated in FIG. 28A and FIG. 28B, the transistor 200 includes a plurality of channel formation regions with respect to one gate electrode. By including the plurality of channel formation regions, the transistor 200 illustrated in FIG. 28A and FIG. 28B can have a high on-state current. Furthermore, each channel formation region is surrounded by the gate electrode; in other words, an s-channel structure is employed; thus, a high on-state current can be obtained in each channel formation region. In the channel width direction of the transistor 200, when the bottom surface of the insulator 222 is regarded as a basis, the level of the bottom surface of the conductor 260 in the region where the conductor 260 and the oxide 230b do not overlap with each other is lower than the level of the interface between the uppermost surface of the oxide 230b and the insulator 250; therefore, a high on-state current can be obtained in each channel formation region.

Note that for other components, the components of the semiconductor device illustrated in FIG. 3A to FIG. 3D can be referred to.

<Application Example of Semiconductor Device>

Examples of a semiconductor device of one embodiment of the present invention including the transistor 200 and the opening region 400, which is different from the semiconductor device described in the above <Structure example of semiconductor device> and the above <Modification example of semiconductor device>, will be described below with reference to FIG. 29A and FIG. 29B. Note that in the semiconductor devices illustrated in FIG. 29A and FIG. 29B, structures having the same functions as the structures in the semiconductor device described in <Structure example of semiconductor device> (see FIG. 3A to FIG. 3D) are denoted by the same reference numerals. Note that also in this section, the materials described in detail in <Structure example of semiconductor device> and <Modification example of semiconductor device> can be used as the materials for the transistor 200.

FIG. 29A and FIG. 29B each illustrate a structure in which a plurality of transistors 200_1 to 200_n are collectively sealed with the insulator 283 and the insulator 212. Note that although the transistor 200_1 to the transistor 200_n appear to be arranged in the channel length direction in FIG. 29A and FIG. 29B, the present invention is not limited thereto. The transistor 200_1 to the transistor 200_n may be arranged in the channel width direction or may be arranged in a matrix. Depending on the design, the transistors may be arranged without regularity.

As illustrated in FIG. 29A, the opening region 400 is placed between the adjacent transistors 200. When heat treatment is performed after the formation of the opening region 400 in the manufacturing process of the semiconductor device, oxygen contained in the insulator 280 and hydrogen bonded to the oxygen can be released to the outside through the opening region 400. Note that the hydrogen bonded to oxygen is released as water. Thus, unnecessary oxygen and hydrogen contained in the insulator 280 can be reduced. A portion where the insulator 283 is in contact with the insulator 212 (hereinafter, sometimes referred to as the sealing portion 265) is formed outside the plurality of transistors 200_1 to 200_n. The sealing portion 265 is formed to surround the plurality of transistors 200_1 to 200_n. Such a structure enables the plurality of transistors 200_1 to 200_n to be surrounded by the insulator 283 and the insulator 212. Thus, a plurality of transistor groups surrounded by the sealing portion 265 are provided over a substrate.

A dicing line (sometimes referred to as a scribe line, a dividing line, or a cutting line) may be provided to overlap with the sealing portion 265. The above substrate is divided at the dicing line, so that the transistor group surrounded by the sealing portion 265 is taken out as one chip.

Although the plurality of transistors 200_1 to 200_n are surrounded by one sealing portion 265 in the example illustrated in FIG. 29A, the present invention is not limited thereto. As illustrated in FIG. 29B, the plurality of transistors 200_1 to 200_n may be surrounded by a plurality of sealing portions. In FIG. 29B, the plurality of transistors 200_1 to 200_n are surrounded by a sealing portion 265a and are further surrounded by an outer sealing portion 265b.

When the plurality of transistors 200_1 to 200_n are surrounded by the plurality of sealing portions in this manner, a portion where the insulator 283 is in contact with the insulator 212 increases, which further can improve adhesion between the insulator 283 and the insulator 212. As a result, the plurality of transistors 200_1 to 200_n can be more reliably sealed.

In that case, a dicing line may be provided to overlap with the sealing portion 265a or the sealing portion 265b, or may be provided between the sealing portion 265a and the sealing portion 265b.

One embodiment of the present invention can provide a semiconductor device in which variation of transistor characteristics is small. Another embodiment of the present invention can provide a semiconductor device with favorable reliability. Another embodiment of the present invention can provide a semiconductor device having favorable electrical characteristics. Another embodiment of the present invention can provide a semiconductor device with a high on-state current. Another embodiment of the present invention can provide a semiconductor device that can be miniaturized or highly integrated. Another embodiment of the present invention can provide a semiconductor device with low power consumption.

The structure, method, and the like described in this embodiment can be used in an appropriate combination with other structures, methods, and the like described in this embodiment, the other embodiments, or Examples.

Embodiment 2

In this embodiment, one embodiment of a semiconductor device is described with reference to FIG. 30 to FIG. 35.

[Storage Device 1]

Figure 30:
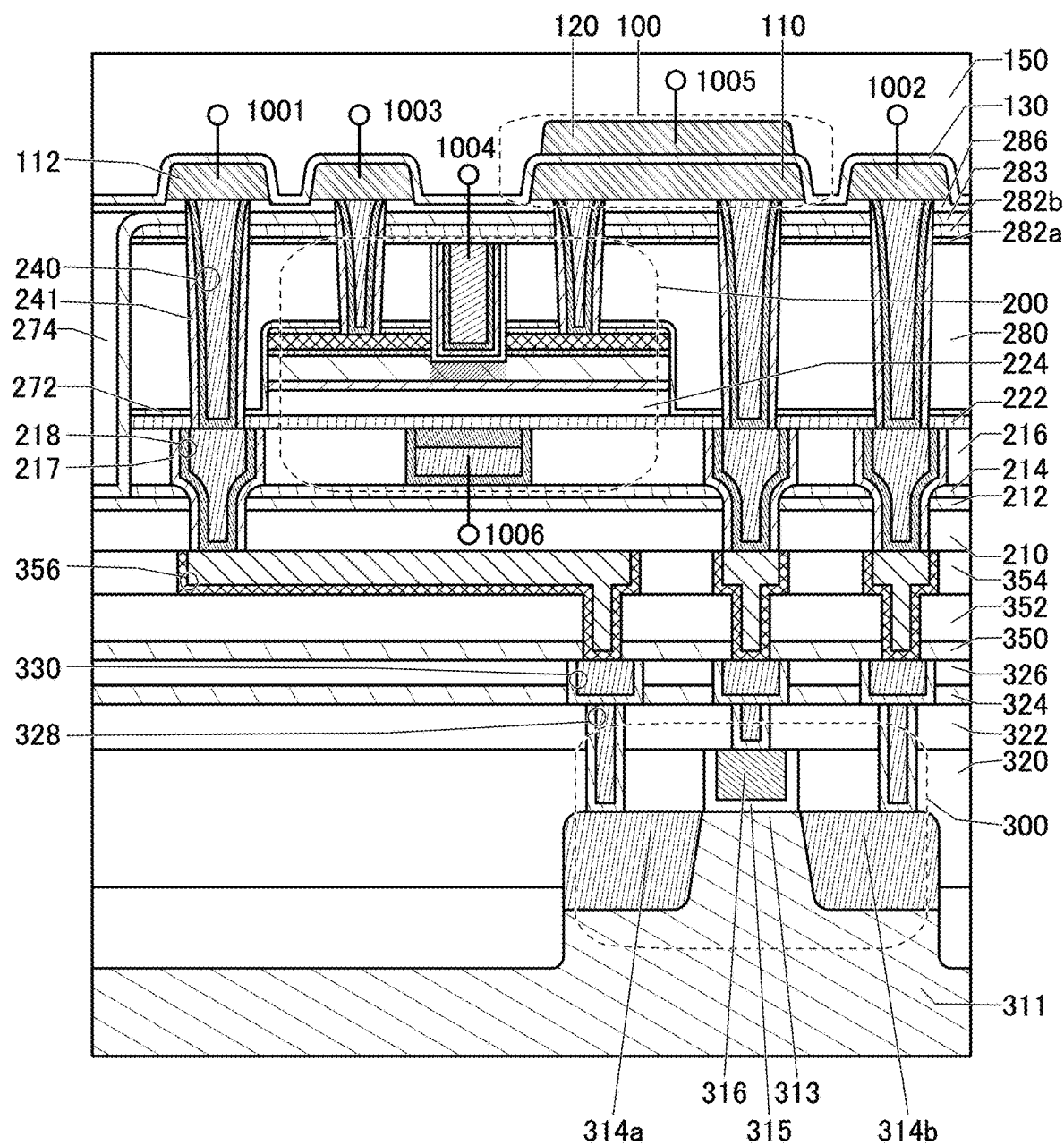
FIG. 30 is a cross-sectional view illustrating a structure of a storage device of one embodiment of the present invention.

FIG. 30 illustrates an example of a semiconductor device (a storage device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor in which a channel is formed in a semiconductor layer containing an oxide semiconductor. The off-state current of the transistor 200 is low;

thus, by using the transistor 200 in a storage device, stored data can be retained for a long time. In other words, such a storage device does not require refresh operation or has extremely low frequency of the refresh operation, which leads to a sufficient reduction in power consumption of the storage device.

In the semiconductor device illustrated in FIG. 30, a wiring 1001 is electrically connected to a source of the transistor 300, and a wiring 1002 is electrically connected to a drain of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The storage devices illustrated in FIG. 30 can form a memory cell array when arranged in a matrix.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 30, the semiconductor region 313 (part of the substrate 311) in which a channel is formed has a protruding shape. In addition, the conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 illustrated in FIG. 30 is an example and the structure is not limited thereto; an appropriate transistor is used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, for the insulator 130, the insulator that can be used for the insulator 286 described in the above embodiment is preferably used.

For example, a conductor 112 and the conductor 110 over the conductor 246 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 30, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Examples of a material with high dielectric strength (a material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to increase planarity.

A wiring layer may be provided over the insulator 326 and the conductor 330. For example, in FIG. 30, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in an insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with a side surface of the conductor 218 functioning as a plug. The insulator 217 is provided in contact with the inner wall of an opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

For the insulator 217, an insulator such as silicon nitride, aluminum oxide, or silicon nitride oxide may be used. Since the insulator 217 is provided in contact with the insulator 210, the insulator 212, the insulator 214, and the insulator 222, the entry of impurities such as water and hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride is deposited by a PEALD method and an opening reaching the conductor 356 is formed by anisotropic etching.

As an insulator that can be used for an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, parasitic capacitance generated between wirings can be reduced. Thus, a material is preferably selected depending on the function of an insulator.

For example, the insulator 150, the insulator 210, the insulator 352, the insulator 354, and the like preferably include an insulator having a low relative permittivity. For example, the insulator preferably contains silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having a high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to form the plugs and the wirings with a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the conductor 240 and the insulator 224 and the insulator 280 that contain excess oxygen in FIG. 30. Since the insulator 241 is provided in contact with the insulator 222, the insulator 282, and the insulator 283, the insulator 224 and the transistor 200 can be sealed with the insulators having a barrier property.

That is, the insulator 241 can inhibit excess oxygen contained in the insulator 224 and the insulator 280 from being absorbed by the conductor 240. In addition, diffusion of hydrogen, which is an impurity, into the transistor 200 through the conductor 240 can be inhibited when the insulator 241 is provided.

The insulator 241 is preferably formed using an insulating material having a function of inhibiting diffusion of impurities such as water and hydrogen and oxygen. For example, silicon nitride, silicon nitride oxide, aluminum oxide, hafnium oxide, or the like is preferably used. In particular, silicon nitride is preferably used because silicon nitride has a high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As described in the above embodiment, the transistor 200 may be sealed with the insulator 212, the insulator 214, the insulator 282, and the insulator 283. Such a structure can inhibit entry of hydrogen contained in the insulator 274, the insulator 150, or the like into the insulator 280 or the like.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 274 or the like can be inhibited from entering from the outside.

<Dicing Line>

A dicing line (sometimes referred to as a scribe line, a dividing line, or a cutting line) which is provided when a large-sized substrate is divided into semiconductor elements so that a plurality of semiconductor devices are each formed in a chip form will be described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 30, a region in which the insulator 283 and the insulator 212 are in contact with each other is preferably designed to overlap with the dicing line. That is, an opening is provided in the insulator 282, the insulator 280, the insulator 272, the insulator 224, the insulator 222, the insulator 216, and the insulator 214 in the vicinity of a region to be the dicing line that is provided on an outer edge of the memory cell including the plurality of transistors 200.

That is, in the opening provided in the insulator 282, the insulator 280, the insulator 272, the insulator 224, the insulator 222, the insulator 216, and the insulator 214, the insulator 212 is in contact with the insulator 283. For example, the insulator 212 and the insulator 283 may be formed using the same material and the same method. When the insulator 212 and the insulator 283 are formed using the same material and the same method, the adhesion therebetween can be increased. For example, silicon nitride is preferably used.

With such a structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen and water from the direction of the side surface of the divided substrate into the transistor 200 can be inhibited.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 31:
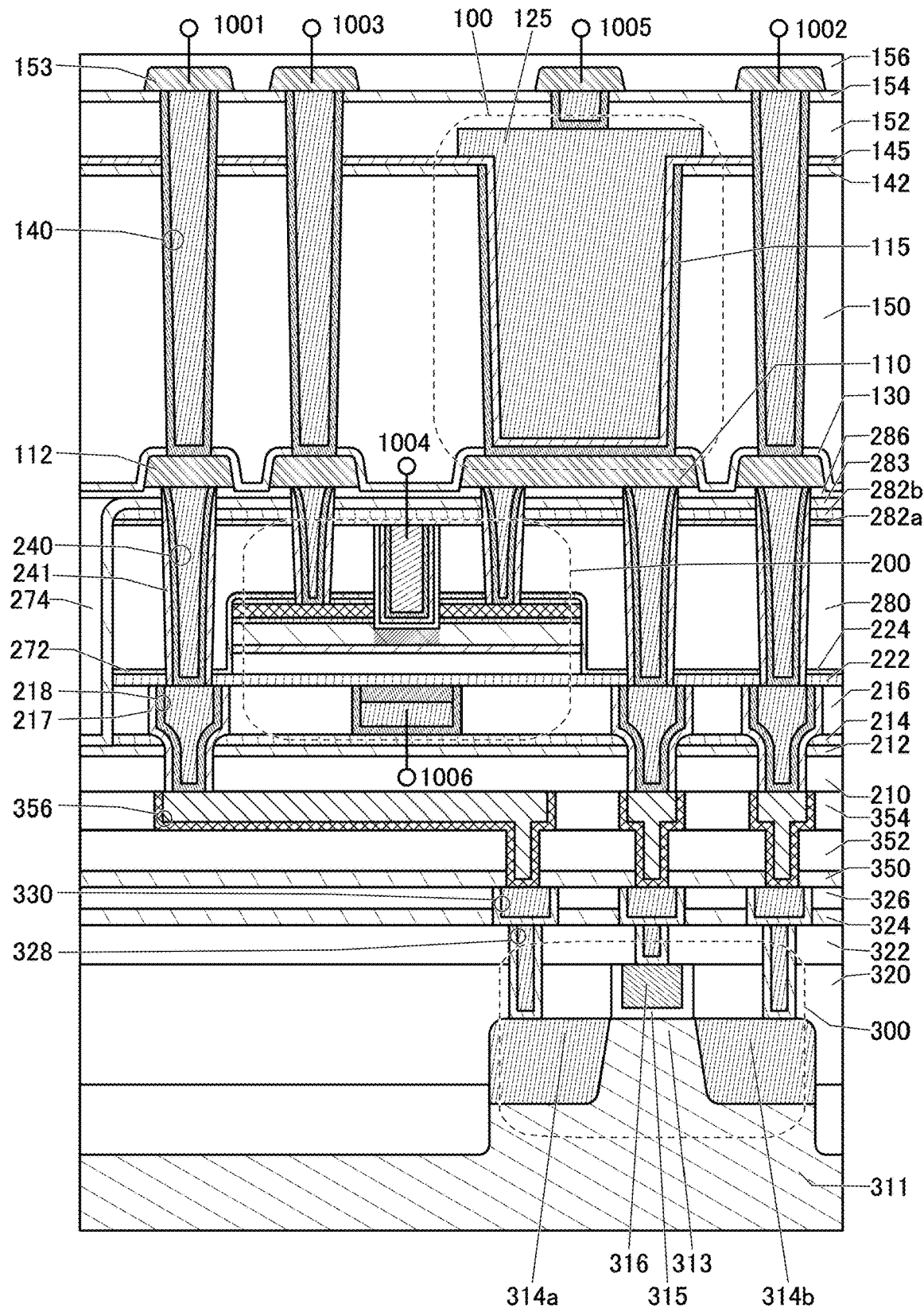
FIG. 31 is a cross-sectional view illustrating a structure of a storage device of one embodiment of the present invention.

Note that although the capacitor 100 of the storage device illustrated in FIG. 30 has a planar shape, the storage device described in this embodiment is not limited thereto. For example, the capacitor 100 may have a cylindrical shape as illustrated in FIG. 31. Note that the structure below and including the insulator 150 of a storage device illustrated in FIG. 31 is similar to that of the semiconductor device illustrated in FIG. 30.

The capacitor 100 illustrated in FIG. 31 includes the insulator 150 over the insulator 130, an insulator 142 over the insulator 150, a conductor 115 placed in an opening formed in the insulator 150 and the insulator 142, an insulator 145 over the conductor 115 and the insulator 142, a conductor 125 over the insulator 145, and an insulator 152 over the conductor 125 and the insulator 145. Here, at least parts of the conductor 115, the insulator 145, and the conductor 125 are placed in the opening formed in the insulator 150 and the insulator 142.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric positioned therebetween on the side surface as well as the bottom surface of the opening in the insulator 150 and the insulator 142; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used for the insulator 280 can be used for the insulator 152. The insulator 142 preferably functions as an etching stopper at the time of forming the opening in the insulator 150 and is formed using an insulator that can be used for the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 115 is placed in contact with the opening formed in the insulator 142 and the insulator 150. A top surface of the conductor 115 is preferably substantially level with a top surface of the insulator 142. Furthermore, a bottom surface of the conductor 115 is in contact with the conductor 110 through an opening in the insulator 130. The conductor 115 is preferably deposited by an ALD method, a CVD method, or the like; for example, a conductor that can be used for the conductor 205 is used.

The insulator 145 is placed to cover the conductor 115 and the insulator 142. The insulator 145 is preferably deposited by an ALD method or a CVD method, for example. The insulator 145 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with high dielectric strength, such as silicon oxynitride, or a high permittivity (high-k) material is preferably used. Alternatively, a stacked-layer structure using a material with a high dielectric strength and a high permittivity (high-k) material may be employed.

As an insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 145 has a large thickness. When the insulator 145 has a large thickness, leakage current generated between the conductor 115 and the conductor 125 can be inhibited.

Examples of a material with a high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. Alternatively, an insulating film in which zirconium oxide, silicon oxide deposited by an ALD method, and zirconium oxide are stacked in this order can be used. The use of such an insulator with a high dielectric strength can increase the dielectric strength and inhibit electrostatic breakdown of the capacitor 100.

The conductor 125 is placed to fill the opening formed in the insulator 142 and the insulator 150. The conductor 125 is electrically connected to the wiring 1005 through a conductor 140 and a conductor 153. The conductor 125 is preferably deposited by an ALD method, a CVD method, or the like and is formed using a conductor that can be used for the conductor 205, for example.

The conductor 153 is provided over an insulator 154 and is covered with an insulator 156. The conductor 153 is formed using a conductor that can be used for the conductor 112, and the insulator 156 is formed using an insulator that can be used for the insulator 152. Here, the conductor 153 is in contact with a top surface of the conductor 140 and functions as a terminal of the capacitor 100, the transistor 200, or the transistor 300.

[Storage Device 2]

Figure 32A:
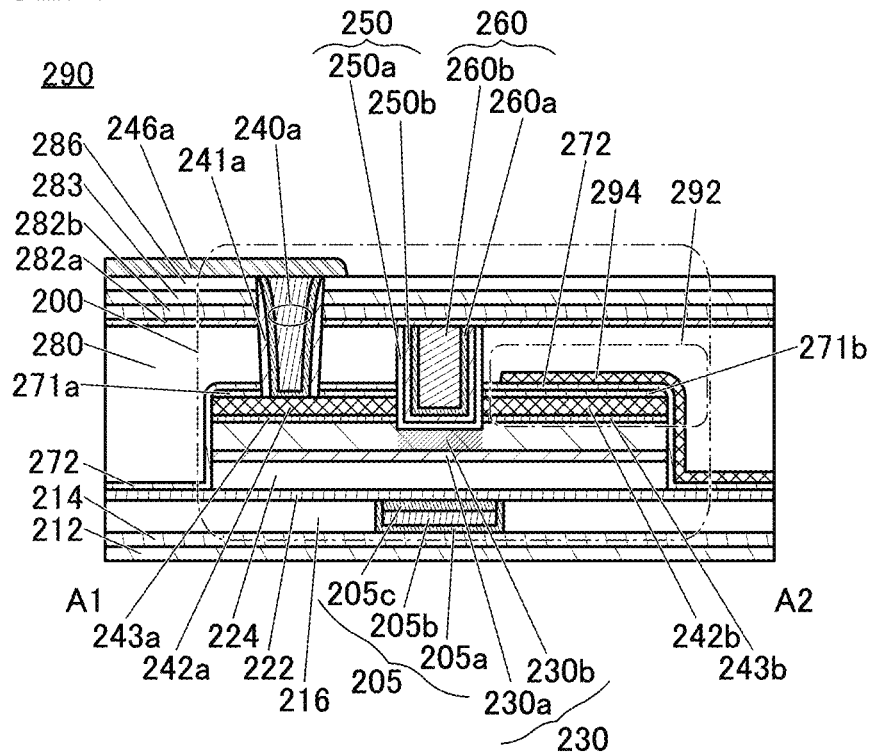
FIG. 32A and FIG. 32B are cross-sectional views of semiconductor devices of one embodiment of the present invention.
Figure 32B:
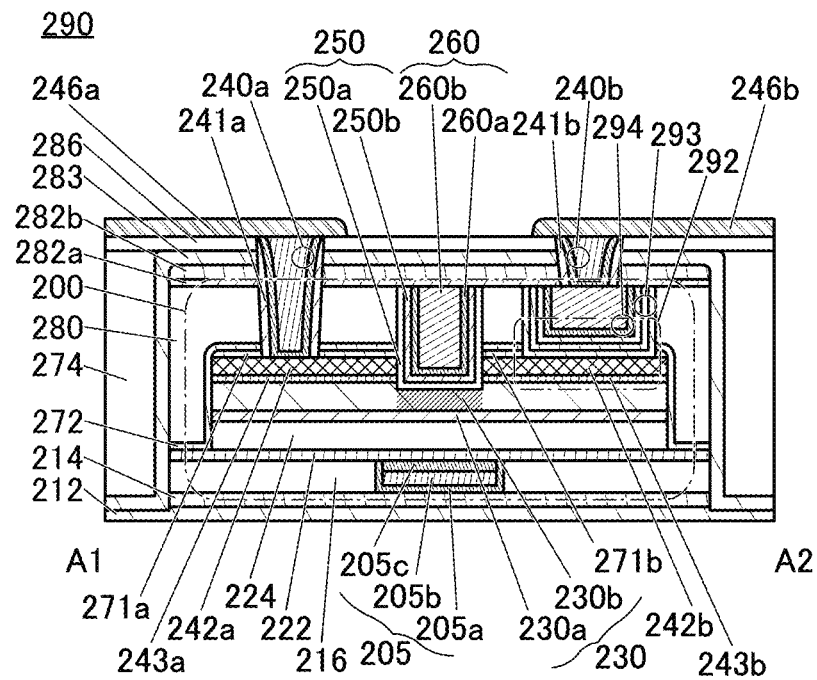

FIG. 32A and FIG. 32B illustrate an example of a semiconductor device (a storage device) of one embodiment of the present invention.

<Structure Example 1 of Memory Device>

FIG. 32A is a cross-sectional view of a semiconductor device including a memory device 290. The memory device 290 in FIG. 32A includes a capacitor device 292 besides the transistor 200 illustrated in FIG. 3A to FIG. 3D. FIG. 32A corresponds to a cross-sectional view of the transistor 200 in the channel length direction.

The capacitor device 292 includes the conductor 242b, the insulator 271b provided over the conductor 242b, the insulator 272 provided in contact with the top surface of the insulator 271b, the side surface of the insulator 271b, and the side surface of the conductor 242b, and a conductor 294 over the insulator 272. In other words, the capacitor device 292 forms a MIM (Metal-Insulator-Metal) capacitor. Note that one of a pair of electrodes included in the capacitor device 292, i.e., the conductor 242b, can also serve as the source electrode of the transistor. The dielectric layer included in the capacitor device 292 can also serve as a protective layer provided in the transistor, i.e., the insulator 271 and the insulator 272. Thus, the manufacturing process of the capacitor device 292 can also serve as part of the manufacturing process of the transistor; therefore, the productivity of the semiconductor device can be improved. Furthermore, one of a pair of electrodes included in the capacitor device 292, that is, the conductor 242b, also serves as the source electrode of the transistor; therefore, the area in which the transistor and the capacitor device are placed can be reduced.

Note that the conductor 294 can be formed using, for example, a material that can be used for the conductor 242.

<Structure Example 2 of Memory Device>

FIG. 32B is a cross-sectional view of a semiconductor device including the memory device 290, which has a structure different from the structure illustrated in FIG. 32A. The memory device 290 in FIG. 32B includes the capacitor device 292 besides the transistor 200 illustrated in FIG. 3A to FIG. 3D. Here, part of the capacitor device 292 in FIG. 32B is provided in an opening formed in the insulator 280, the insulator 272, and the insulator 271b, which is different from the capacitor device 292 in FIG. 32A. FIG. 32B corresponds to a cross-sectional view of the transistor 200 in the channel length direction.

The capacitor device 292 includes the conductor 242b, an insulator 293 provided over the conductor 242b, and the conductor 294 provided over the insulator 293. Here, the insulator 293 and the conductor 294 are placed in the opening formed in the insulator 280, the insulator 272, and the insulator 271b. The insulator 293 is provided in contact with a bottom surface and a side wall of the opening. That is, the insulator 293 is in contact with the top surface of the conductor 242b, the side surface of the insulator 271b, the side surface of the insulator 272, and the side surface of the insulator 280. The insulator 293 is provided to form a depressed portion along the shape of the opening. The conductor 294 is placed in contact with a top surface and a side surface of the insulator 293 so as to fill the depressed portion. Note that the top-surface levels of the insulator 293 and the conductor 294 are substantially aligned with the top-surface levels of the insulator 280, the insulator 250, and the conductor 260 in some cases.

Here, the conductor 242b functions as a lower electrode of the capacitor device 292, the conductor 294 functions as an upper electrode of the capacitor device 292, and the insulator 293 functions as a dielectric of the capacitor device 292. Thus, the capacitor device 292 forms an MIM capacitor. Note that one of a pair of electrodes included in the capacitor device 292, i.e., the conductor 242b, can also serve as the source electrode of the transistor. Thus, the manufacturing process of the capacitor device 292 can also serve as part of the manufacturing process of the transistor; therefore, the productivity of the semiconductor device can be improved. Since the insulator 293 can be provided independently of the structure of the transistor 200, a structure and a material of the insulator 293 can be selected as appropriate in accordance with performance required for the capacitor device 292. Furthermore, one of a pair of electrodes included in the capacitor device 292, that is, the conductor 242b, also serves as the source electrode of the transistor; therefore, the area in which the transistor and the capacitor device are placed can be reduced.

A high dielectric constant (high-k) material is preferably used for the insulator 293. Examples of an insulator of a high dielectric constant (high-k) material (a material having a high relative dielectric constant) include gallium oxide, hafnium oxide, zirconium oxide, aluminum oxide, aluminum oxynitride, aluminum nitride oxide, aluminum nitride, hafnium oxide, hafnium oxynitride, hafnium nitride oxide, hafnium nitride, oxide containing aluminum and hafnium, oxynitride containing aluminum and hafnium, oxide containing silicon and hafnium, oxynitride containing silicon and hafnium, and nitride containing silicon and hafnium. The insulator 293 may have a stacked structure of these high dielectric constant materials. As the insulator 293, an insulating film in which zirconium oxide, aluminum oxide, and zirconium oxide are stacked in this order can be used, for example.

The conductor 294 can be formed using, for example, a material that can be used for the conductor 260. The conductor 294 may have a stacked-layer structure like the conductor 260.

The insulator 293 and the conductor 294 may be formed before the deposition of the insulator 282, that is, before the step illustrated in FIG. 18. The insulator 293 and the conductor 294 can be formed by a method similar to the method for forming the insulator 250 and the conductor 260. That is, the insulator 293 and the conductor 294 may be formed in such a manner that an opening is formed in the insulator 280, the insulator 272, and the insulator 271b, a stacked film to be the insulator 293 and the conductor 294 is deposited to fill the opening, and the stacked film is partly removed by CMP treatment.

<Modification Example of Memory Device>

Examples of a semiconductor device of one embodiment of the present invention including the transistor 200, the opening region 400, and the capacitor device 292, which are different from the one described above in <Structure example 1 of memory device>, will be described below with reference to FIG. 33A, FIG. 33B, FIG. 34, and FIG. 35. Note that in the semiconductor devices illustrated in FIG. 33A, FIG. 33B, FIG. 34, and FIG. 35, structures having the same function as those included in the semiconductor devices described in the above embodiment and <Structure example 1 of memory device> (see FIG. 32A) are denoted by the same reference numerals. Note that the materials described in detail in the above embodiment and <Structure example 1 of memory device> can be used as constituent materials of the transistor 200, the opening region 400, and the capacitor device 292 in this section. The memory devices in FIG. 33A, FIG. 33B, FIG. 34, FIG. 35, and the like are the memory device illustrated in FIG. 32A, but not limited to this. For example, the memory device illustrated in FIG. 32B or the like may be used.

<<Modification Example 1 of Memory Device>>

An example of a semiconductor device 600 of one embodiment of the present invention including a transistor 200a, a transistor 200b, a capacitor device 292a, and a capacitor device 292b is described below with reference to FIG. 33A.

Figure 33A:
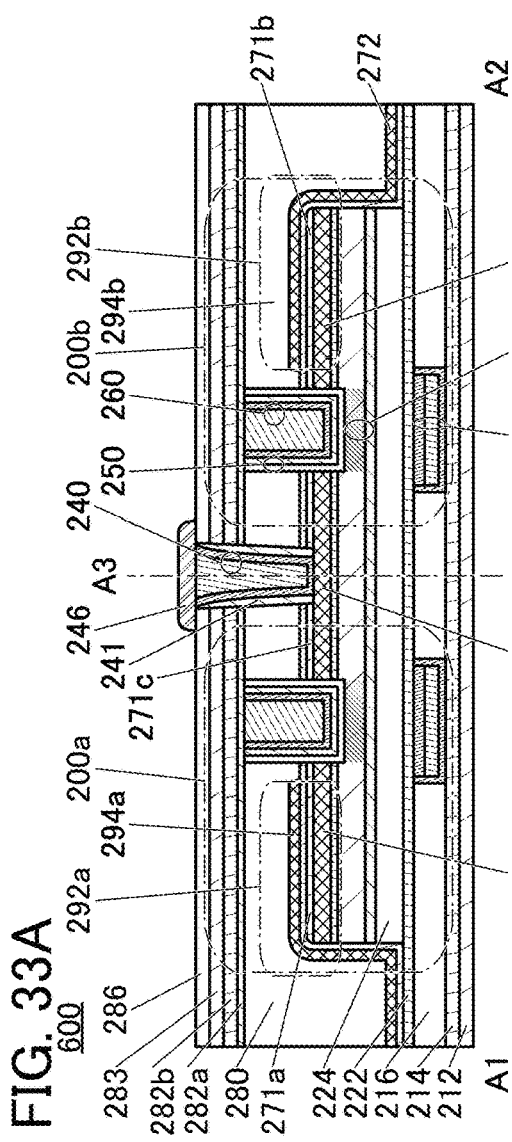
FIG. 33A and FIG. 33B are cross-sectional views of semiconductor devices of one embodiment of the present invention.

FIG. 33A is a cross-sectional view of the semiconductor device 600 including the transistor 200a, the transistor 200b, the capacitor device 292a, and the capacitor device 292b in the channel length direction. Here, the capacitor device 292a includes the conductor 242a, the insulator 271a over the conductor 242a, the insulator 272 in contact with the top surface of the insulator 271a, the side surface of the insulator 271a, and the side surface of the conductor 242a, and a conductor 294a over the insulator 272. The capacitor device 292b includes the conductor 242b, the insulator 271b over the conductor 242b, the insulator 272 in contact with the top surface of the insulator 271b, the side surface of the insulator 271b, and the side surface of the conductor 242b, and a conductor 294b over the insulator 272.

The semiconductor device 600 has a line-symmetric structure with respect to dashed-dotted line A3-A4 as illustrated in FIG. 33A. A conductor 242c serves as one of a source electrode and a drain electrode of the transistor 200a and one of a source electrode and a drain electrode of the transistor 200b. An insulator 271c is provided over the conductor 242c. The conductor 240 functioning as a plug connects the conductor 246 functioning as a wiring to the transistor 200a and the transistor 200b. Accordingly, when the connection of the two transistors, the two capacitor devices, the wiring, and the plug has the above-described structure, a semiconductor device that can be miniaturized or highly integrated can be provided.

The structure example of the semiconductor device in FIG. 32A can be referred to for the structures and the effects of the transistor 200a, the transistor 200b, the capacitor device 292a, and the capacitor device 292b.

<<Modification Example 2 of Memory Device>>

Figure 33B:
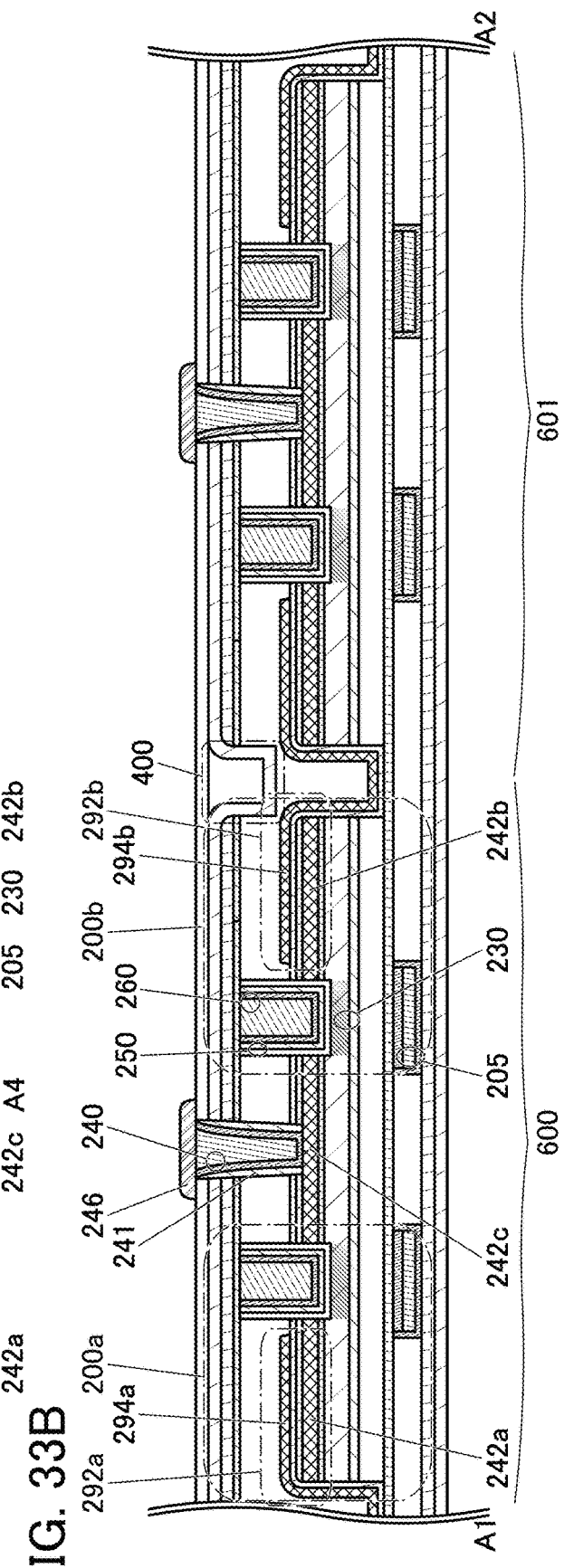

In the above description, the semiconductor device including the transistor 200a, the transistor 200b, the capacitor device 292a, and the capacitor device 292b is given as a structure example; however, the semiconductor device of this embodiment is not limited thereto. For example, as illustrated in FIG. 33B, a structure in which the semiconductor device 600 and a semiconductor device having a structure similar to that of the semiconductor device 600 are connected through a capacitor portion may be employed. In addition, a structure in which the opening region 400 is placed between the semiconductor device 600 and a semiconductor device having a structure similar to that of the semiconductor device 600, which are adjacent to each other, may be employed. In this specification, the semiconductor device including the transistor 200a, the transistor 200b, the capacitor device 292a, and the capacitor device 292b is referred to as a cell. For the structures of the transistor 200a, the transistor 200b, the capacitor device 292a, and the capacitor device 292b, the above description of the transistor 200a, the transistor 200b, the capacitor device 292a, and the capacitor device 292b can be referred to.

FIG. 33B is a cross-sectional view in which the semiconductor device 600 including the transistor 200a, the transistor 200b, the capacitor device 292a, and the capacitor device 292b, and a cell having a structure similar to that of the semiconductor device 600 are connected through a capacitor portion.

As illustrated in FIG. 33B, the conductor 294b functioning as one electrode of the capacitor device 292b included in the semiconductor device 600 also serves as one electrode of a capacitor device included in a semiconductor device 601 having a structure similar to that of the semiconductor device 600. Although not illustrated, the conductor 294a functioning as one electrode of the capacitor device 292a included in the semiconductor device 600 also serves as one electrode of a capacitor device included in a semiconductor device on the left side of the semiconductor device 600, that is, a semiconductor device adjacent to the semiconductor device 600 in the A1 direction in FIG. 33B. The cell on the right side of the semiconductor device 601, that is, the cell in the A2 direction in FIG. 33B, has a similar structure. That is, a cell array (also referred to as a memory device layer) can be formed. With this structure of the cell array, the space between the adjacent cells can be reduced; thus, the projected area of the cell array can be reduced and high integration can be achieved. When the cells illustrated in FIG. 33B are arranged in a matrix, a matrix-shape cell array can be formed.

When the transistor 200a, the transistor 200b, the capacitor device 292a, and the capacitor device 292b are formed to have the structures described in this embodiment as described above, the area of the cell can be reduced and the semiconductor device including a cell array can be miniaturized or highly integrated.

Figure 34:
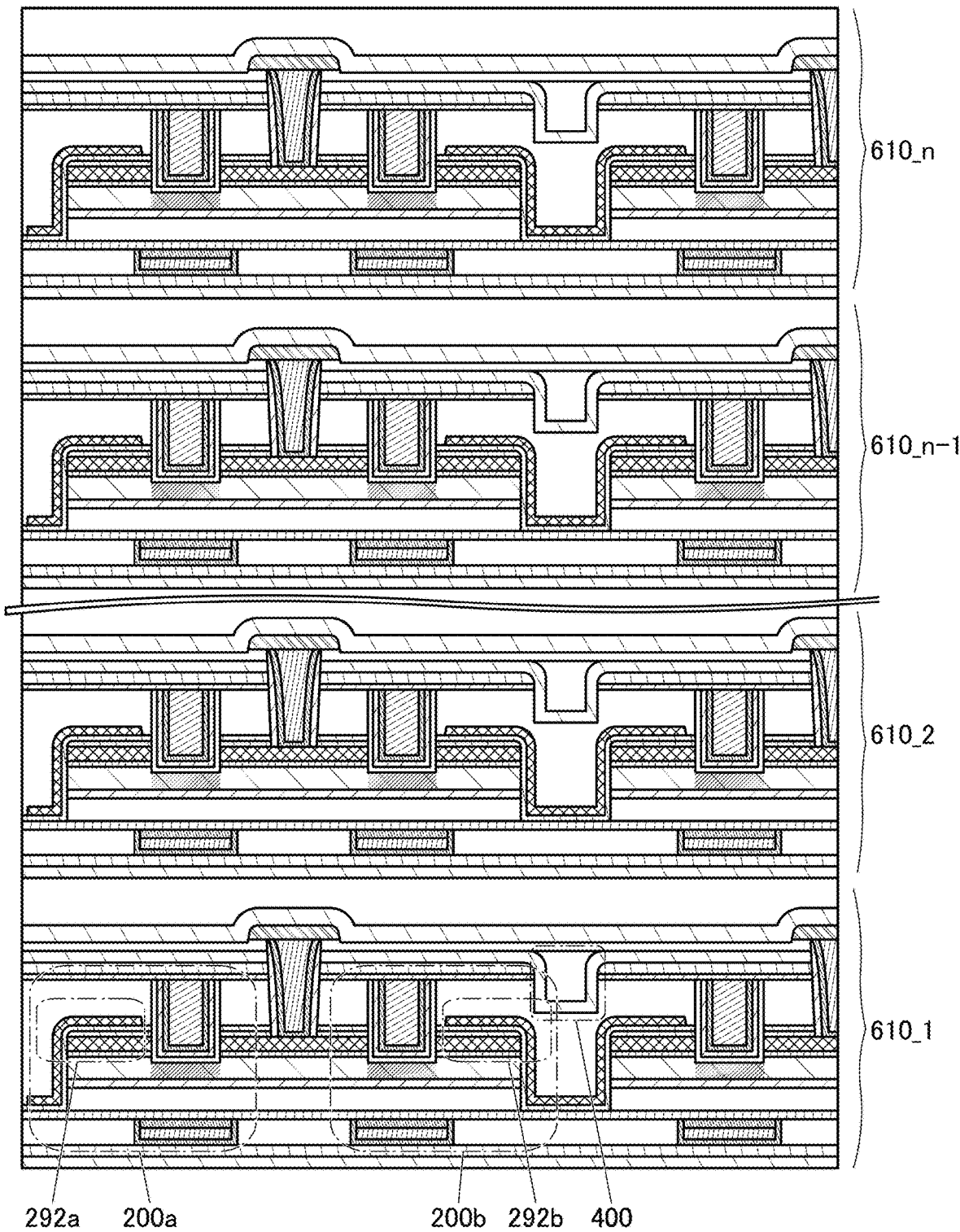
FIG. 34 is a cross-sectional view of a semiconductor device of one embodiment of the present invention.

Furthermore, the cell array may have a stacked-layer structure instead of a single-layer structure. FIG. 34 illustrates a cross-sectional view of n layers of cell arrays 610 that are stacked. When a plurality of cell arrays (a cell array 610_1 to a cell array 610_n) are stacked as illustrated in FIG. 34, cells can be integrally placed without increasing the area occupied by the cell arrays. In other words, a 3D cell array can be formed.

<Modification Example 3 of Memory Device>

Figure 35:
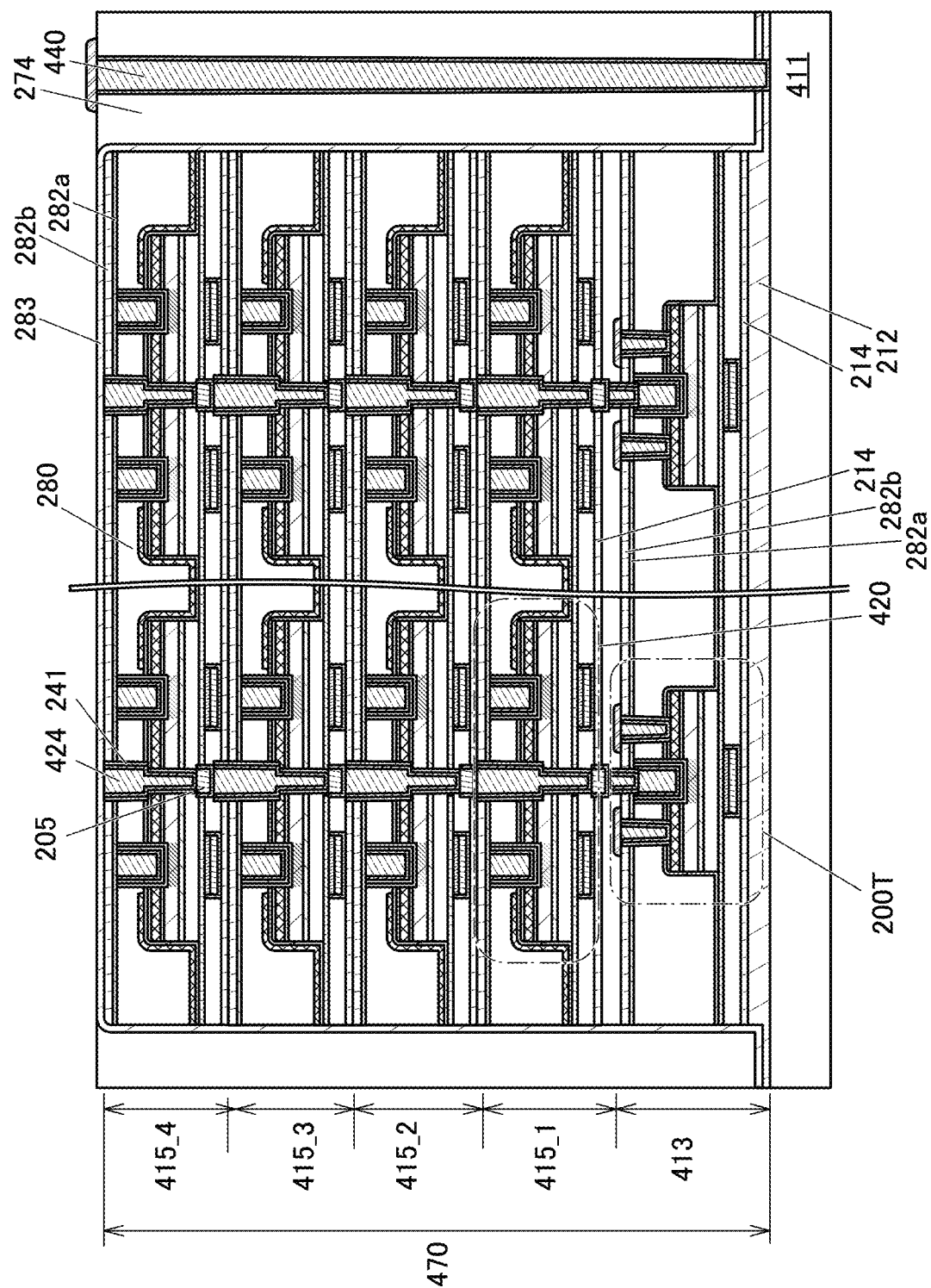
FIG. 35 is a cross-sectional view of a semiconductor device of one embodiment of the present invention.

FIG. 35 illustrates an example in which a memory unit 470 includes a transistor layer 413 including a transistor 200T and a memory device layer 415 of four layers (a memory device layer 415_1 to a memory device layer 415_4).

The memory device layer 415_1 to the memory device layer 415_4 each include a plurality of memory devices 420.

The memory device 420 is electrically connected to the memory device 420 included in a different memory device layer 415 and the transistor 200T included in the transistor layer 413 through a conductor 424 and the conductor 205.

The memory unit 470 is sealed with the insulator 212, the insulator 214, the insulator 282, and the insulator 283 (such a structure is referred to as a sealing structure below for convenience). The insulator 274 is provided in the periphery of the insulator 283. A conductor 440 is provided in the insulator 274, the insulator 283, and the insulator 212, and is electrically connected to an element layer 411.

The insulator 280 is provided in the sealing structure. The insulator 280 has a function of releasing oxygen by heating. Alternatively, the insulator 280 includes an excess-oxygen region.

Each of the insulator 212 and the insulator 283 is suitably formed using a material having a high blocking property against hydrogen. Each of the insulator 214 and the insulator 282 is suitably formed using a material having a function of capturing or fixing hydrogen.

Examples of the material having a high blocking property against hydrogen include silicon nitride and silicon nitride oxide. Examples of the material having a function of capturing or fixing hydrogen include aluminum oxide, hafnium oxide, and an oxide containing aluminum and hafnium (hafnium aluminate).

For the crystal structure of materials used for the insulator 212, the insulator 214, the insulator 282, and the insulator 283, an amorphous or crystalline structure may be employed, although the crystal structure is not limited thereto. For example, it is preferable to use an amorphous aluminum oxide film for the material having a function of capturing or fixing hydrogen. Amorphous aluminum oxide may capture or fix hydrogen more than aluminum oxide with high crystallinity.

Here, as the model of excess oxygen in the insulator 280 with respect to diffusion of hydrogen from an oxide semiconductor in contact with the insulator 280, the following model can be given.

Hydrogen in the oxide semiconductor diffuses into other structure bodies through the insulator 280 in contact with the oxide semiconductor. Owing to the hydrogen diffusion, the excess oxygen in the insulator 280 reacts with hydrogen in the oxide semiconductor, which yields the OH bonding to diffuse in the insulator 280. The hydrogen atom having the OH bonding reacts with the oxygen atom bonded to an atom (such as a metal atom) in the insulator 282 in reaching a material which has a function of capturing or fixing hydrogen (typically, the insulator 282), and is captured or fixed in the insulator 282. The oxygen atom which had the OH bonding of the excess oxygen may remain as excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed after the formation of the opening region 400 (not illustrated). Specifically, the heat treatment is performed at 350° C. or higher, preferably 400° C. or higher in an atmosphere containing nitrogen.

By the heat treatment, oxygen contained in the insulator 280 and hydrogen bonded to the oxygen can be released to the outside through the opening region 400. Note that the hydrogen bonded to oxygen is released as water. Thus, unnecessary oxygen and hydrogen contained in the insulator 280 can be reduced.

The insulator 283 is formed after the heat treatment. The insulator 283 is formed using a material having a high blocking property against hydrogen; thus, entry of hydrogen diffusing to the outside or external hydrogen into the inside, specifically, the oxide semiconductor or the insulator 280 side can be inhibited.

For example, the heat treatment may be performed after the formation of the transistor layer 413 or after the formation of the memory device layer 415_1 to the memory device layer 415_3. Specifically, the heat treatment is performed at 350° C. or higher, preferably 400° C. or higher in an atmosphere containing nitrogen or a mixed atmosphere of oxygen and nitrogen. The heat treatment is performed for one hour or longer, preferably four hours or longer, further preferably eight hours or longer. The heat treatment allows hydrogen in an oxide in a channel formation region to diffuse to the outside through the insulator 280 and the insulator 282. That is, the absolute amount of hydrogen in the oxide in the channel formation region and near the oxide in the channel formation region can be reduced. When hydrogen is diffused to the outside by the heat treatment, hydrogen is diffused to above the transistor layer 413 or in a lateral direction. Similarly, in the case where heat treatment is performed after the memory device layer 415_1 to the memory device layer 415_3 are formed, hydrogen is diffused into an upper area or in the lateral direction.

Through the above manufacturing process, the insulator 212 and the insulator 283 are bonded, whereby the sealing structure is formed.

With the above-described structure and the above-described manufacturing process, a semiconductor device using an oxide semiconductor with reduced hydrogen concentration can be provided. Accordingly, a semiconductor device with high reliability can be provided. According to another embodiment of the present invention, a semiconductor device with favorable electrical characteristics can be provided.

The structure, method, and the like described in this embodiment can be used in an appropriate combination with other structures, methods, and the like described in this embodiment, the other embodiments, or Examples.

Embodiment 3

In this embodiment, a storage device of one embodiment of the present invention including a transistor in which an oxide is used as a semiconductor (hereinafter referred to as an OS transistor in some cases) and a capacitor (hereinafter referred to as an OS memory device in some cases), is described with reference to FIG. 36A, FIG. 36B, and FIG. 37A to FIG. 37H. The OS memory device is a storage device including at least a capacitor and the OS transistor that controls the charging and discharging of the capacitor. Since the OS transistor has an extremely low off-state current, the OS memory device has excellent retention characteristics and thus can function as a nonvolatile memory.
<Structure Example of Storage Device>

Figure 36A:
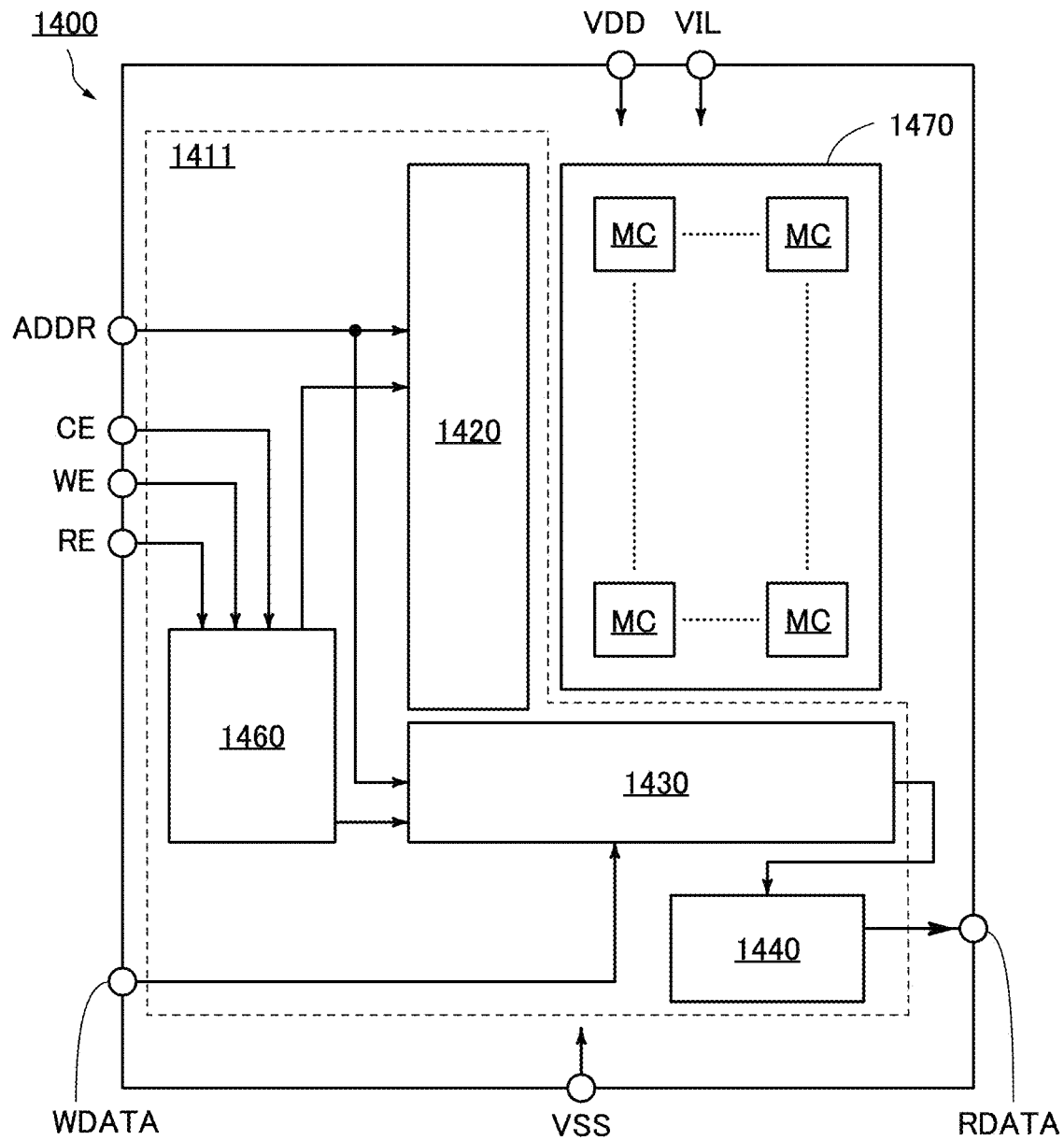
FIG. 36A and FIG. 36B are block diagrams illustrating a structure example of a storage device of one embodiment of the present invention.

FIG. 36A illustrates a structure example of the OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the structure of the memory cell MC, the number of memory cells MC in a column, and the like. The number of wirings that connect the memory cell array 1470 to the column circuit 1430 depends on the structure of the memory cell MC, the number of memory cells MC in a row, and the like.

Figure 36B:
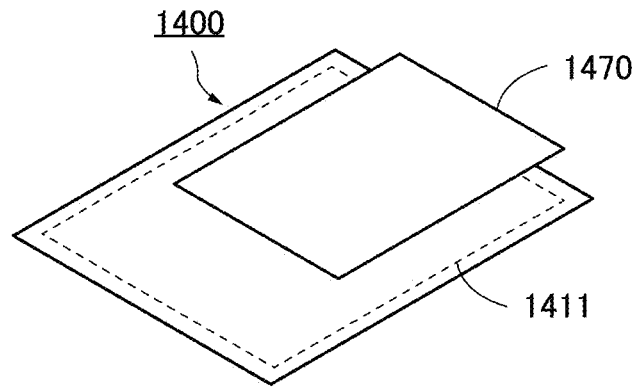

Note that FIG. 36A illustrates an example in which the peripheral circuit 1411 and the memory cell array 1470 are formed on the same plane; however, this embodiment is not limited thereto. For example, as illustrated in FIG. 36B, the memory cell array 1470 may be provided to overlap with part of the peripheral circuit 1411. For example, the sense amplifier may be provided below the memory cell array 1470 so that they overlap with each other.

FIG. 37A to FIG. 37H illustrate structure examples of a memory cell that can be applied to the memory cell MC.
[DOSRAM]

Figure 37A:
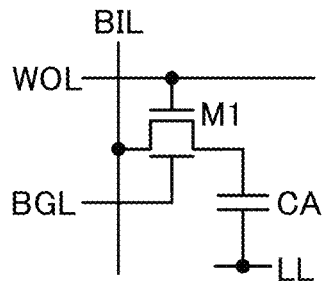
FIG. 37A to FIG. 37H are circuit diagrams illustrating structure examples of storage devices of one embodiment of the present invention.
Figure 37B:
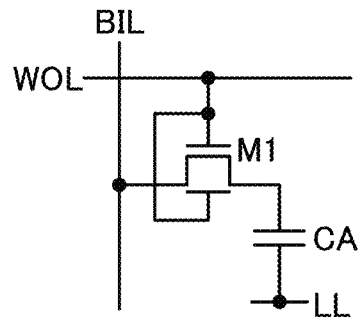
Figure 37C:
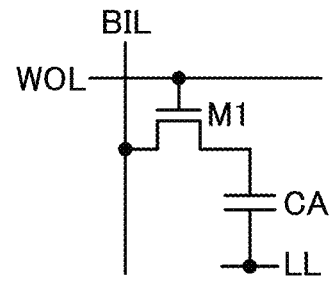

FIG. 37A to FIG. 37C illustrate circuit structure examples of DRAM memory cells. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 37A includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a wiring LL may be at a ground potential or a low-level potential. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 37A corresponds to the storage device illustrated in FIG. 32A and FIG. 32B. That is, the transistor M1 and the capacitor CA correspond to the transistor 200 and the capacitor device 292, respectively.

The memory cell MC is not limited to the memory cell 1471, and the circuit structure can be changed. For example, as in a memory cell 1472 illustrated in FIG. 37B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 37C.

In the case where the semiconductor device described in the above embodiment is used in the memory cell 1471 or the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long period of time, and thus the frequency of the refresh operation for the memory cell can be decreased. In addition, refresh operation for the memory cell can be omitted. In addition, since the transistor M1 has an extremely low leakage current, multi-level data or analog data can be retained in the memory cell 1471, the memory cell 1472, and the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIG. 37D to FIG. 37G illustrate circuit structure examples of gain-cell memory cells each including two transistors and one capacitor. A memory cell 1474 illustrated in FIG. 37D includes a transistor M2, a transistor M3, and a capacitor CB. Note that the transistor M2 includes a top gate (simply referred to as a gate in some cases) and a back gate. In this specification and the like, a storage device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing and data reading, a high-level potential is preferably applied to the wiring CAL. In the time of data retaining, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 37D:
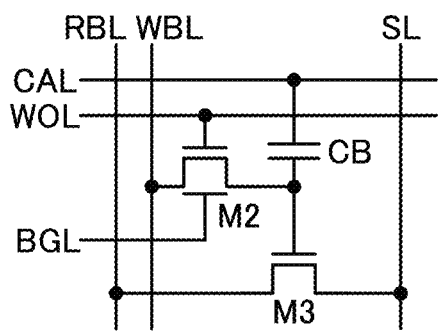
Figure 37E:
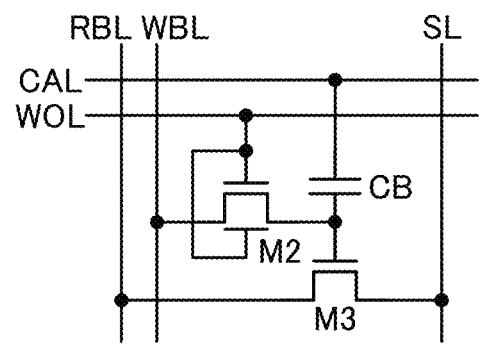
Figure 37F:
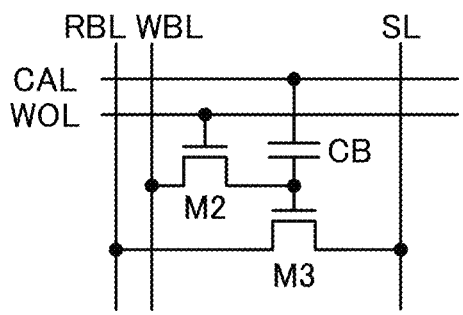
Figure 37G:
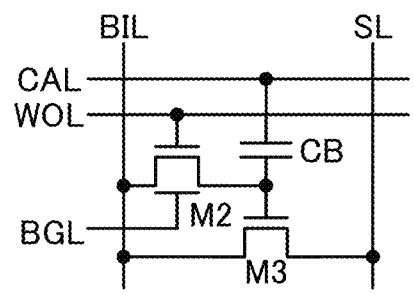

Here, the memory cell 1474 illustrated in FIG. 37D corresponds to the storage device illustrated in FIG. 30 and FIG. 31. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

In addition, the memory cell MC is not limited to the memory cell 1474, and the circuit structure can be changed as appropriate. For example, as in a memory cell 1475 illustrated in FIG. 37E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 illustrated in FIG. 37F. For example, the memory cell MC may have a structure in which the wiring WBL and the wiring RBL are combined into one wiring BIL as in a memory cell 1477 illustrated in FIG. 37G.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with the use of the transistor M2, written data can be retained for a long period of time, and thus the frequency of the refresh operation for the memory cell can be decreased. In addition, refresh operation for the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the storage device can be achieved.

Alternatively, the transistor M3 may be an OS transistor. When OS transistors are used as the transistor M2 and the transistor M3, the circuit of the memory cell array 1470 can be formed using only n-channel transistors.

Figure 37H:
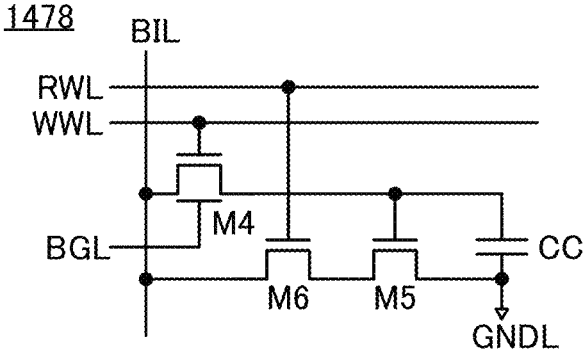

FIG. 37H illustrates an example of a gain-cell memory cell including three transistors and one capacitor. A memory cell 1478 illustrated in FIG. 37H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in the above embodiment is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

Figure 38:
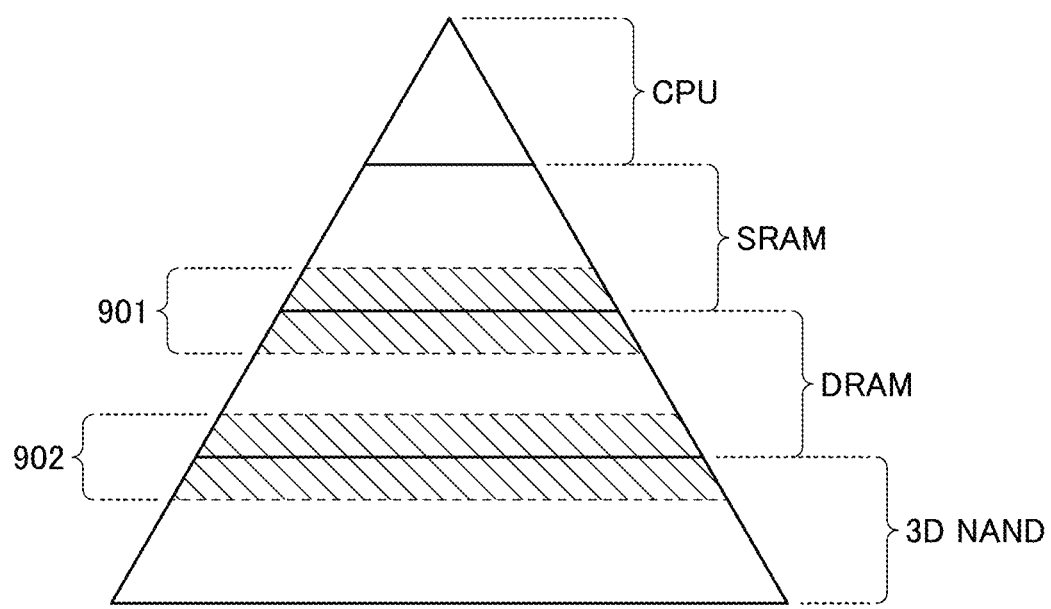
FIG. 38 is a diagram illustrating a hierarchy of storage devices.

In general, a variety of storage devices (memories) are used in semiconductor devices such as a computer in accordance with the intended use. FIG. 38 shows a hierarchy diagram showing various storage devices with different levels. The storage devices at the upper levels of the diagram require high access speeds, and the storage devices at the lower levels require large storage capacity and high record density. In FIG. 38, sequentially from the top level, a memory included as a register in an arithmetic processing device such as a CPU, an SRAM (Static Random Access Memory), a DRAM (Dynamic Random Access Memory), and a 3D NAND memory are shown.

A memory included as a register in an arithmetic processing device such as a CPU is used for temporary storage of arithmetic operation results, for example, and thus is very frequently accessed by the arithmetic processing device. Accordingly, rapid operation is more important than the storage capacity of the memory. The register also has a function of retaining setting information of the arithmetic processing device, for example.

An SRAM is used for a cache, for example. The cache has a function of retaining a copy of part of data retained in a main memory. By copying data which is frequently used and holding the copy of the data in the cache, the access speed to the data can be increased.

A DRAM is used for the main memory, for example. The main memory has a function of retaining a program or data which are read from a storage. The record density of a DRAM is approximately 0.1 to 0.3 Gbit/mm$^2$.

A 3D NAND memory is used for a storage, for example. The storage has a function of retaining data that needs to be retained for a long time and programs used in an arithmetic processing device, for example. Therefore, the storage needs to have a high storage capacity and a high record density rather than operating speed. The record density of a storage device used for a storage is approximately 0.6 to 6.0 Gbit/mm$^2$.

The storage device of one embodiment of the present invention operates fast and can retain data for a long time. The storage device of one embodiment of the present invention can be favorably used as a storage device in a boundary region 901 including both the level in which a cache is placed and the level in which a main memory is placed. Alternatively, the storage device of one embodiment of the present invention can be favorably used as a storage device in a boundary region 902 including both the level in which a main memory is placed and the level in which a storage is placed.

The structure, method, and the like described in this embodiment can be used in an appropriate combination with other structures, methods, and the like described in this embodiment, the other embodiments, or Examples.

Embodiment 4

In this embodiment, an example of a chip 1200 on which the semiconductor device of the present invention is mounted is described with reference to FIG. 39A and FIG. 39B. A plurality of circuits (systems) are mounted on the chip 1200. A technique for integrating a plurality of circuits (systems) into one chip is referred to as system on chip (SoC) in some cases.

Figure 39A:
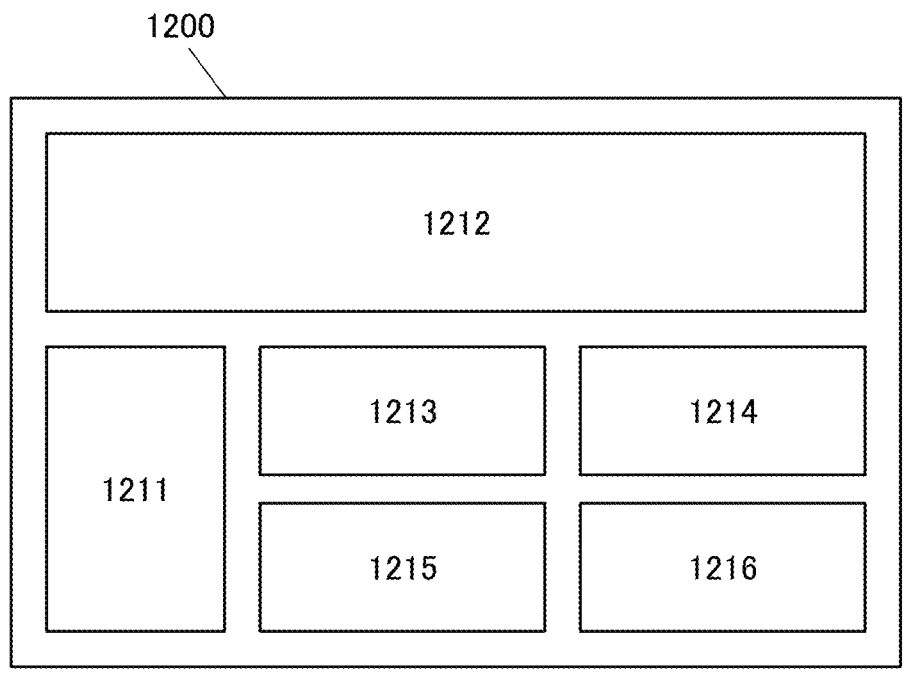
FIG. 39A and FIG. 39B are schematic diagrams of a semiconductor device of one embodiment of the present invention.

As illustrated in FIG. 39A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 39B:
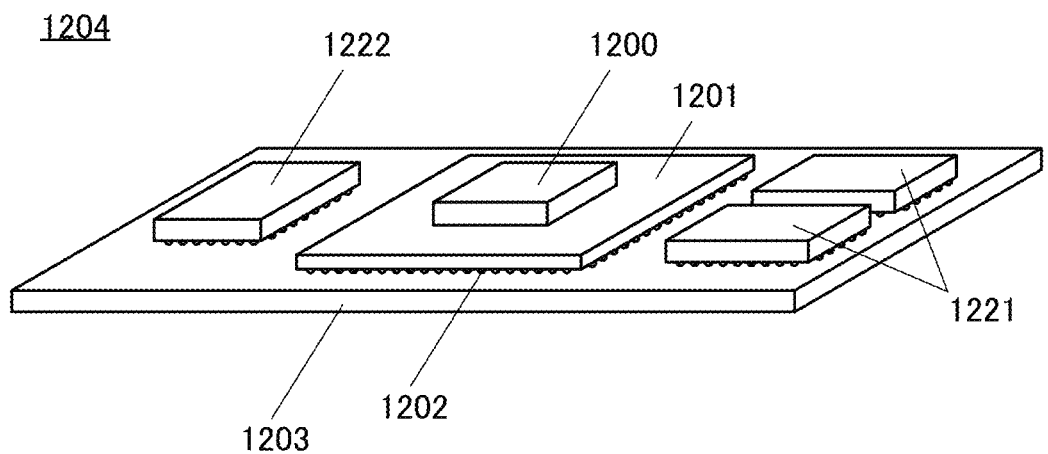

A bump (not illustrated) is provided on the chip 1200, and as illustrated in FIG. 39B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Storage devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure, method, and the like described in this embodiment can be used in an appropriate combination with other structures, methods, and the like described in this embodiment, the other embodiments, or Examples.

Embodiment 5

In this embodiment, examples of electronic components and electronic devices in which the storage device or the like described in the above embodiment is incorporated are described.

<Electronic Component>

Figure 40A:
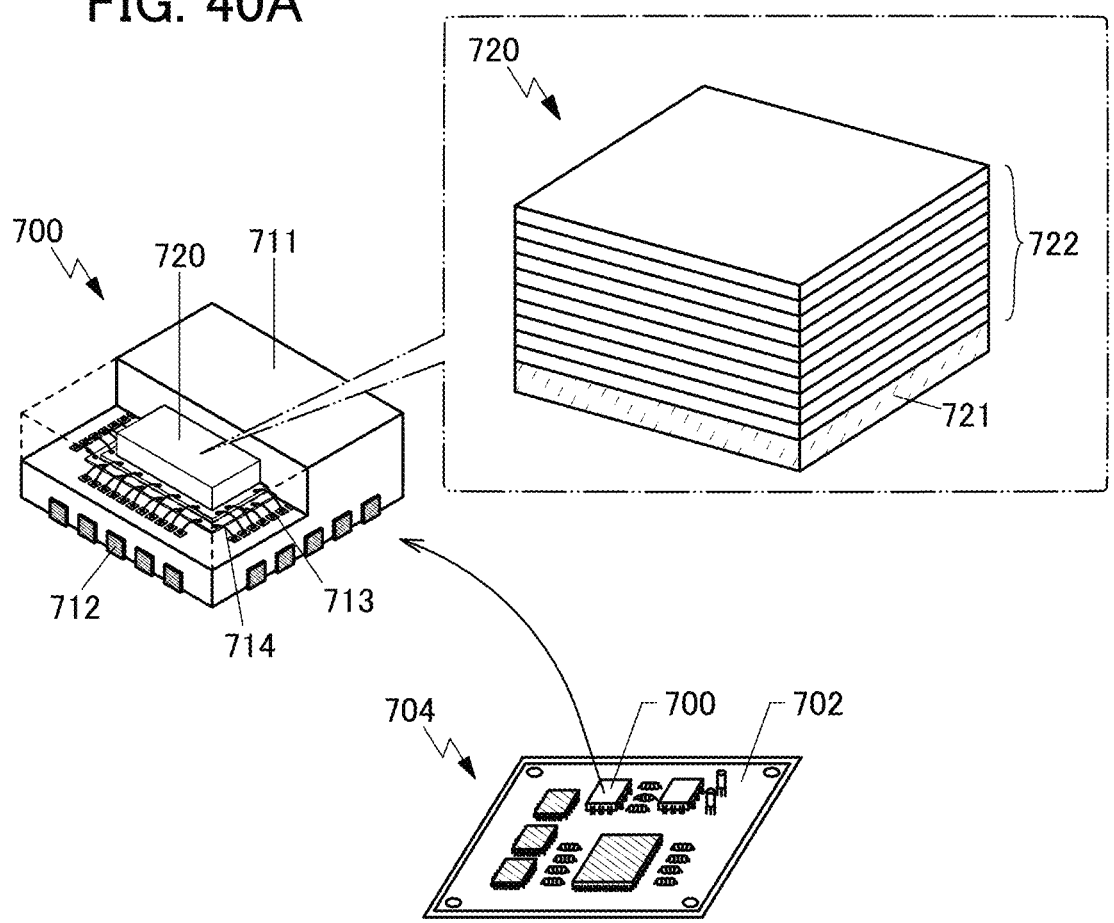
FIG. 40A and FIG. 40B are diagrams each illustrating an example of an electronic component of one embodiment of the present invention.
Figure 40B:
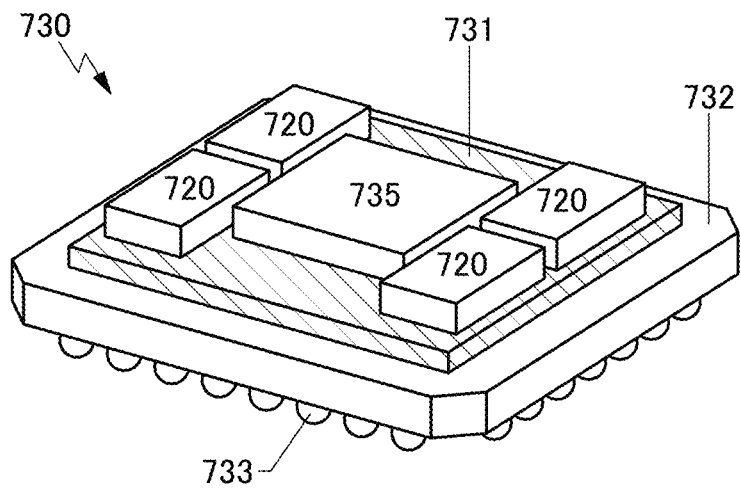

First, FIG. 40A and FIG. 40B illustrate examples of an electronic component including a storage device 720.

FIG. 40A is a perspective view of an electronic component 700 and a substrate (a circuit board 704) on which the electronic component 700 is mounted. The electronic component 700 illustrated in FIG. 40A includes the storage device 720 in a mold 711. FIG. 40A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 via a wire 714. The electronic component 700 is mounted on a printed circuit board 702, for example. A plurality of such electronic components are combined and electrically connected to each other on the printed circuit board 702, which forms the circuit board 704.

The storage device 720 includes a driver circuit layer 721 and a storage circuit layer 722.

FIG. 40B is a perspective view of an electronic component 730. The electronic component 730 is an example of a SiP (System in package) or an MCM (Multi Chip Module). In the electronic component 730, an interposer 731 is provided over a package substrate 732 (printed circuit board) and a semiconductor device 735 and a plurality of storage devices 720 are provided over the interposer 731.

The electronic component 730 using the storage device 720 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 to be used for electrically connecting the integrated circuit and the package substrate 732. In the case of using a silicon interposer, a through-silicon via (TSV) can also be used as the through electrode.

A silicon interposer is preferably used as the interposer 731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon is less likely to occur. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In the case of providing a heat sink, the heights of integrated circuits provided on the interposer 731 are preferably equal to each other. In the electronic component 730 of this embodiment, the heights of the storage device 720 and the semiconductor device 735 are preferably equal to each other, for example.

An electrode 733 may be provided on the bottom portion of the package substrate 732 to mount the electronic component 730 on another substrate. FIG. 40B illustrates an example in which the electrode 733 is formed of a solder ball. Solder balls are provided in a matrix on the bottom portion of the package substrate 732, whereby a BGA (Ball Grid Array) can be achieved. Alternatively, the electrode 733 may be formed of a conductive pin. When conductive pins are provided in a matrix on the bottom portion of the package substrate 732, a PGA (Pin Grid Array) can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

The structure, method, and the like described in this embodiment can be used in an appropriate combination with other structures, methods, and the like described in this embodiment, the other embodiments, or Examples.

Embodiment 6

In this embodiment, application examples of the storage device using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 41A to FIG. 41E schematically illustrate some structure examples of removable storage devices. The semiconductor device described in the above embodiment is processed into a packaged memory chip and used in a variety of storage devices and removable memories, for example.

Figure 41A:
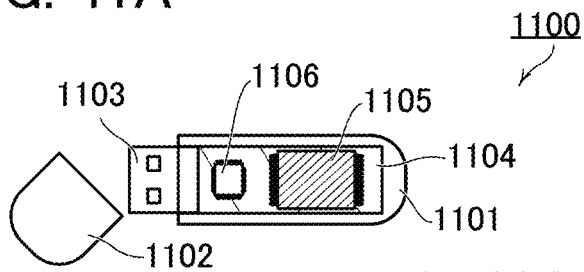
FIG. 41A to FIG. 41E are schematic diagrams of storage devices of one embodiment of the present invention.

FIG. 41A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figures 41B, 41C:
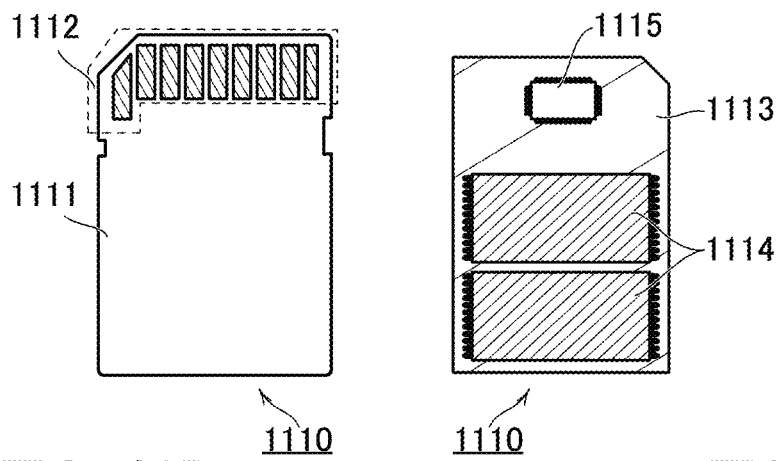

FIG. 41B is a schematic external view of an SD card, and FIG. 41C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figures 41D, 41E:
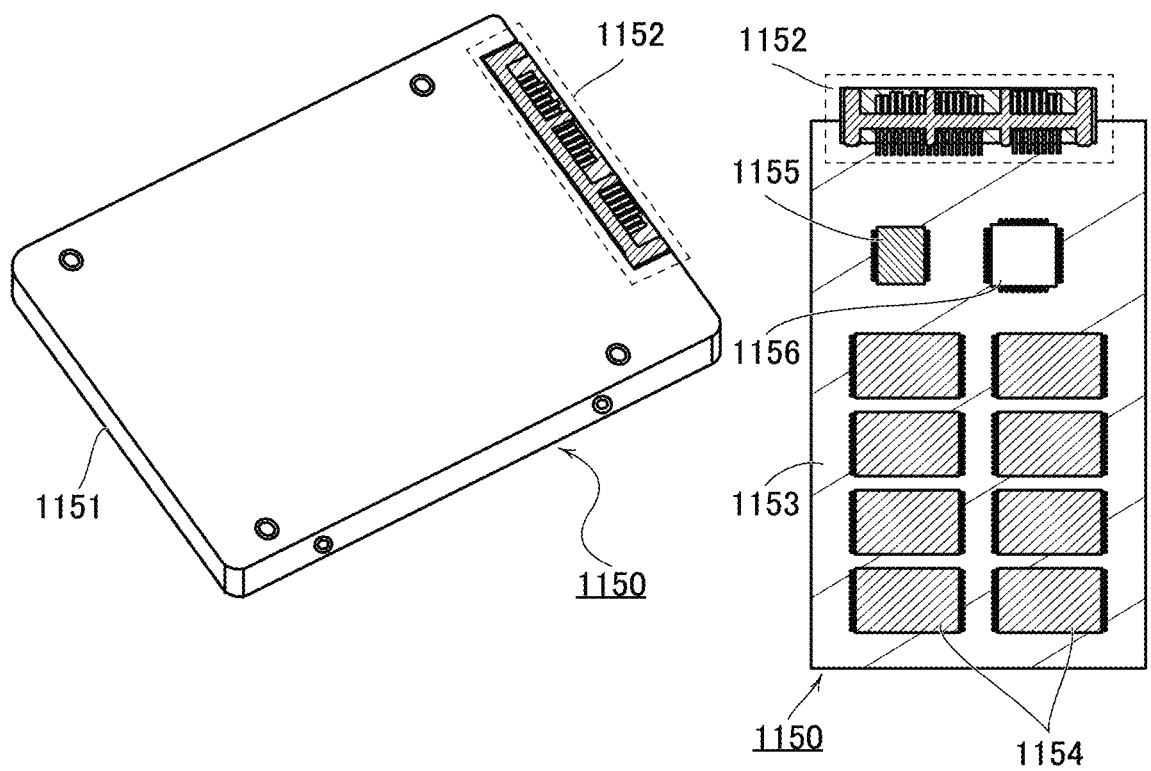

FIG. 41D is a schematic external view of an SSD, and FIG. 41E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

The structure, method, and the like described in this embodiment can be used in an appropriate combination with other structures, methods, and the like described in this embodiment, the other embodiments, or Examples.

Embodiment 7

The semiconductor device of one embodiment of the present invention can be used as a processor such as a CPU and a GPU or a chip. FIG. 42A to FIG. 42H illustrate specific examples of electronic devices including a chip or a processor such as a CPU or a GPU of one embodiment of the present invention.
<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 42A to FIG. 42H illustrate examples of electronic devices.
[Information Terminal]

Figure 42A:
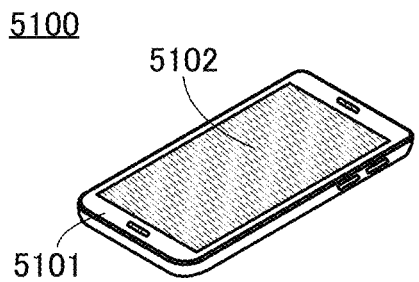
FIG. 42A to FIG. 42H are diagrams illustrating electronic devices of one embodiment of the present invention.

FIG. 42A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 42B:
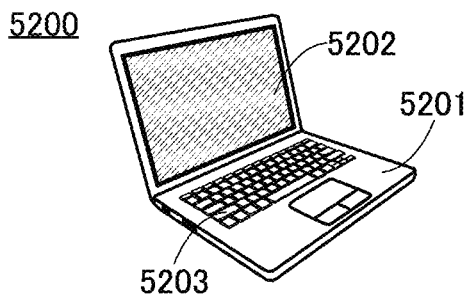

FIG. 42B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 42A and FIG. 42B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 42C:
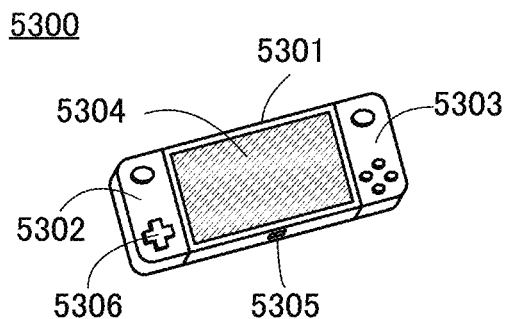

FIG. 42C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 42D:
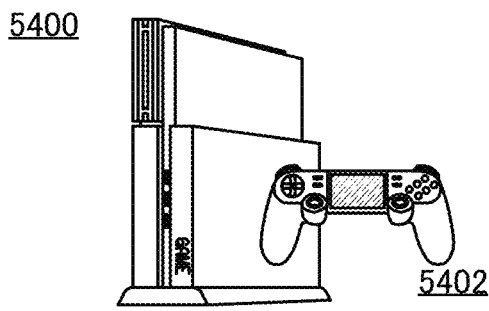

FIG. 42D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 42C and FIG. 42D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 42E:
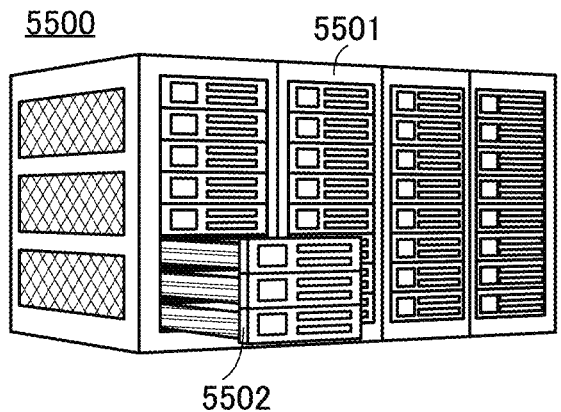
Figure 42F:
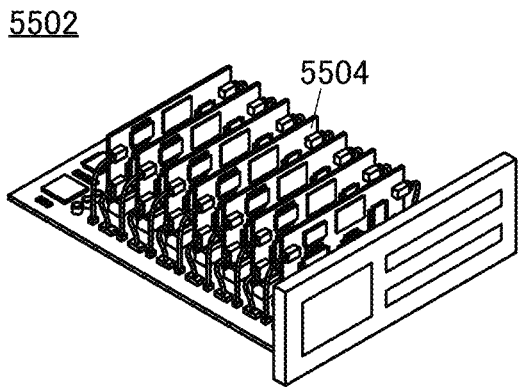

FIG. 42E illustrates a supercomputer 5500 as an example of a large computer. FIG. 42F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is illustrated as an example of a large computer in FIG. 42E and FIG. 42F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 42G:
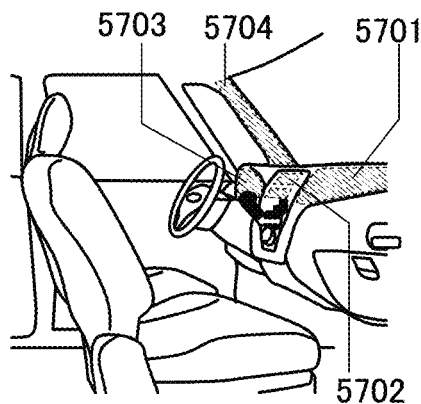

FIG. 42G illustrates an area around a windshield inside an automobile, which is an example of a moving vehicle. FIG. 42G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 42H:
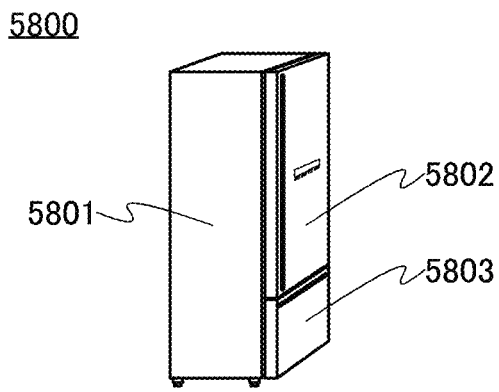

FIG. 42H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

The structure, method, and the like described in this embodiment can be used in an appropriate combination with other structures, methods, and the like described in this embodiment, the other embodiments, or Examples.

EXAMPLE

In this example, semiconductor devices including the transistors 200 illustrated in FIG. 3A to FIG. 3D were fabricated and the electrical characteristics of the transistors 200 were evaluated.

First, the structure of Sample is described. As illustrated in FIG. 3A to 3D, Sample includes the insulator 212 positioned over the substrate (not illustrated); the insulator 214 over the insulator 212; the insulator 216 positioned over the insulator 214; the conductor 205 positioned to be embedded in the insulator 216; the insulator 222 positioned over the insulator 216 and the conductor 205; the insulator 224 positioned over the insulator 222; the oxide 230a positioned over the insulator 224; the oxide 230b positioned over the oxide 230a; the oxide 243a and the oxide 243b positioned apart from each other over the oxide 230b; the conductor 242a positioned over the oxide 243a; the conductor 242b positioned over the oxide 243b; the insulator 271a positioned over the conductor 242a; the insulator 271b positioned over the conductor 242b, the insulator 272 positioned over the insulator 271a, the insulator 271b, and the insulator 222; the insulator 280 positioned over the insulator 272; the insulator 250a positioned over the oxide 230b; the insulator 250b positioned over the insulator 250a; the conductor 260 positioned over the insulator 250b; the insulator 282 positioned over the insulator 280 and the conductor 260; the insulator 283 positioned in contact with the top surface of the insulator 212 and the side surfaces of the insulator 214, the insulator 216, the insulator 222, the insulator 272, the insulator 280, and the insulator 282; the insulator 274 positioned to cover the insulator 283; and the insulator 286 positioned to cover the insulator 274 and the insulator 283.

For the insulator 212, 60-nm-thick silicon nitride was used. The insulator 212 was deposited by a pulsed DC sputtering method using a silicon target.

For the insulator 214, 40-nm-thick aluminum oxide was used. The insulator 214 was deposited by a pulsed DC sputtering method using an aluminum target.

For the insulator 216, 130-nm-thick silicon oxide was used. The insulator 216 was deposited by a pulsed DC sputtering method using a silicon target.

The insulator 212, the insulator 214, and the insulator 216 were successively deposited without exposure to the air using a multi-chamber sputtering apparatus.

In the conductor 205, the conductor 205a is positioned in contact with the bottom surface and the side wall of the opening in the insulator 216, the conductor 205b is positioned over the conductor 205a, and the conductor 205c is positioned over the conductor 205b. Here, a side surface of the conductor 205c is positioned in contact with the conductor 205a. That is, the conductor 205b is provided to be surrounded by the conductor 205a and the conductor 205c.

The conductor 205a and the conductor 205c are titanium nitride deposited by a metal CVD method, and the conductor 205b is tungsten deposited by a metal CVD method. The conductor 205 was formed by a method described in the above embodiment with reference to FIG. 6 to FIG. 10.

For the insulator 222, 20-nm-thick hafnium oxide deposited by an ALD method was used. For the insulator 224, 20-nm-thick silicon oxide deposited by a sputtering method was used.

For the oxide 230a, 5-nm-thick In—Ga—Zn oxide deposited by a DC sputtering method was used. In the deposition of the oxide 230a, a target with In:Ga:Zn=1:3:4 [atomic ratio] was used.

For the oxide 230b, 15-nm-thick In—Ga—Zn oxide deposited by a DC sputtering method was used. In the deposition of the oxide 230b, a target with In:Ga:Zn=4:2:4.1 [atomic ratio] was used.

For an oxide to be the oxide 243, 2-nm-thick In—Ga—Zn oxide deposited by a DC sputtering method was used. In the deposition of the oxide to be the oxide 243, a target with In:Ga:Zn=1:3:4 [atomic ratio] was used.

Note that after the deposition of the oxide to be the oxide 243, heat treatment was performed at 500° C. in a nitrogen atmosphere for one hour, and another heat treatment was successively performed at 500° C. in an oxygen atmosphere for one hour.

For each of the conductor 242a and the conductor 242b, 20-nm-thick tantalum nitride was used. For the insulator 271, 10-nm-thick aluminum oxide deposited by a sputtering method was used. For the insulator 272, a stacked film of 5-nm-thick aluminum oxide deposited by a sputtering method and 5-nm-thick silicon nitride deposited thereover by a sputtering method was used.

For the insulator 280, 145-nm-thick silicon oxide deposited by a sputtering method was used. In the deposition of the insulator 280, a Si target was used; an oxygen gas at 100 sccm and an Ar gas at 20 sccm were used as deposition gases. The insulator 272 and the insulator 280 were successively deposited without being exposed to the air with the use of a multi-chamber sputtering apparatus.

For the insulator 250a, 6-nm-thick silicon oxynitride deposited by a CVD method was used. Next, as the insulator 250b, 1.5-nm-thick hafnium oxide deposited by an ALD method was used. After the deposition of the insulator 250b, microwave treatment was performed. In the microwave treatment, an argon gas at 150 sccm and an oxygen gas at 50 sccm were used as treatment gases, the power was 4000 W, the pressure was 400 Pa, the treatment temperature was 400° C., and the treatment time was 600 seconds. After that, 1-nm-thick silicon nitride was deposited over the insulator 250b by an ALD method.

For the conductor 260a, 5-nm-thick titanium nitride was used. For the conductor 260b, tungsten was used.

For the insulator 282, 40-nm-thick aluminum oxide was used. The insulator 282 was deposited by a pulsed DC sputtering method using an aluminum target.

For the insulator 283, silicon nitride deposited by a sputtering method was used.

For the insulator 274, silicon oxynitride deposited by a CVD method was used.

Samples having the above-described structure are a transistor having a designed channel length of 360 nm and a designed channel width of 60 nm, and a transistor having a designed channel length of 60 nm and a designed channel width of 60 nm. Like the transistor 200, Samples each include the conductor 240, the insulator 241, the conductor 246, and the like in addition to the above structure. After the fabrication, Samples were subjected to heat treatment at 400° C. for 4 hours in a nitrogen atmosphere.

Five transistors in a substrate surface of Sample fabricated in the above manner were evaluated.

[Evaluation of Temperature Dependence]

The temperature dependence of electrical characteristics was evaluated under the temperature of the measurement environment of the electrical characteristics was set at −10° C., 25° C., and 85° C. The Id-Vg characteristics (drain current-gate voltage characteristics) were measured using a semiconductor parameter analyzer manufactured by Keysight Technologies. The Id-Vg characteristics were measured under the conditions where the drain potential Vd was 0.1 V or 1.2 V; the source potential Vs was 0 V; the back gate potential Vbg was 0 V; and the top gate potential Vg was swept from −4.0 V to 4.0 V in increments of 0.025 V.

FIG. 43A to FIG. 44C show measurement results of the Id-Vg characteristics. In each graph, the horizontal axis represents top gate potential Vg [V], the first vertical axis represents drain current Id [A], and the second vertical axis represents field-effect mobility μFE [cm$^2$/Vs] at Vd=0.1 V. The drain currents at Vd=0.1 V and Vd=1.2 V are shown by solid lines, and the field-effect mobility μFE is shown by a dotted line.

Figure 43A:
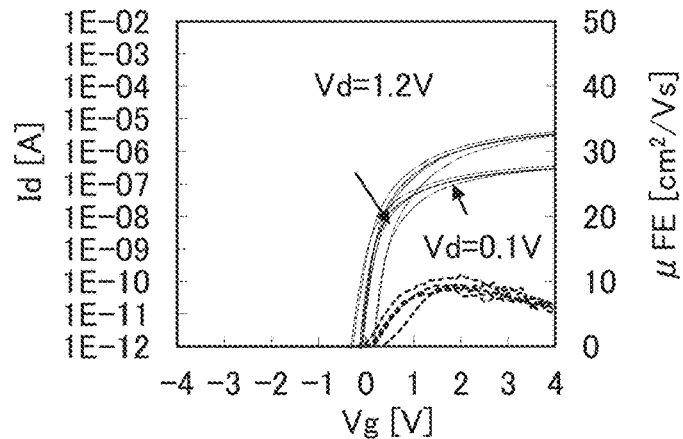
FIG. 43A to FIG. 43C are graphs showing electrical characteristics in Example of one embodiment of the present invention.
Figure 43B:
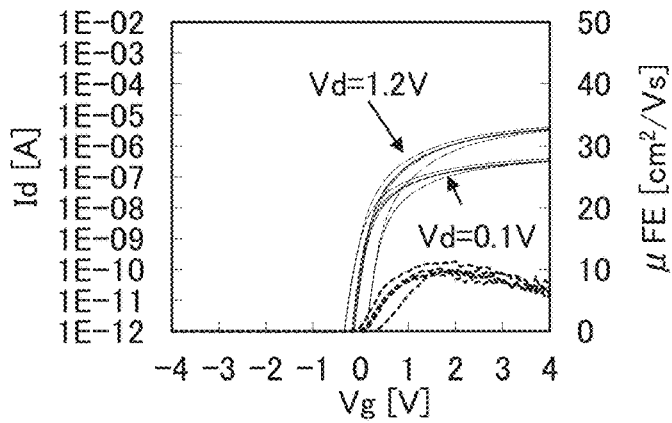
Figure 43C:
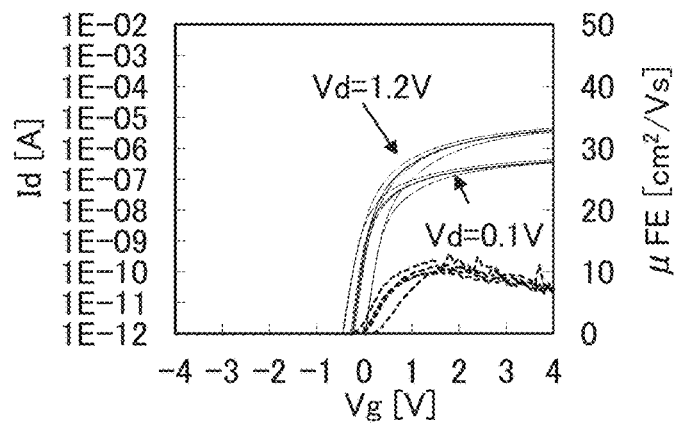

FIG. 43A to FIG. 43C show results of the transistor having a designed channel length of 360 nm and a designed channel width of 60 nm. FIG. 43A, FIG. 43B, and FIG. 43C show the Id-Vg characteristics at the measurement environment temperature of −10° C., the measurement environment temperature of 25° C., and the measurement environment temperature of 85° C., respectively.

Figure 44A:
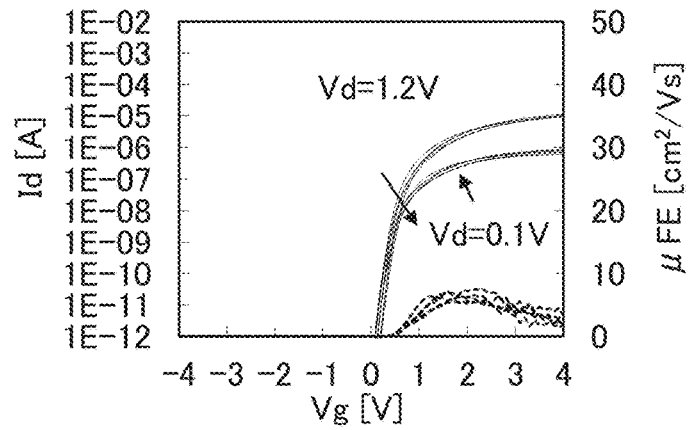
FIG. 44A to FIG. 44C are graphs showing electrical characteristics in Example of one embodiment of the present invention.
Figure 44B:
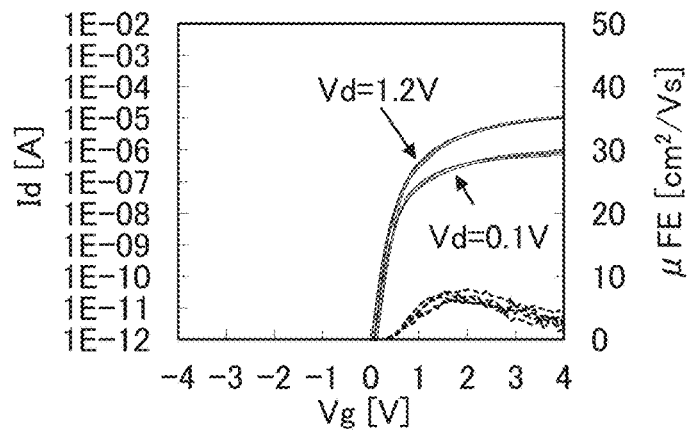
Figure 44C:
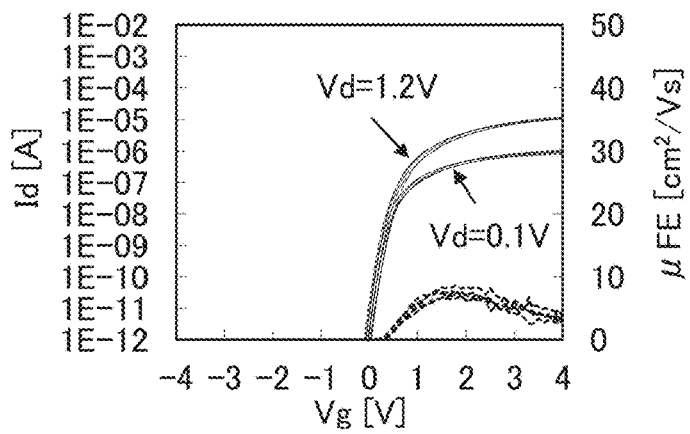

FIG. 44A to FIG. 44C show results of the transistor having a designed channel length of 60 nm and a designed channel width of 60 nm. FIG. 44A, FIG. 44B, and FIG. 44C show the Id-Vg characteristics at the measurement environment temperature of −10° C., the measurement environment temperature of 25° C., and the measurement environment temperature of 85° C., respectively.

FIG. 45A to FIG. 45H show graphs of the measurement environment temperature dependence of each of field-effect mobility μFE [cm$^2$/Vs], a subthreshold swing value (S value) [mV/dec], a shift voltage Vsh [V], and Drain Induced Barrier Lowering (DIBL) [V] obtained from the Id-Vg characteristics measurements.

Here, the maximum value of the field-effect mobility μFE was plotted. The S value is the value of Vg that is necessary to change Id by an order of magnitude in the subthreshold region when Vd is set to 1.2 V. The shift voltage Vsh was defined as, in the Id-Vg curve of the transistor at Vd=1.2 V, a value of Vg at which the tangent at a point where the slope of the curve is the steepest intersects a straight line of Id=1 pA. DIBL was defined as a value obtained by subtracting the shift voltage at Vd=1.2 V from the shift voltage at Vd=0.1 V.

FIG. 45A to FIG. 45D are graphs of the measurement environment temperature dependence of the transistor having a designed channel length of 360 nm and a designed channel width of 60 nm, and FIG. 45E to FIG. 45H are graphs of the measurement environment temperature dependence of the transistor having a designed channel length of 60 nm and a designed channel width of 60 nm. According to these graphs, in both the transistor having a designed channel length of 360 nm and a designed channel width of 60 nm and the transistor having a designed channel length of 60 nm and a designed channel width of 60 nm, in the temperature range from −10° C. to 85° C., the μFE and the S value tend to increase as the measurement environment temperature increases, and the Vsh tends to decrease as the measurement environment temperature increases. It is found that in DIBL, the measurement environment temperature dependence is small in the temperature range from −10° C. to 85° C.

[Vbg Dependence Evaluation]

Next, the Vbg dependence of electrical characteristics was evaluated when the back gate potential Vbg of the transistor 200 was set to −4V, 0V, and 4V. The Id-Vg characteristics were measured under the conditions where the drain potential Vd was set to 0.1 V or 1.2 V; the source potential Vs was set to 0 V; the back gate potential Vbg was set to −4V, 0V, and 4V; and the top gate potential Vg was swept from −4.0 V to 4.0 V in increments of 0.025 V. The measurement temperature was set at 25° C.

FIG. 46A to FIG. 47C show measurement results of the Id-Vg characteristics. In each graph, the horizontal axis represents top gate potential Vg [V], the first vertical axis represents drain current Id [A], and the second vertical axis represents field-effect mobility μFE [cm$^2$/Vs] at Vd=0.1 V. The drain currents at Vd=0.1 V and Vd=1.2 V are shown by solid lines, and the field-effect mobility μFE is shown by a dotted line.

Figure 46A:
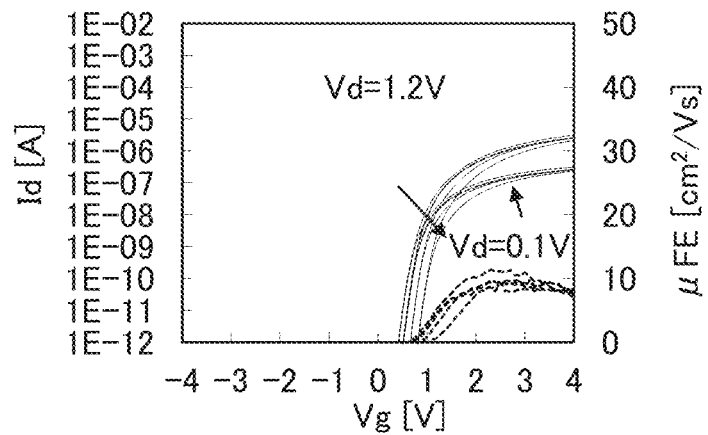
FIG. 46A to FIG. 46C are graphs showing electrical characteristics in Example of one embodiment of the present invention.
Figure 46B:
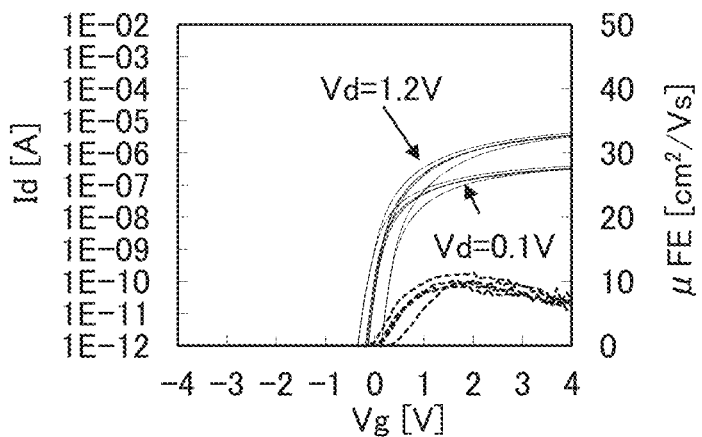
Figure 46C:
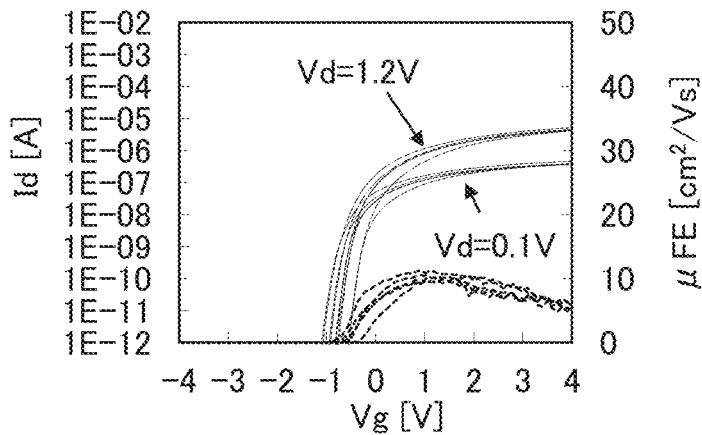

FIG. 46A to FIG. 46C show results of the transistor having a designed channel length of 360 nm and a designed channel width of 60 nm. FIG. 46A shows the Id-Vg characteristics at the back gate potential Vbg of −4 V, FIG. 46B shows the Id-Vg characteristics at the back gate potential Vbg of 0 V, and FIG. 46C shows the Id-Vg characteristics at the back gate potential Vbg of 4 V.

Figure 47A:
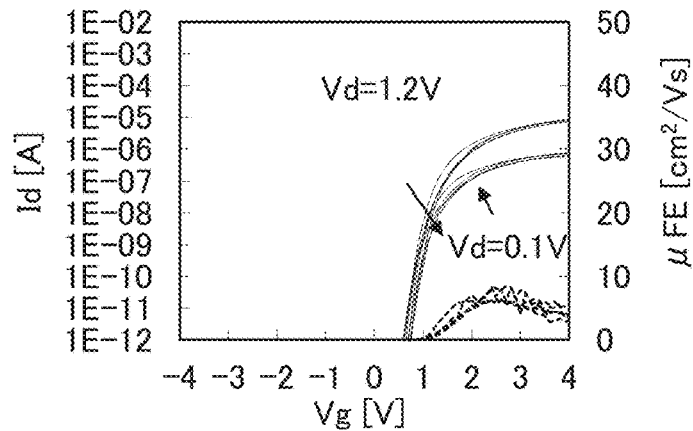
FIG. 47A to FIG. 47C are graphs showing electrical characteristics in Example of one embodiment of the present invention.
Figure 47B:
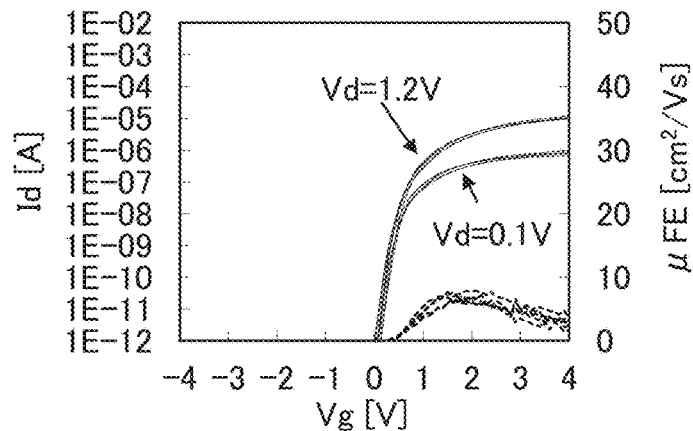
Figure 47C:
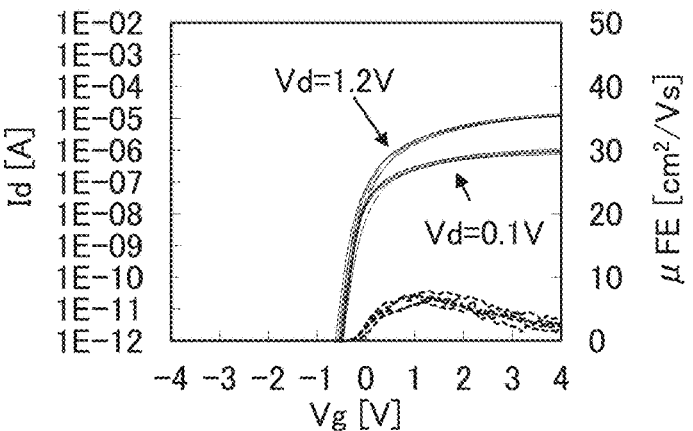
Figure 48A:
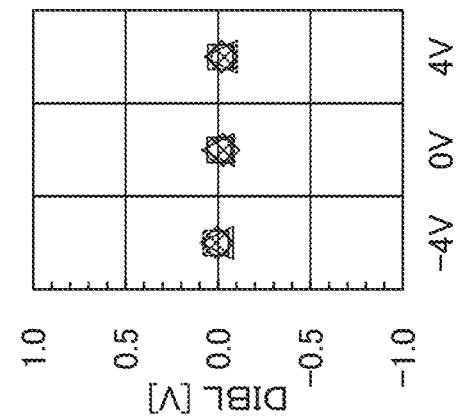
FIG. 48A to FIG. 48H are graphs showing Vbg dependence of electrical characteristics in Example of one embodiment of the present invention.
Figure 48B:
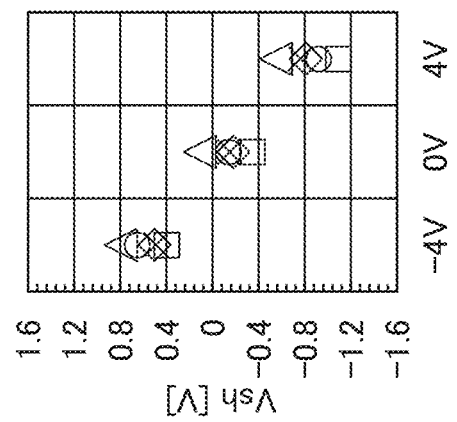
Figure 48C:
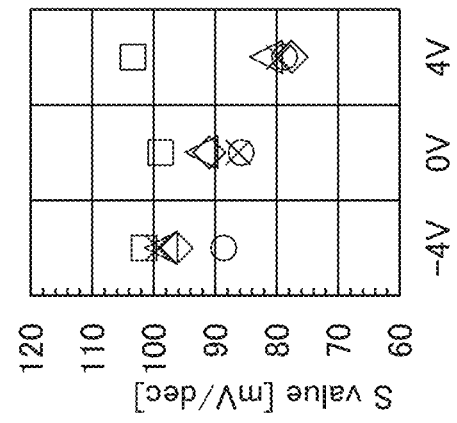
Figure 48D:
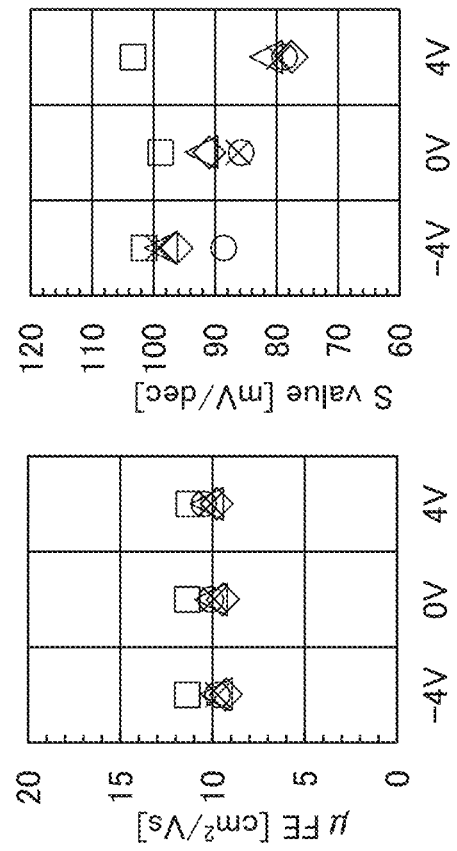
Figure 48E:
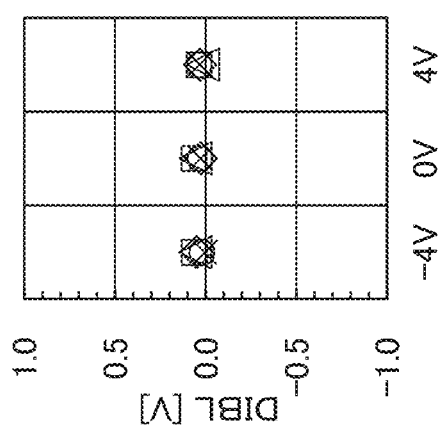
Figure 48F:
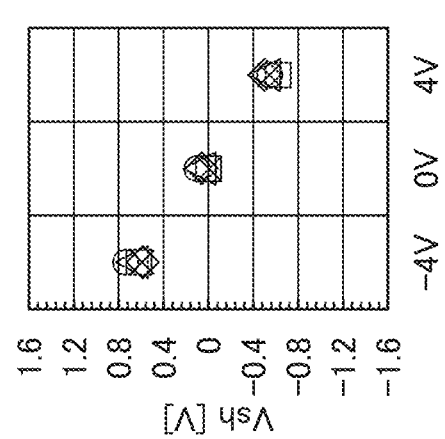
Figure 48G:
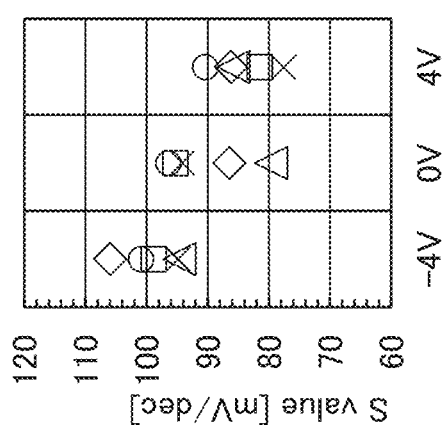
Figure 48H:
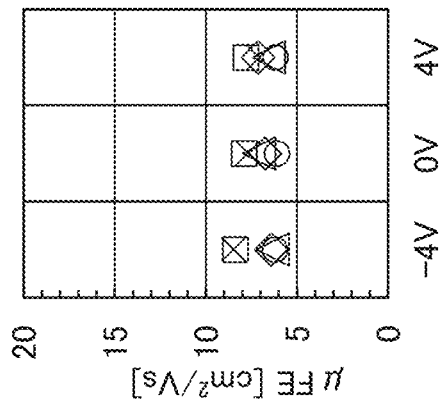

FIG. 47A to FIG. 47C show results of the transistor having a designed a channel length of 60 nm and a designed channel width of 60 nm. FIG. 47A shows the Id-Vg characteristics at the back gate potential Vbg of −4 V, FIG. 47B shows the Id-Vg characteristics at the back gate potential Vbg of 0 V, and FIG. 47C shows the Id-Vg characteristics at the back gate potential Vbg of 4 V.

FIG. 48A to FIG. 48H show graphs of the back gate potential Vbg dependence of each of field-effect mobility μFE, an S value, a shift voltage Vsh, and DIBL obtained from the Id-Vg characteristics measurements.

FIG. 48A to FIG. 48D are graphs of the Vbg dependence of the transistor having a designed channel length of 360 nm and a designed channel width of 60 nm, and FIG. 48E to FIG. 48H are graphs of the Vbg dependence of the transistor having a designed channel length of 60 nm and a designed channel width of 60 nm. According to these graphs, in both the transistor having a designed channel length of 360 nm and a designed channel width of 60 nm and the transistor having a designed channel length of 60 nm and a designed channel width of 60 nm, the Vsh tends to shift in the positive direction and the S value tends to decrease by changing the Vbg from 4V to −4 V, i.g., from positive to negative. It is found that in DIBL, the Vbg dependence is small in the range of Vbg from −4 V to 4 V.

At least parts of the structure, the method, and the like shown in this example can be implemented in appropriate combination with other embodiments and the like described in this specification.

REFERENCE NUMERALS

100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, 200_n: transistor, 200_1: transistor, 200a: transistor, 200b: transistor, 200D: transistor, 200T: transistor, 205: conductor, 205a: conductor, 205A: conductive film, 205b: conductor, 205B: conductive film, 205c: conductor, 205C: conductive film, 210: insulator, 212: insulator, 214: insulator, 216: insulator, 217: insulator, 218: conductor, 222: insulator, 224: insulator, 230: oxide, 230_D: oxide, 230_n: oxide, 230_n-1: oxide, 230_1: oxide, 230_2: oxide, 230a: oxide, 230A: oxide film, 230b: oxide, 230B: oxide film, 230ba: region, 230bb: region, 230bc: region, 230c: oxide, 230d: oxide, 230_D: oxide, 235: channel formation region, 235_n: channel formation region, 235_1: channel formation region, 235_2: channel formation region, 240: conductor, 240a: conductor, 240b: conductor, 241: insulator, 241a: insulator, 241b: insulator, 242: conductor, 242a: conductor, 242A: conductive film, 242b: conductor, 242B: conductive layer, 242c: conductor, 243: oxide, 243a: oxide, 243A: oxide film, 243b: oxide, 243B: oxide layer, 246: conductor, 246a: conductor, 246b: conductor, 250: insulator, 250a: insulator, 250A: insulating film, 250b: insulator, 250B: insulating film, 260: conductor, 260a: conductor, 260b: conductor, 265: sealing portion, 265a: sealing portion, 265b: sealing portion, 271: insulator, 271a: insulator, 271A: insulating film, 271b: insulator, 271B: insulating layer, 271c: insulator, 272: insulator, 274: insulator, 280: insulator, 282: insulator, 282a: insulator, 282b: insulator, 283: insulator, 286: insulator, 290: memory device, 291: region, 292: capacitor device, 292a: capacitor device, 292b: capacitor device, 293: insulator, 294: conductor, 294a: conductor, 294b: conductor, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: opening region, 411: element layer, 413: transistor layer, 415: memory device layer, 415_1: memory device layer, 415_3: memory device layer, 415_4: memory device layer, 420: memory device, 424: conductor, 440: conductor, 470: memory unit, 500: semiconductor device, 600: semiconductor device, 601: semiconductor device, 610: cell array, 610_n: cell array, 610_1: cell array, 700: electronic component, 702: printed circuit board, 704: circuit board, 711: mold, 712: land, 713: electrode pad, 714: wire, 720: storage device, 721: driver circuit layer, 722: storage circuit layer, 730: electronic component, 731: interposer, 732: package substrate, 733: electrode, 735: semiconductor device, 901: boundary region, 902: boundary region, 1001: wiring, 1002: wiring, 1003: wiring, 1004: wiring, 1005: wiring, 1006: wiring

The invention claimed is:

1. A semiconductor device comprising:
a first insulator;
a transistor over the first insulator;
a second insulator over the first insulator;
a third insulator over the second insulator; and
a fourth insulator over the third insulator,
wherein the second insulator comprises a region positioned over the transistor,
wherein the third insulator comprises an opening reaching the second insulator, and
wherein the fourth insulator is in contact with a top surface of the second insulator inside the opening.

2. A semiconductor device comprising:
a first insulator;
a transistor over the first insulator;
a second insulator over the first insulator;
a third insulator over the second insulator; and
a fourth insulator over the third insulator,
wherein the second insulator comprises a region positioned over the transistor,
wherein the third insulator comprises an opening reaching the second insulator,
wherein the fourth insulator is in contact with a top surface of the second insulator inside the opening,
wherein the transistor comprises:
a fifth insulator over the first insulator;
an oxide over the fifth insulator;
a first conductor and a second conductor over the oxide;
a sixth insulator over the first conductor and the second conductor;
a seventh insulator that is over the oxide and placed between the first conductor and the second conductor; and
a third conductor over the seventh insulator, and
wherein the sixth insulator is in contact with the second insulator.

3. The semiconductor device according to claim 1, wherein the fourth insulator is in contact with the first insulator.

4. The semiconductor device according to claim 2, wherein the seventh insulator comprises:
an eighth insulator; and
a ninth insulator over the eighth insulator,
wherein the eighth insulator is in contact with the second insulator, and
wherein the ninth insulator is in contact with the third conductor.

5. The semiconductor device according to claim 1, wherein the first insulator and the fourth insulator each contain silicon and nitrogen.

6. The semiconductor device according to claim 1, wherein the third insulator is $AlO_x$, and wherein x is a given number greater than 0.

7. The semiconductor device according to claim 4, wherein the fifth insulator and the ninth insulator each contain hafnium.

8. The semiconductor device according to claim 2, wherein the first insulator and the fourth insulator each contain silicon and nitrogen.

9. The semiconductor device according to claim 2, wherein the third insulator and the sixth insulator are each $AlO_x$, and wherein x is a given number greater than 0.

10. The semiconductor device according to claim 2, wherein the oxide is an oxide semiconductor comprising any one or more selected from In, Ga, and Zn.

11. The semiconductor device according to claim 1, wherein the opening comprises a region not overlapping with the transistor.

12. The semiconductor device according to claim 2, wherein the opening comprises a region not overlapping with the transistor.

* * * * *